US011350056B2

(12) United States Patent
Tomita et al.

(10) Patent No.: US 11,350,056 B2
(45) Date of Patent: May 31, 2022

(54) IMAGE SENSOR AND ELECTRONIC DEVICE

(71) Applicant: Sony Semiconductor Solutions Corporation, Kanagawa (JP)

(72) Inventors: Katzutoshi Tomita, Kanagawa (JP); Yusuke Ikeda, Tokyo (JP); Sachio Akebono, Kanagawa (JP); Takashi Moue, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 131 days.

(21) Appl. No.: 16/965,191

(22) PCT Filed: Jan. 11, 2019

(86) PCT No.: PCT/JP2019/000666
§ 371 (c)(1),
(2) Date: Jul. 27, 2020

(87) PCT Pub. No.: WO2019/150917
PCT Pub. Date: Aug. 8, 2019

(65) Prior Publication Data
US 2022/0094871 A1    Mar. 24, 2022

(30) Foreign Application Priority Data

Feb. 2, 2018    (JP) ............................. JP2018-016994
Jun. 26, 2018   (JP) ............................. JP2018-120557

(51) Int. Cl.
*H04N 5/369*    (2011.01)
*H04N 5/378*    (2011.01)
*H04N 5/3745*   (2011.01)

(52) U.S. Cl.
CPC .......... *H04N 5/378* (2013.01); *H04N 5/3745* (2013.01); *H04N 5/3698* (2013.01)

(58) Field of Classification Search
None
See application file for complete search history.

(56) References Cited

U.S. PATENT DOCUMENTS

2006/0001750 A1*   1/2006   Mizuguchi .......... H03M 1/0607
                                                                       348/294
2011/0249162 A1    10/2011   Moore
                             (Continued)

FOREIGN PATENT DOCUMENTS

JP        2009-124513 A    6/2009

*Primary Examiner* — Mark T Monk
(74) *Attorney, Agent, or Firm* — Michael Best & Friedrich LLP

(57) ABSTRACT

An image sensor including a pixel array section in which a plurality of pixels including photoelectric conversion units is disposed, and a comparator that compares an analog pixel signal output from the pixels to a predetermined reference signal, and outputs a comparison result according to a signal level of the pixel signal. The comparator includes differential pair transistors, a first load transistor connected in series with a first transistor of the differential pair, and a second load transistor connected in series with a second transistor of the differential pair. The first transistor of the differential pair accepts a signal obtained by combining the pixel signal and the predetermined reference signal as a gate input, the second transistor of the differential pair accepts a predetermined voltage as a gate input. In addition, a capacitance unit is connected between a common connection node of the first transistor of the differential pair and the first load transistor, and a node of the predetermined voltage.

20 Claims, 35 Drawing Sheets

(56) References Cited

U.S. PATENT DOCUMENTS

2015/0123832 A1 5/2015 Sohn
2017/0054931 A1 2/2017 Wang et al.

\* cited by examiner

IMAGE SENSOR AND ELECTRONIC DEVICE

TECHNICAL FIELD

The present disclosure relates to an image sensor and an electronic device.

BACKGROUND ART

An image sensor provided with an analog-to-digital conversion unit that converts an analog pixel signal output from a pixel into a digital signal is known. The analog-to-digital conversion unit includes a plurality of analog-to-digital converters provided in correspondence with the pixel columns. Additionally, each analog-to-digital converter of the analog-to-digital conversion unit includes a comparator that compares the analog pixel signal to a predetermined reference signal, and outputs a comparison result depending on the signal level of the pixel signal (for example, see Patent Document 1).

CITATION LIST

Patent Document

Patent Document 1: Japanese Patent Application Laid-Open No. 2009-124513

SUMMARY OF THE INVENTION

Problems to be Solved by the Invention

In an image sensor or an electric device that uses the image sensor, lower power consumption is desired. Lower power consumption is conceivably attained by lowering the power supply voltage of the image sensor, for example. However, if the power supply voltage of the image sensor falls, the power supply voltage of the comparator also falls, which may cause the signal level of the pixel signal to exceed the input dynamic range of the comparator, and the linearity of the analog-to-digital conversion, that is, the linearity of the digital values with respect to the analog pixel signal, may no longer be secured.

An object of the present disclosure is to provide an image sensor capable of securing the linearity of analog-to-digital conversion even if the power supply voltage is lowered to achieve lower power consumption, and an electronic device including the image sensor.

Solutions to Problems

A first aspect of the present disclosure to achieve the above object is an image sensor including:
a pixel array section in which a plurality of pixels including photoelectric conversion units is disposed; and a comparator that compares an analog pixel signal output from the pixels to a predetermined reference signal, and outputs a comparison result according to a signal level of the pixel signal.

In this image sensor, the comparator includes
differential pair transistors, a first load transistor connected in series with a first transistor of the differential pair, and a second load transistor connected in series with a second transistor of the differential pair.

The first transistor of the differential pair accepts a signal obtained by combining the pixel signal and the predetermined reference signal as a gate input, the second transistor of the differential pair accepts a predetermined voltage as a gate input.

In addition, a capacitance unit is connected between a common connection node of the first transistor of the differential pair and the first load transistor, and a node of the predetermined voltage.

A second aspect of the present disclosure to achieve the above object is an image sensor including:
a pixel array section in which a plurality of pixels including photoelectric conversion units is disposed; and a comparator that compares an analog pixel signal output from the pixels to a predetermined reference signal, and outputs a comparison result according to a signal level of the pixel signal, in which
the comparator includes a first amplification unit and a second amplification unit connected in cascade,
the first amplification unit includes
differential pair transistors,
a first load transistor connected in series with a first transistor of the differential pair, and
a second load transistor connected in series with a second transistor of the differential pair,
the first transistor of the differential pair accepts a signal obtained by combining the pixel signal and the predetermined reference signal as a gate input,
the second transistor of the differential pair accepts a predetermined voltage as a gate input, and
the second amplification unit includes
a first capacitance unit connected between an output node and a node of the predetermined voltage.

Also, the electronic device of the present disclosure for achieving the above object is the image sensor according to the second aspect of the above configuration or a configuration including the image sensor according to the second aspect.

MODE FOR CARRYING OUT THE INVENTION

Figure 1:
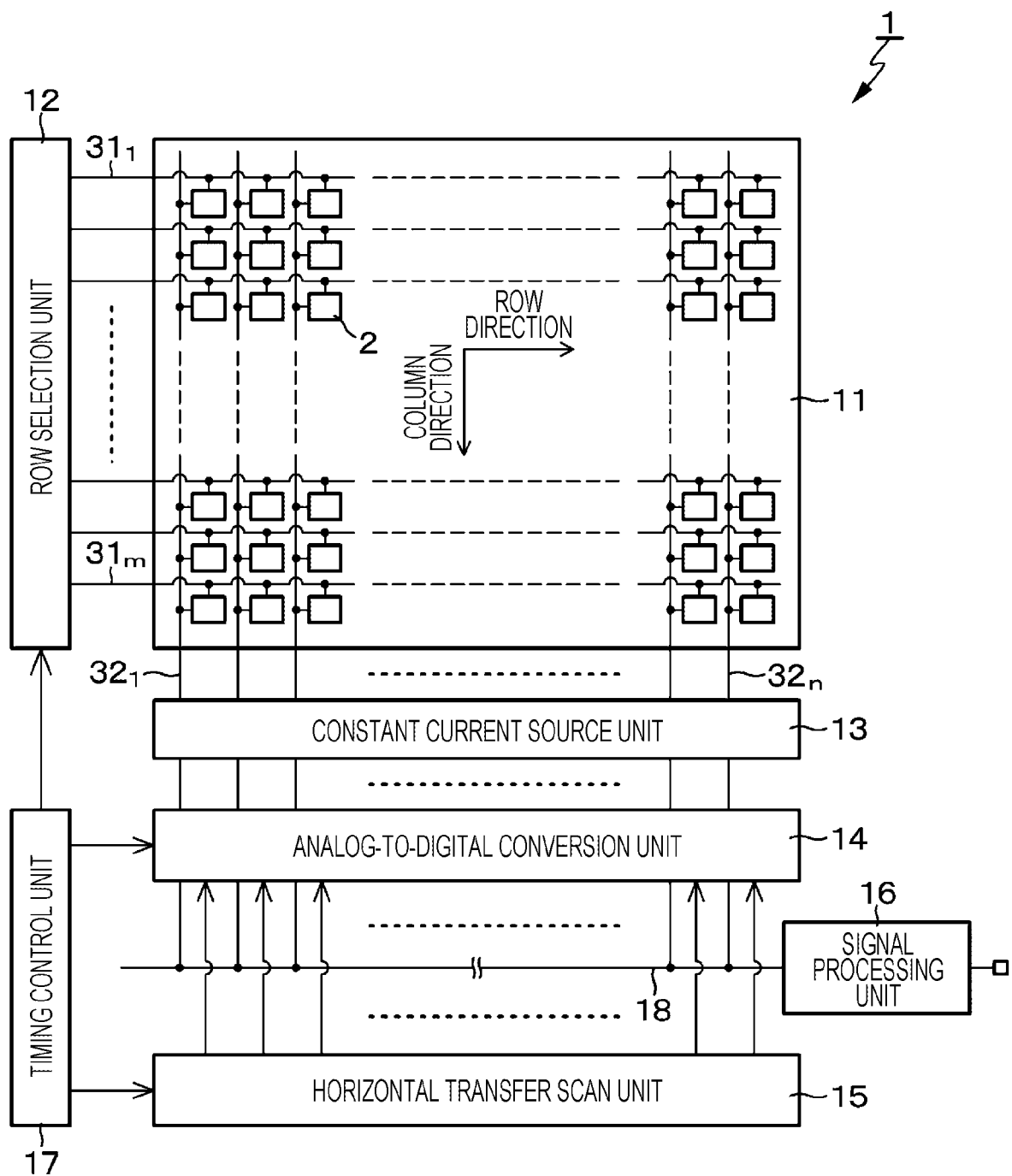
FIG. 1 is a block diagram illustrating schematic basic configuration of a CMOS image sensor as one example of an image sensor according to the present disclosure.

In the following, a mode for carrying out the technology of the present disclosure (hereinafter, referred to as "embodiment") will be described in detail by using drawings. The technology of the present disclosure is not limited to the embodiment. In the below description, the same reference signs are used for the same elements or the elements having the same function, and repetitive description is omitted. Note that description will be made in the following order.

1. Overall description of image sensor and electronic device of present disclosure
2. Image sensor of present disclosure
2-1. Exemplary configuration of CMOS image sensor
2-2. Exemplary configuration of pixel
2-3. Exemplary configuration of analog-to-digital conversion unit
2-4. Chip structure
2-4-1. Flat-type chip structure (also referred to as flat structure)
2-4-2. Stacked-type chip structure (also referred to as stacked structure)
2-5. Lowering power consumption of image sensor
2-6. Comparator according to reference example
2-6-1. Configuration of comparator according to reference example
2-6-2. Operation of comparator according to reference example
2-6-3. Action and effect of comparator according to reference example
2-6-4. Problems with comparator according to reference example
3. First Embodiment
3-1. Example 1 (example of providing capacitance unit in differential amplifier)
3-2. Example 2 (specific example 1 of capacitance unit: example of using variable-capacitance element)

3-3. Example 3 (specific example 2 of capacitance unit: example containing combination of plurality of capacitance elements and toggle switches)

3-4. Example 4 (specific example 3 of capacitance unit: example of providing electrical isolation circuit in control terminal of each toggle switch)

3-5. Example 5 (modification of Example 1: example of using opposite-conductivity-type transistor)

4. Second Embodiment 4-1. Example 6 (example of providing capacitance unit in output amplifier)

4-2. Example 7 (example of providing capacitance unit in both differential amplifier and output amplifier)

4-3. Example 8 (modification of Example 6: example of providing clamp circuit)

4-4. Example 9 (modification of Example 8: example of using opposite-conductivity-type transistor)

5. Modification example

6. Application example

7. Applied example of technology according to present disclosure 7-1. Electronic device of present disclosure (example of imaging device)

7-2. Application example of moving object

8. Configuration achievable by employing present disclosure

<Overall Description of Image Sensor and Electronic Device of Present Disclosure>

In an image sensor and an electronic device according to the first aspect of the present disclosure, the pixel signal and the predetermined reference signal can be accepted as the gate input of the first transistor of the differential pair through respective capacitance elements. Also, a predetermined voltage can be take a voltage of any value. A voltage of any value may be voltage such as a ground (GND) level or a power supply voltage, for example.

In the image sensor and the electronic device according to the first aspect including the preferred configuration described above, the capacitance unit can take a configuration in which the capacitance value is variable. Additionally, the capacitance unit can take a configuration containing a variable capacitance element having a variable capacitance value.

Alternatively, in the image sensor and the electronic device according to the first aspect including the preferred configuration described above, the capacitance unit can contain a plurality of capacitance elements and a toggle switch that selects at least one of the plurality of capacitance elements on the basis of a control signal. The plurality of capacitance elements can take a configuration containing capacitance elements having the same capacitance values as each other, and can also take a configuration containing capacitance elements having different capacitance values from each other.

Alternatively, in the image sensor and the electronic device according to the first aspect including the preferred configuration described above, the capacitance unit can include an isolation circuit that electrically isolates a control line that supplies the control signal from the toggle switch. In addition, the isolation circuit can be an inverter circuit or a buffer circuit.

Furthermore, in the image sensor and the electronic device according to the first aspect including the preferred configuration described above, the first load transistor can be configured as a diode connection. Then, the first load transistor and the second load transistor preferably form a current mirror circuit. In addition, a common connection node of the second transistor of the differential pair and the second load transistor is preferably an output node.

Furthermore, in the image sensor and the electronic device according to the first aspect including the preferred configuration described above, the comparator is preferably provided in correspondence with a pixel column of the pixel array section, and is used in an analog-to-digital converter that converts the analog pixel signal output from the pixels into a digital signal. The analog-to-digital converter can be provided with respect to each pixel column or with respect to a plurality of pixel columns of the pixel array section.

In the image sensor and the electronic device according to a second aspect, the first amplification unit can include a second capacitance unit connected between a common connection node of the first transistor of the differential pair and the first load transistor, and the node of the predetermined voltage. In addition, the image sensor and the electronic device can further include a clamp circuit that clamps a potential of the output node of the first amplification unit to a predetermined potential when an output of the second amplification unit inverts.

<Image Sensor of Present Disclosure>

The basic configuration of the image sensor of the present disclosure, to which the technology of the present disclosure is applied, is first described. Here, it is described as an image sensor by exemplifying a complementary metal-oxide semiconductor (CMOS) image sensor that is one type of image sensors employing an X-Y address method. The CMOS image sensor is an image sensor fabricated by applying or partially using the CMOS process.

[Configuration Example of CMOS Image Sensor]

FIG. 1 is a block diagram illustrating schematic basic configuration of a CMOS image sensor as one example of an image sensor according to the present disclosure.

The CMOS image sensor 1 according to this example includes a pixel array section 11 in which a pixel 2 having a photoelectric conversion unit and a peripheral circuit section in the vicinity of the pixel array section 11. Here, the pixels are two-dimensionally arranged in a row direction and a column direction, that is, in a matrix. In this description, the row direction refers to the direction of the pixels 2 arranged in the pixel row (what is called, horizontal direction), and the column direction refers to the direction of the pixels 2 arranged in the pixel column (what is called, vertical direction). The pixel 2 performs photoelectric conversion to generate and accumulate photoelectric charge corresponding to quantity of the received light.

The peripheral circuit section of the pixel array section 11 includes components such as a row selection unit 12, a constant current source unit 13, an analog-to-digital conversion unit 14, a horizontal transfer scan unit 15, a signal processing unit 16, and a timing control unit 17, for example.

In the pixel array section 11, pixel drive lines $31_1$ to $31_m$ (hereinafter collectively referred to as the "pixel drive line(s) 31" in some cases) are laid out in the row direction for each pixel row in the matrix pixel layout. Also, the vertical signal lines $32_1$ to $32_n$ (hereinafter collectively referred to as the "vertical signal line(s) 32" in some cases) are laid out in the column direction for each pixel column. The pixel drive line 31 transmits, upon reading out a signal from the pixel 2, a drive signal used to drive it. The pixel drive line 31 is illustrated as one wiring in FIG. 1, but it's number is not limited to one. One end of the pixel drive line 31 is connected to an output end associated with each row of the row selection unit 12.

In the following, each circuit unit of the peripheral circuit section of the pixel array section 11, namely the row selection unit 12, the constant current source unit 13, the analog-to-digital conversion unit 14, the horizontal transfer scan unit 15, the signal processing unit 16, and the timing control unit 17, will be described.

The row selection unit 12 contains components such as a shift register and an address decoder, and controls the scanning of a pixel row and the address on a pixel row when selecting each pixel 2 of the pixel array section 11. Although the specific configuration of the row selection unit 12 is not illustrated, the row selection unit 12 typically includes two scanning systems, a readout scanning system and a sweeping scanning system.

The readout scanning system selectively scans the pixels 2 of the pixel array section 11 sequentially in units of rows to read out pixel signals from the pixels 2. The pixel signal read from the pixel 2 is an analog signal. The sweeping scanning system performs sweeping scanning with respect to the readout row on which the readout scanning is performed by the readout scanning system prior to the readout scanning by the time corresponding to the shutter speed.

The sweeping scanning by the sweeping scanning system sweeps out unnecessary electric charge from the photoelectric conversion unit of the pixel 2 in the readout row, thereby resetting the photoelectric conversion unit. Thus, this sweeping (resetting) of unnecessary electric charge by the sweeping scanning system enables, what is called, electronic shutter operation to be performed. In this description, the electronic shutter operation refers to an operation for sweeping out photoelectric charge of the photoelectric conversion unit and starting new exposure (starting accumulation of photoelectric charge).

The constant current source unit 13 is provided with a plurality of current sources I containing a MOS transistor for example connected to each of the vertical signal lines $32_1$ to $32_n$ for each pixel column, and supplies a bias current through each of the vertical signal lines $32_1$ to $32_n$ to each pixel 2 of the pixel row selectively scanned by the row selection unit 12.

The analog-to-digital conversion unit 14 contains a set of a plurality of analog-to-digital converters provided in correspondence with the pixel columns of the pixel array section 11, such as for each pixel column, for example. The analog-to-digital conversion unit 14 is a column-parallel analog-to-digital conversion unit that converts the analog pixel signals output through each of the vertical signal lines $32_1$ to $32_n$ for each pixel column into an N-bit digital signal.

As the analog-to-digital converters in the column-parallel analog-to-digital conversion unit 14, it is possible to use single-slope analog-to-digital converters, which are an example of analog-to-digital converters that compare against a reference signal, for example. However, the analog-to-digital converters are not limited to single-slope analog-to-digital converters, and successive approximation analog-to-digital converters, delta-sigma modulation (A modulation) analog-to-digital converters, and the like can be used.

The horizontal transfer scan unit 15 contains components such as a shift register and an address decoder, and controls the scanning of a pixel column and the address on a pixel column when reading out a signal from each pixel 2 of the pixel array section 11. Under control by the horizontal transfer scan unit 15, pixel signals converted to a digital signal by the analog-to-digital conversion unit 14 are read out in units of pixel columns to a horizontal transfer line 18 having a width of 2N bits.

The signal processing unit 16 performs predetermined signal processing on the digital pixel signal supplied through the horizontal transfer line 18, and generates two-dimensional image data. For example, the signal processing unit 16 corrects line defects and point defects or performs signal clamping, and performs digital signal processing such as parallel-to-serial conversion, compression, encoding, adding, averaging, and intermittent sampling action. The signal processing unit 16 outputs the generated image data to a downstream device as the output signal of the CMOS image sensor 1.

The timing control unit 17 generates various timing signals, clock signals, control signals, and the like, and controls the driving of units such as the row selection unit 12, the constant current source unit 13, the analog-to-digital conversion unit 14, the horizontal transfer scan unit 15, and the signal processing unit 16 on the basis of these generated signals.

[Example of Circuit Configuration of Pixel]

Figure 2:
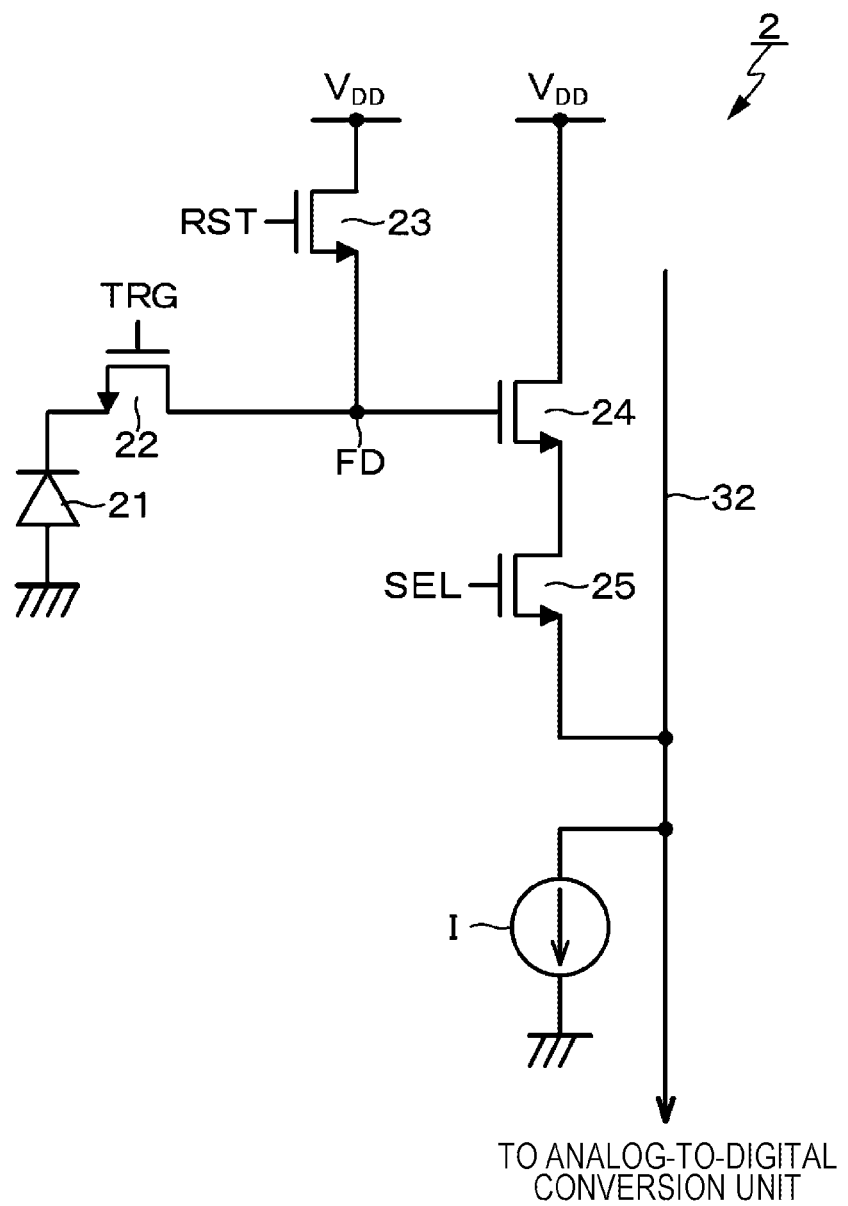
FIG. 2 is a circuit diagram illustrating one example of circuit configuration in a pixel.

FIG. 2 is a circuit diagram illustrating one example of circuit configuration in the pixel 2. The pixel 2 includes, in one example, a photodiode 21 as a photoelectric conversion unit. The pixel 2 has pixel configuration including, in addition to the photodiode 21, a transfer transistor 22, a reset transistor 23, an amplification transistor 24, and a selection transistor 25.

Moreover, in this description, four transistors of the transfer transistor 22, the reset transistor 23, the amplification transistor 24, and the selection transistor 25 employ, in one example, an N-channel MOS field effect transistor (FET). However, the combination of conductivity types of these four transistors 22 to 25 illustrated in this example is merely an example, and is not limited to such combination.

In this pixel 2, a plurality of pixel drive lines used as the pixel drive lines 31 described above is wired in common to the respective pixels 2 in the same pixel row. These plurality of pixel drive lines is connected to the output ends corresponding to each pixel row of the row selection unit 12 in units of pixel rows. The row selection unit 12 outputs a transfer signal TRG, a reset signal RST, and a selection signal SEL appropriately to the plurality of pixel drive lines.

The photodiode 21 has an anode electrode connected to a low-potential-side power supply (e.g., ground). The photodiode 21 performs photoelectrical conversion on the received light into photoelectric charge (in this example, photoelectrons) of a charge amount corresponding to the light amount, and accumulates the photoelectric charge. The cathode electrode of the photodiode 21 is electrically connected to a gate electrode of the amplification transistor 24 via the transfer transistor 22. In this description, the region where the gate electrode of the amplification transistor 24 is electrically connected is a floating diffusion (floating diffusion region or impurity diffusion region) FD. The floating diffusion FD is a charge-voltage conversion unit that converts electric charge into voltage.

The transfer signal TRG that is in an active state at high level (e.g., $V_{DD}$ level) is applied from the row selection unit 12 to a gate electrode of the transfer transistor 22. The transfer transistor 22 is brought into the conduction state in response to the transfer signal TRG, thereby transferring the photoelectric charge, which is obtained by photoelectrical conversion in the photodiode 21 and accumulated in the photodiode 21, to the floating diffusion FD.

The reset transistor 23 is connected between the node of a high-potential-side power supply voltage $V_{DD}$ and the floating diffusion FD. The reset signal RST that is in an active state at high level is supplied from the row selection unit 12 to a gate electrode of the reset transistor 23. The reset transistor 23 is brought into the conduction state in response to the reset signal RST, thereby resetting the floating diffusion FD by sweeping out electric charge of the floating diffusion FD to the node of the voltage $V_{DD}$.

The amplification transistor 24 has the gate electrode connected to the floating diffusion FD and a drain electrode connected to the node of the high-potential-side power supply voltage $V_{DD}$. The amplification transistor 24 acts as an input port of a source follower that reads out a signal obtained by photoelectric conversion at the photodiode 21. In other words, the amplification transistor 24 has a source electrode connected to the vertical signal line 32 via the selection transistor 25. In addition, the amplification transistor 24 and the current source I connected to one end of the vertical signal line 32 constitute a source follower that converts the voltage of the floating diffusion FD into the potential of the vertical signal line 32.

The selection transistor 25 has a drain electrode connected to the source electrode of the amplification transistor 24, and a source electrode connected to the vertical signal line 32. The selection signal SEL that is in an active state at high level is applied from the row selection unit 12 to a gate electrode of the selection transistor 25. The selection transistor 25 is brought into the conduction state in response to the selection signal SEL, and so the state of the pixel 2 is brought into the selected state and the signal output from the amplification transistor 24 is transferred to the vertical signal line 32.

From the pixels 2 having the above configuration, a reset level (also referred to as the P phase) and a signal level (also referred to as the D phase) are read out in order, for example. The reset level corresponds to the potential of a floating diffusion FD of each pixel 2 when the floating diffusion FD is reset. The signal level corresponds to the potential obtained by photoelectric conversion by the photodiode 21, or in other words, the potential of the floating diffusion FD when charge stored in the photodiode 21 is transferred to the floating diffusion FD.

Moreover, the selection transistor 25 is capable of being configured as a circuit connected between the node of the high-potential-side power supply voltage $V_{DD}$ and the drain electrode of the amplification transistor 24. In addition, this example exemplifies, as a pixel circuit of the pixel 2, the 4-Tr configuration including the transfer transistor 22, the reset transistor 23, the amplification transistor 24, and the selection transistor 25, that is, four transistors (Trs), but it is not limited to this example. In one example, the 3-Tr configuration in which the selection transistor 25 is omitted and the amplification transistor 24 has the function of the selection transistor 25 may be provided, or the configuration of 5-Tr or more in which the number of transistors is increased may be provided as necessary.

[Exemplary Configuration of Analog-to-Digital Conversion Unit]

Figure 3:
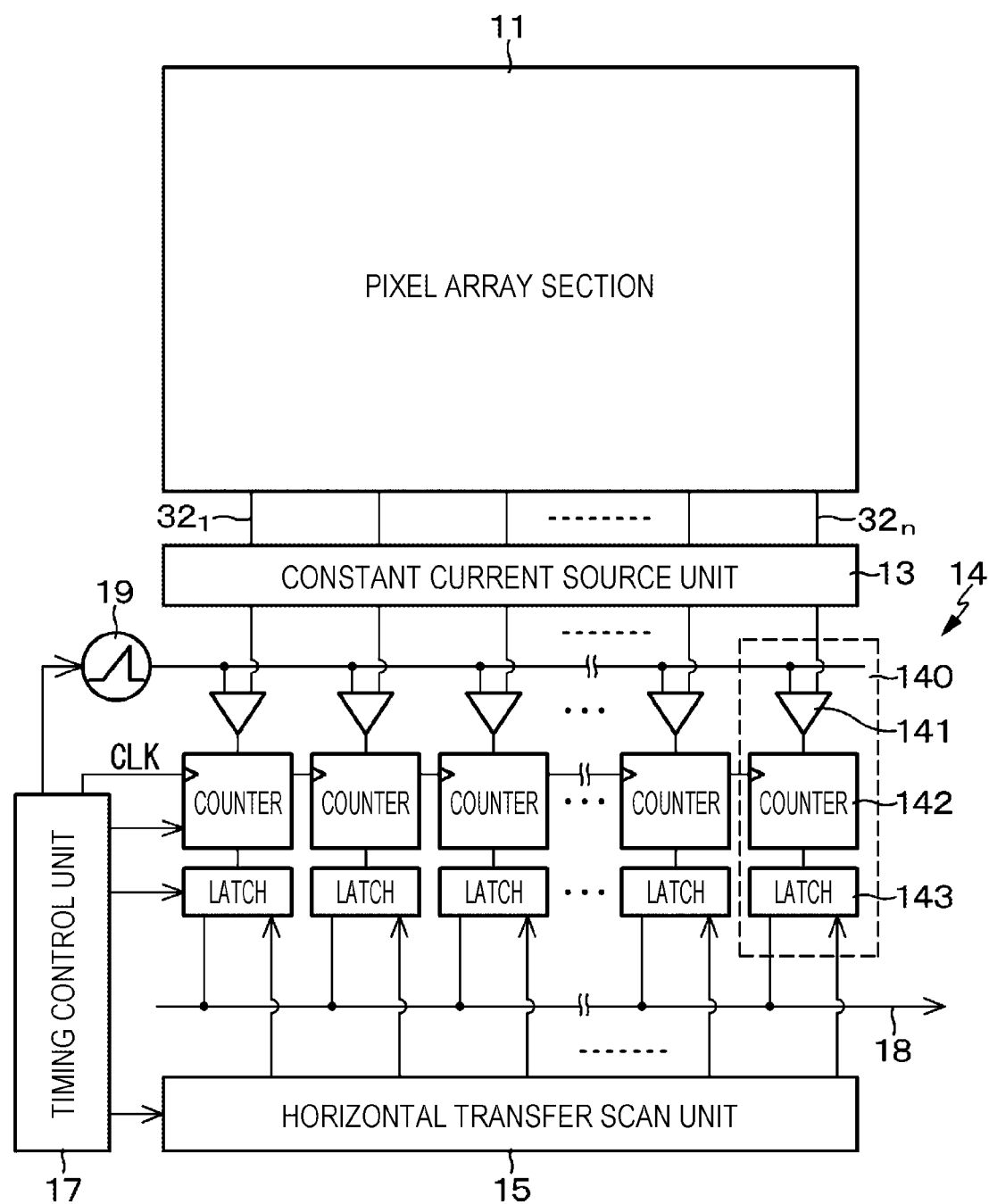
FIG. 3 is a block diagram illustrating one example of a configuration of a column-parallel analog-to-digital conversion unit provided in a CMOS image sensor as one example of the image sensor of the present disclosure.

Next, an exemplary configuration of the column-parallel analog-to-digital conversion unit 14 will be described. FIG. 3 is a block diagram illustrating one example of the configuration of the column-parallel analog-to-digital conversion unit 14. The analog-to-digital conversion unit 14 in the CMOS image sensor 1 of the present disclosure contains a set of a plurality of single-slope analog-to-digital converters provided in correspondence with each of the vertical signal lines $32_1$ to $32_n$. The description herein takes a single-slope analog-to-digital converter 140 of the nth column as an example.

The single-slope analog-to-digital converter 140 has a circuit configuration including a comparator 141, a counter circuit 142, and a latch circuit 143. In the single-slope analog-to-digital converter 140, a reference signal having what is referred to as a RAMP waveform (slope waveform) whose voltage value changes linearly with time is used. The ramp waveform reference signal is generated by the reference signal generation unit 19. The reference signal generation unit 19 can be configured using a digital-to-analog conversion (DAC) circuit, for example.

The comparator 141 accepts the analog pixel signal read out from each pixel 2 as a comparison input, accepts the ramp waveform reference signal generated by the reference signal generation unit 19 as a reference input, and compares the two signals. Thereafter, the output of the comparator 141 goes to a first state (for example, a high level) when the reference signal is greater than the pixel signal, and goes to a second state (for example, a low level) when the reference signal is less than or equal to the pixel signal, for example. With this arrangement, the comparator 141 outputs a pulse signal having a pulse width corresponding to the signal level of the pixel signal, specifically corresponding to the magnitude of the signal level, as the comparison result.

The counter circuit 142 is supplied with a clock signal CLK from the timing control unit 17 at the same timing as the start timing for supplying the reference signal to the comparator 141. Thereafter, the counter circuit 142 performs a count operation in synchronization with the clock signal CLK, and thereby measures the period of the pulse width of the output pulse of the comparator 141, or in other words, the period from the start of the comparison operation to the end of the comparison operation. The count result (count value) of the counter circuit 142 is a digital value digitizing the analog pixel signal.

The latch circuit 143 holds (latches) the digital value that is the count result from the counter circuit 142. In addition, by taking the difference between the count value in the D phase corresponding to the pixel signal at the signal level and the count value in the P phase corresponding to the pixel signal at the reset level, the latch circuit 143 performs correlated double sampling (CDS), which is one example of a noise removal process. Thereafter, the latched digital value is output to the horizontal transfer line 18 under driving of the horizontal transfer scan unit 15.

As described above, in the column-parallel analog-to-digital conversion unit 14 containing a set of single-slope analog-to-digital converters 140, digital values are obtained from information about the time until the magnitude relationship changes between a reference signal having an analog value that changes linearly and is generated by the reference signal generation unit 19, and the analog pixel signal output from the pixels 2. Note that although the above example illustrates an analog-to-digital conversion unit 14 in which the analog-to-digital converters 140 are disposed in a 1:1 relationship with respect to the pixel columns, it is also possible to configure an analog-to-digital conversion unit 14 in which the analog-to-digital converters 140 are disposed in units of a plurality of pixel columns each.

[Chip Structure]

Examples of the chip (semiconductor integrated circuit) structure of the CMOS image sensor 1 with the above configuration include a flat-type chip structure and a stacked-type chip structure. The CMOS image sensor 1 of both the flat-type chip structure and the stacked-type chip structure can take a back-illuminated pixel structure in which, provided that the face of the substrate on the side where a wiring layer is disposed for the pixels 2 is treated as the surface (front), light radiated from the back face on the opposite side is received. Hereinafter, the flat-type chip structure and the stacked-type chip structure will be described.

Flat-Type Chip Structure

Figure 4:
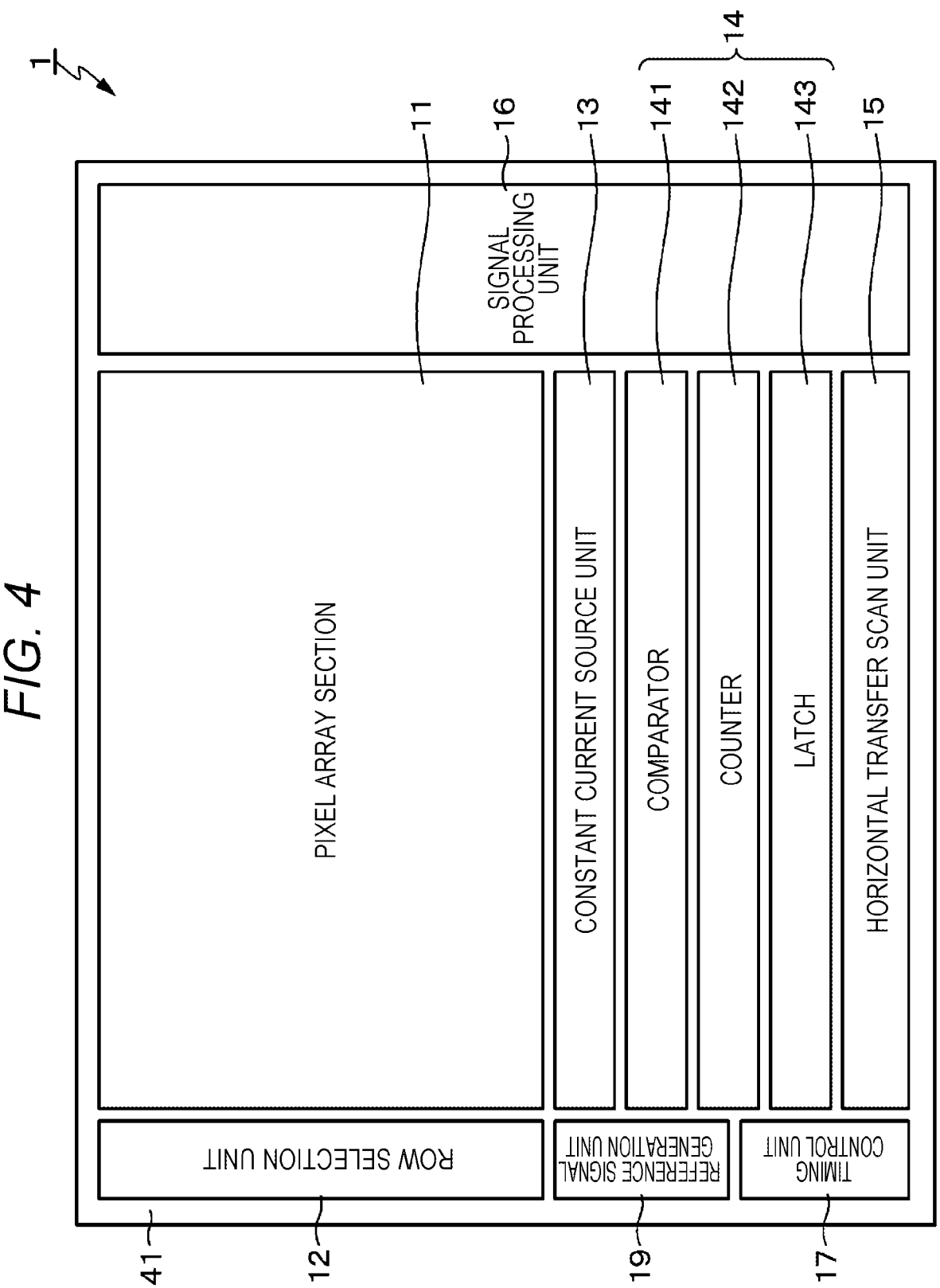
FIG. 4 is a plan view illustrating an overview of a flat-type chip structure of a CMOS image sensor as one example of the image sensor of the present disclosure.

FIG. 4 is a plan view illustrating an overview of a flat-type chip structure of a CMOS image sensor 1. As illustrated in FIG. 4, the flat-type chip structure, also referred to as the flat structure, is a structure in which the circuit portions peripheral to the pixel array section 11 are formed on the same semiconductor substrate 41 as the pixel array section 11 containing pixels 2 arranged in a matrix of rows and columns. Specifically, units such as the row selection unit 12, the constant current source unit 13, the analog-to-digital conversion unit 14, the horizontal transfer scan unit 15, the signal processing unit 16, the timing control unit 17, and the reference signal generation unit 19 are formed on the same semiconductor substrate 41 as the pixel array section 11.

Stacked-Type Chip Structure

Figure 5:
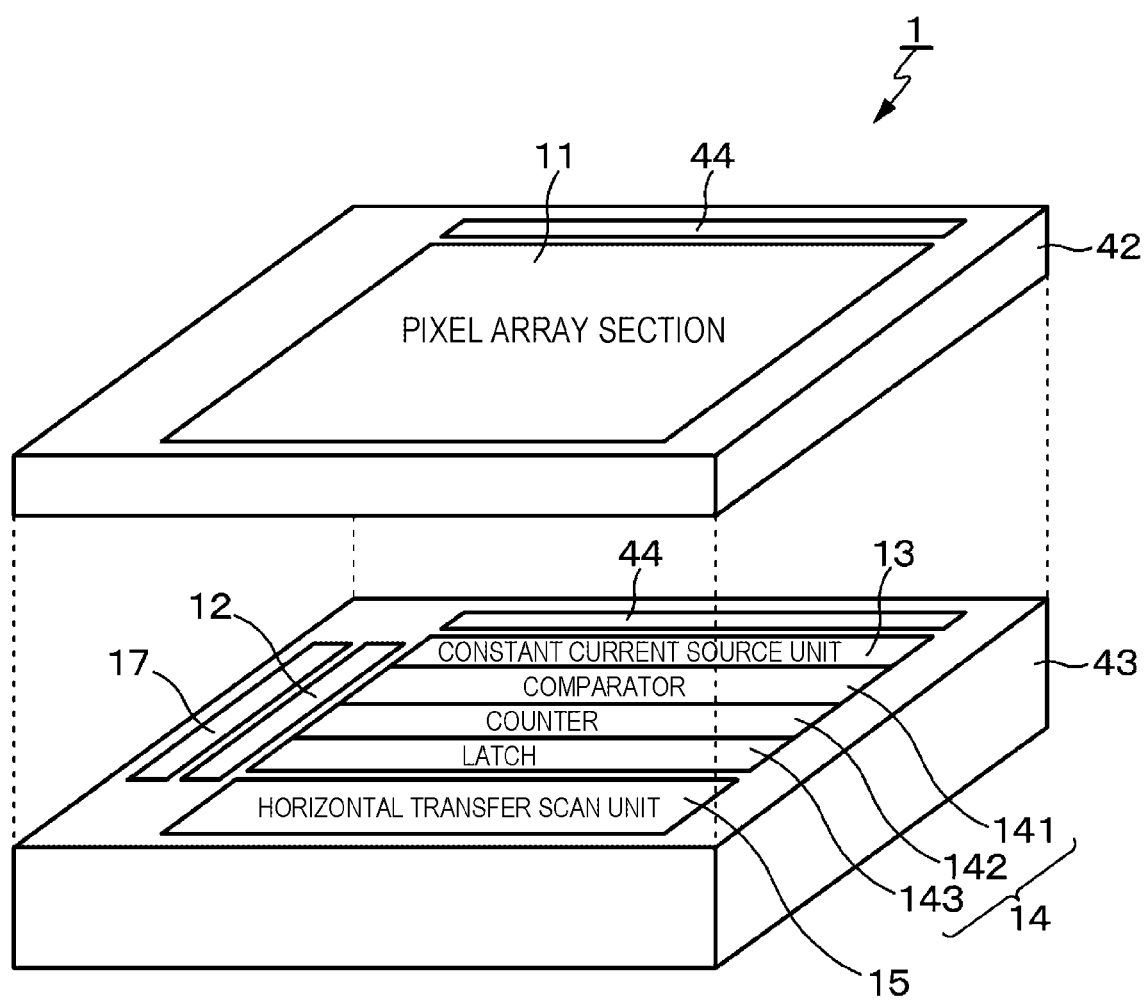
FIG. 5 is an exploded perspective view illustrating an overview of a stacked-type chip structure of a CMOS image sensor as one example of the image sensor of the present disclosure.

FIG. 5 is an exploded perspective view illustrating an overview of a stacked-type chip structure of a CMOS image sensor 1. As illustrated in FIG. 5, the stacked-type chip structure, also referred to as the stacked structure, is a structure in which at least two semiconductor substrates including a first semiconductor substrate 42 and a second semiconductor substrate 43 are stacked on top of each other. In the stacked structure, the pixel array section 11 is formed on the first semiconductor substrate 42 in a first layer. Also, circuit portions such as the row selection unit 12, the constant current source unit 13, the analog-to-digital conversion unit 14, the horizontal transfer scan unit 15, the signal processing unit 16, the timing control unit 17, and the reference signal generation unit 19 are formed on the second semiconductor substrate 43 in a second layer. Additionally, the first semiconductor substrate 42 in the first layer and the second semiconductor substrate 43 in the second layer are electrically connected through a connecting unit 44 such as through-chip vias (TCVs) or Cu—Cu hybrid bonding.

The use of the CMOS image sensor 1 having this stacked structure enables the first semiconductor substrate 42 to have a size (area) sufficient only to dispose the pixel array section 11, thereby reducing the size (area) of the first semiconductor substrate 42 as the first layer and eventually the size of the entire chip. Furthermore, the process suitable for manufacturing the pixel 2 is applicable to the first semiconductor substrate 42 as the first layer, and the process suitable for manufacturing circuitry portions is applicable to the second semiconductor substrate 43 as the second layer, thereby providing an advantage that process optimization in manufacturing the CMOS image sensor 1 is achievable. Particularly, the application of leading processes to the fabrication of the circuit portions becomes possible.

Moreover, this example illustrates a two-layer stacked structure in which the first semiconductor substrate 42 and the second semiconductor substrate 43 are arranged on top of each other, but the stacked structure is not limited to the two-layer structure, and a structure having three or more layers can be used. Also, in the case of a stacked structure with three or more layers, circuit portions such as the row selection unit 12, the constant current source unit 13, the analog-to-digital conversion unit 14, the horizontal transfer scan unit 15, the signal processing unit 16, the timing control unit 17, and the reference signal generation unit 19 are formed distributed among the second and subsequent semiconductor substrates.

[Lowering Power Consumption of Image Sensor]

In the image sensor 1 with the above configuration, if the power supply voltage $V_{DD}$ is lowered in an attempt to lower the power consumption, the power supply voltage of the comparator 141 included in the analog-to-digital converter 140 is also lowered, which causes the signal level of the pixel signal to exceed the input dynamic range of the comparator 141. As a result, it may not be possible to secure the linearity of the analog-to-digital conversion (that is, the linearity of the digital values with respect to the analog pixel signal).

[Comparator According to Reference Example]

Figure 6:
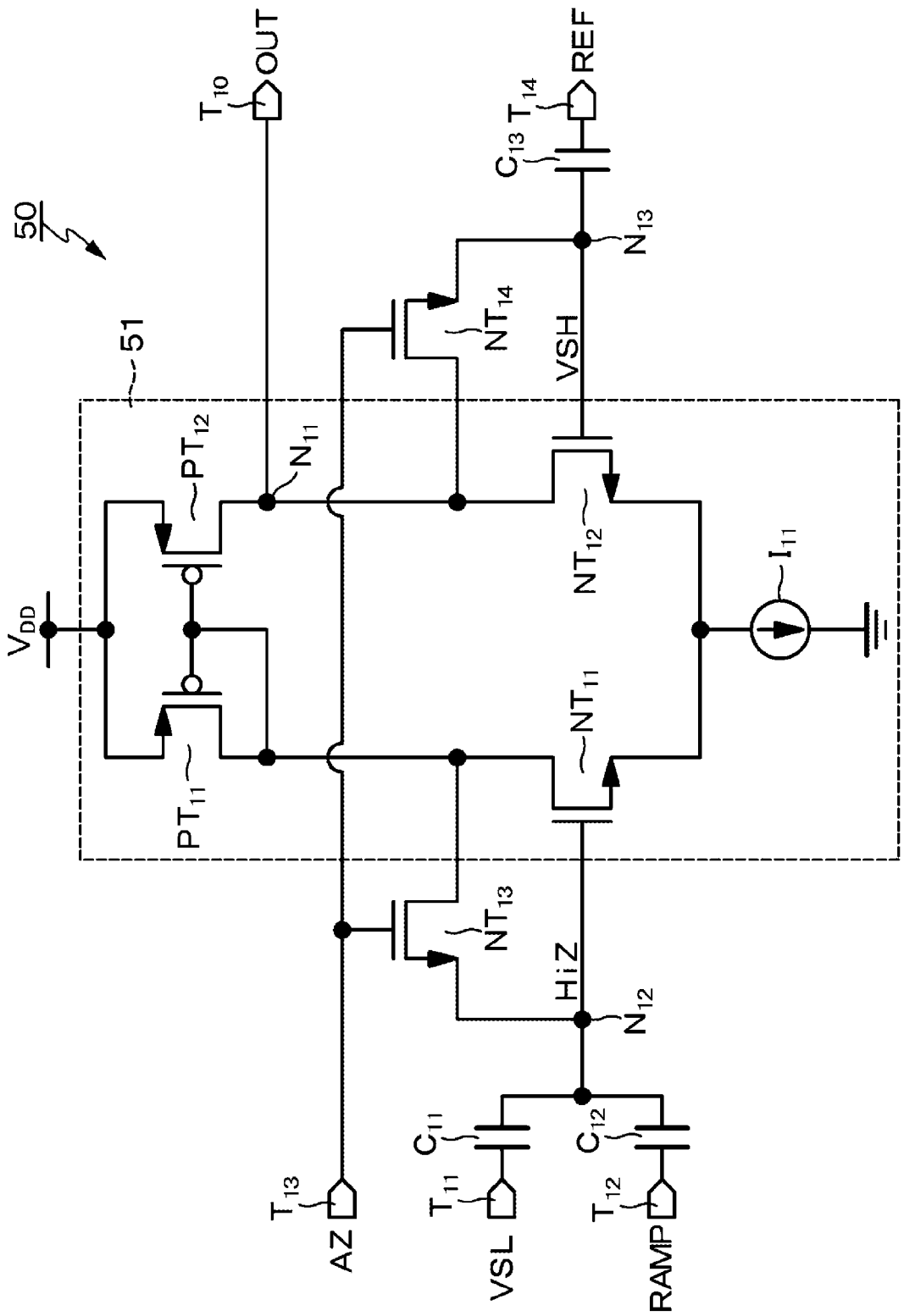
FIG. 6 is a circuit diagram illustrating a circuit configuration of a comparator according to a reference example.

At this point, a comparator capable of securing the linearity of the analog-to-digital conversion even if the power supply voltage $V_{DD}$ is lowered by using the comparator 141 in FIG. 3 will be described as a reference example. A circuit configuration of the comparator according to the reference example is illustrated in FIG. 6.

(Configuration of Comparator According to Reference Example)

A comparator 50 according to the reference example is provided with a differential amplifier 51, a first capacitance element $C_{11}$, a second capacitance element $C_{12}$, a third capacitance element $C_{13}$, a first switch transistor $NT_{13}$, and a second switch transistor $NT_{14}$. Herein, an N-channel MOS field-effect transistor (hereinafter referred to as a "MOS transistor") is used, for example, as each of the first switch transistor $NT_{13}$ and the second switch transistor $NT_{14}$.

The differential amplifier 51 includes a first differential transistor $NT_{11}$, a second differential transistor $NT_{12}$, a current source $I_{11}$, a first load transistor $PT_{11}$, and a second load transistor $PT_{12}$. Here, an N-channel MOS transistor is used as each of the first differential transistor $NT_{11}$ and the second differential transistor $NT_{12}$, while a P-channel MOS transistor is used as each of the first load transistor $PT_{11}$ and the second load transistor $PT_{12}$.

In the differential amplifier 51, the source electrodes of the first differential transistor $NT_{11}$ and the second differential transistor $NT_{12}$ are connected in common to form a differential pair that achieves differential operation. The current source $I_{11}$ is connected between the source common connection node of the first differential transistor $NT_{11}$ and the second differential transistor $NT_{12}$, and ground GND. The first load transistor $PT_{11}$ is configured as a diode connection in which the gate electrode and the drain electrode are connected in common, and is connected in series with the first differential transistor $NT_{11}$. In other words, the drain electrodes of the first load transistor $PT_{11}$ and the first differential transistor $NT_{11}$ are connected in common.

The second load transistor $PT_{12}$ is connected in series with the second differential transistor $NT_{12}$. In other words, the drain electrodes of the second load transistor $PT_{12}$ and the second differential transistor $NT_{12}$ are connected in common. Additionally, the gate electrodes of the first load transistor $PT_{11}$ and the second load transistor $PT_{12}$ are connected in common to form a current mirror circuit.

Also, a common connection node $N_{11}$ between the second differential transistor $NT_{12}$ and the second load transistor $PT_{12}$ acts as the output node of the differential amplifier 51, and an output signal OUT is led out from the output node $N_{11}$ through an output terminal $T_{10}$. The source electrodes of the first load transistor $PT_{11}$ and the second load transistor $PT_{12}$ are connected to the node of the power supply voltage $V_{DD}$.

The first capacitance element $C_{11}$ is connected between an input terminal $T_{11}$ of a pixel signal VSL and the gate electrode of the first differential transistor $NT_{11}$, and takes an input capacitance with respect to the pixel signal VSL. The second capacitance element $C_{12}$ is connected between an input terminal $T_{12}$ of a reference signal RAMP and the gate electrode of the first differential transistor $NT_{11}$, and takes an input capacitance with respect to the reference signal RAMP. With this arrangement, the combined signal of the pixel signal VSL and the reference signal RAMP passing through the first capacitance element $C_{11}$ and the second capacitance element $C_{12}$ is treated as the gate input of the first differential transistor $NT_{11}$.

The first switch transistor $NT_{13}$ is connected between the gate electrode and the drain electrode of the first differential transistor $NT_{11}$, and is controlled on (conducting) and off (non-conducting) by a driving signal AZ input through an input terminal $T_{13}$ from the timing control unit 17 illustrated in FIG. 1. The second switch transistor $NT_{14}$ is connected between the gate electrode and the drain electrode of the second differential transistor $NT_{12}$, and is controlled on/off by the driving signal AZ input through an input terminal $T_{13}$ from the timing control unit 17.

The third capacitance element $C_{13}$ is connected between the gate electrode of the second differential transistor $NT_{12}$ and a terminal $T_{14}$ with a predetermined voltage REF. With this arrangement, the second differential transistor $NT_{12}$ treats the predetermined voltage REF, such as GND level for example, supplied through the terminal $T_{14}$ as the gate input.

Note that in the following, the gate electrodes of the first capacitance element $C_{11}$, the second capacitance element $C_{12}$, and the first differential transistor $NT_{11}$ as well as the common connection node of the first switch transistor $NT_{13}$ are taken to be a node $N_{12}$, and the voltage of the node $N_{12}$ is taken to be HiZ. Also, in the following, the gate electrode of the second differential transistor $NT_{12}$ as well as the common connection nodes of the third capacitance element $C_{13}$ and the second switch transistor $NT_{14}$ are taken to be a node $N_{13}$, and the voltage of the node $N_{13}$ is taken to be VSH.

(Operation of Comparator According to Reference Example)

Figure 7:
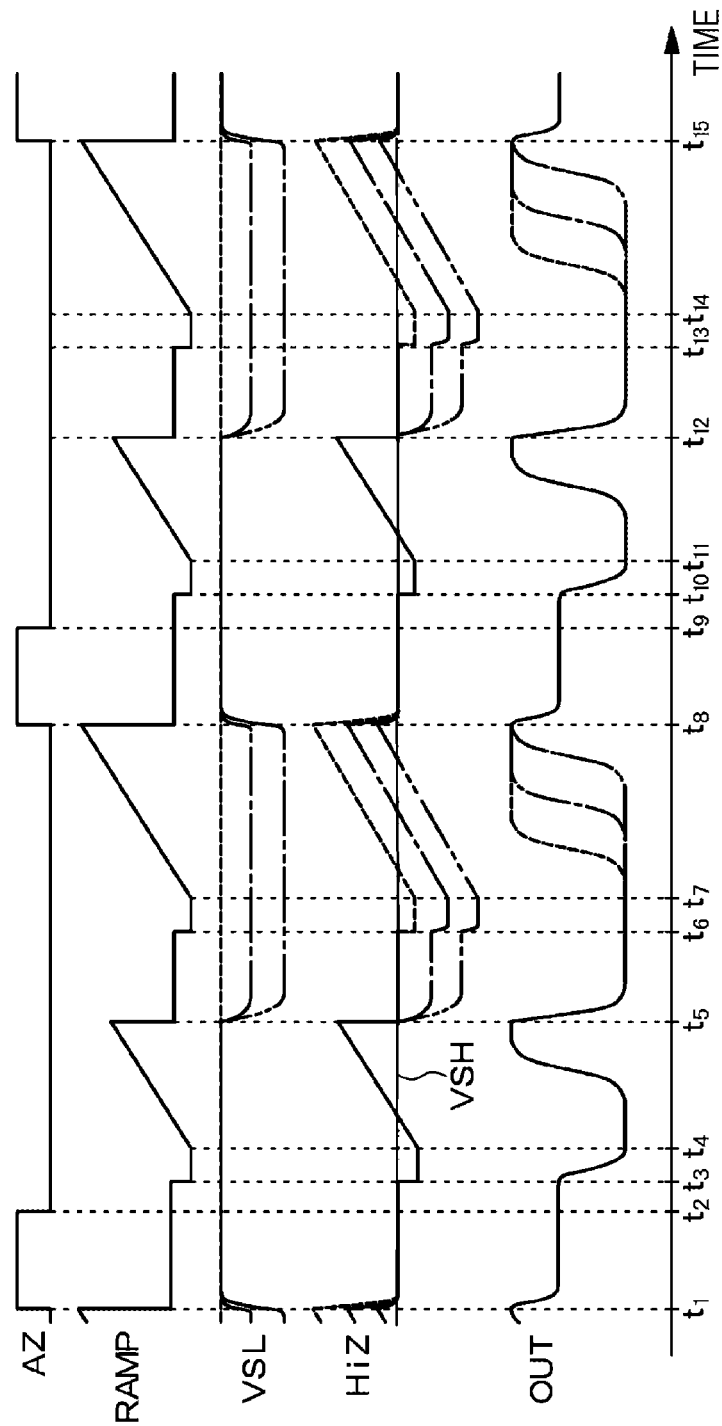
FIG. 7 is a timing chart accompanying an explanation of the operation of the comparator according to the reference example.

Next, the timing chart in FIG. 7 will be referenced to describe the operation of the comparator 50 according to the reference example. The timing chart in FIG. 7 illustrates the timing relationships between the driving signal AZ, the reference signal RAMP, the pixel signal VSL, the voltage HiZ of the node $N_{12}$, the voltage VSH of the node $N_{13}$, and the output signal OUT.

At a time $t_1$, the driving signal AZ goes from a low level to a high level. Thereafter, because the first switch transistor $NT_{13}$ and the second switch transistor $NT_{14}$ turn on, the drain electrode and the gate electrode of the first differential transistor $NT_{11}$ are connected, and the drain electrode and the gate electrode of the second differential transistor $NT_{12}$ are connected. Also, the reference signal RAMP is set to a predetermined reset level. Furthermore, the floating diffusion FD (see FIG. 2) of the pixel 2 to be read out is reset, and the pixel signal VSL is set to the reset level.

According to the above, an auto-zero operation that is an initialization operation of the differential amplifier 51 is started. That is, the drain electrode and the gate electrode of the first differential transistor $NT_{11}$ as well as the drain electrode and the gate electrode of the second differential transistor $NT_{12}$ converge on the same predetermined voltage (hereinafter referred to as the "reference voltage"). With this arrangement, the voltage HiZ of the node $N_{12}$ and the voltage VSH of the node $N_{13}$ are set to the reference voltage.

Next, at a time $t_2$, the driving signal AZ goes from the high level to the low level. Consequently, the first switch transistor $NT_{13}$ and the second switch transistor $NT_{14}$ turn off, and the auto-zero operation of the differential amplifier 51 ends. The pixel signal VSL and the reference signal RAMP do not change, and therefore the voltage HiZ of the node $N_{12}$ is kept at the reference voltage. Also, the voltage VSH of the node $N_{13}$ is kept at the reference voltage by the charge stored in the third capacitance element $C_{13}$.

After that, at a time $t_3$, the voltage of the reference signal RAMP is lowered from the reset level by a predetermined value. With this arrangement, the voltage HiZ of the node $N_{12}$ falls and goes below the voltage (reference voltage) VSH of the node $N_{13}$, causing the output signal OUT of the differential amplifier 51 to go to a low level.

Next, at a time $t_4$, the reference signal RAMP starts increasing linearly, and correspondingly, the voltage HiZ of the node $N_{12}$ also increases linearly. Also, the counter circuit 142 (see FIG. 3) starts a count operation. After that, when the voltage HiZ of the node $N_{12}$ goes above the voltage (reference voltage) VSH of the node $N_{13}$, the output signal OUT of the differential amplifier 51 inverts and goes to a high level. Additionally, the count value of the counter circuit 142 when the output signal OUT inverts to the high level is held in the latch circuit 143 (see FIG. 3) as the value of the pixel signal VSL in the P phase (reset level).

Next, at a time $t_5$, the voltage of the reference signal RAMP is set to a reset voltage. Also, by turning on the transfer transistor 22 of the pixel 2, the charge stored in the photodiode 21 during the exposure period is transferred to the floating diffusion FD, and the pixel signal VSL is set to the signal level. With this arrangement, the voltage HiZ of the node $N_{12}$ falls by a value corresponding to the signal level, goes below the voltage (reference voltage) VSH of the node $N_{13}$, and the output signal OUT of the differential amplifier 51 inverts to the low level.

Next, at a time $t_6$, the voltage of the reference signal RAMP is lowered from the reset level by a predetermined value, similarly to the time $t_3$. Consequently, the voltage HiZ of the node $N_{12}$ falls further.

Next, at a time $t_7$, the reference signal RAMP starts increasing linearly, similarly to the time $t_4$. Correspondingly, the voltage HiZ of the node $N_{12}$ also increases linearly. Also, the counter circuit 142 starts the count operation.

After that, when the voltage HiZ of the node $N_{12}$ goes above the voltage (reference voltage) VSH of the node $N_{13}$, the output signal OUT of the differential amplifier 51 inverts and goes to a high level. Additionally, the count value of the counter circuit 142 when the output signal OUT inverts to the high level is held in the latch circuit 143 as the value of the pixel signal VSL in the D phase (signal level). Also, the latch circuit 143 performs CDS as a noise removal process by taking the difference between the pixel signal VSL in the D phase and the pixel signal VSL in the P phase read out between the time $t_4$ and the time $t_5$. With this arrangement, analog-to-digital conversion of the analog pixel signal VSL is performed.

After that, at a time $t_8$ and thereafter, operations similar to those from the time $t_1$ to the time $t_7$ are repeated.

(Action and Effect of Comparator According to Reference Example)

Figure 8A:
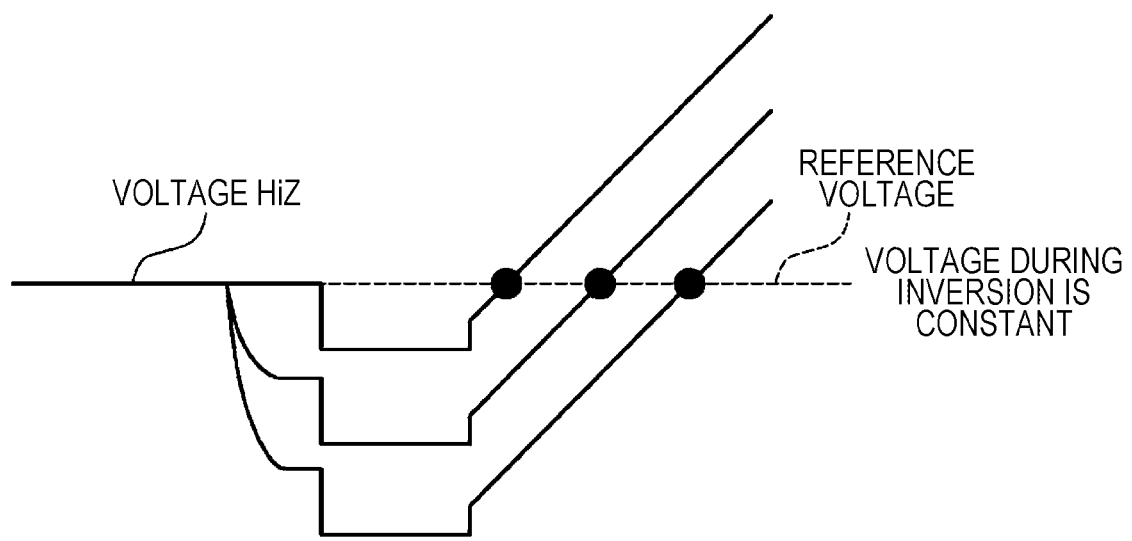
FIG. 8A is an explanatory diagram regarding operation during inversion of an output signal of the comparator according to the reference example.

As described above, in the comparator 50 according to the reference example, a signal (the voltage HiZ of the node $N_{12}$) obtained by combining (adding) the pixel signal VSL and the reference signal RAMP through input capacitances ($C_{11}$, $C_{12}$) is treated as the gate input of the first differential transistor $NT_{11}$. Also, the predetermined voltage REF (the voltage of the node $N_{13}$) VSH input through an input capacitance ($C_{13}$) is treated as the gate input of the second differential transistor $NT_{12}$. Furthermore, the comparison result of the voltage HiZ of the node $N_{12}$ and the voltage (reference voltage) VSH of the node $N_{13}$ in the differential amplifier 51 is output as the output signal OUT of the differential amplifier 51. At this time, as illustrated in FIG. 8A, the input voltages (the voltages of the voltage HiZ of the node $N_{12}$ and the voltage VSH of the node $N_{13}$) of the differential amplifier 51 when the output signal OUT inverts remain constant without varying.

Figure 8B:
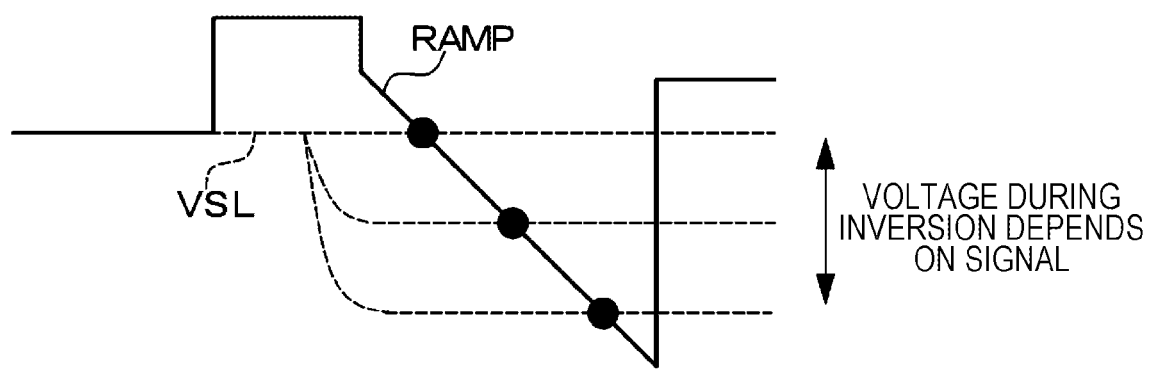
FIG. 8B is an explanatory diagram regarding operation during inversion of an output signal of a comparator according to the technology of the related art.

Incidentally, FIG. 8B illustrates the waveform of the output signal OUT in the case of a comparator like the technology of the related art described in Patent Document 1, in which the reference signal RAMP having a linearly decreasing ramp waveform is treated as the gate input of the first differential transistor $NT_{11}$ through an input capacitance ($C_{11}$), and the analog pixel signal VSL is treated as the gate input of the second differential transistor $NT_{12}$ through an input capacitance ($C_{13}$). The input voltages (the voltages of the reference signal RAMP and the pixel signal VSL) of the differential amplifier 51 when the output signal OUT inverts vary depending on the voltage of the pixel signal VSL. Consequently, for example, if the power supply voltage $V_{DD}$ for driving the comparator falls due to a lowering of the power supply voltage of the CMOS image sensor 1, the input voltages of the differential amplifier 51 when the output signal OUT inverts exceed the input dynamic range of the comparator, and the linearity of the analog-to-digital conversion may no longer be secured.

Also, in the comparator 50 according to the reference example, the reference signal RAMP changes linearly in the opposite direction of the case of the technology of the related art described in Patent Document 1, and changes linearly in the opposite direction of the pixel signal VSL. Herein, changing in the opposite direction of the pixel signal VSL means changing in the opposite direction of the direction in which the pixel signal VSL changes as the signal component becomes larger. For instance, in this example, whereas the pixel signal VSL changes in the negative direction as the signal level becomes larger, the reference signal RAMP changes in the opposite, positive direction. Consequently, the voltage during inversion is constant. On the other hand, the voltage HiZ of the node $N_{12}$ (the input voltage of the differential amplifier 51) is a voltage biased during initialization (AZ).

In this way, according to the comparator 50 according to the reference example, the input voltage of the differential amplifier 51 when the output signal OUT inverts is constant and is also no longer dependent on the amplitude of the pixel signal VSL during inversion, and therefore the input dynamic range of the differential amplifier 51 can be narrowed. Consequently, because the power supply voltage $V_{DD}$ for driving the comparator 50 according to the reference example can be lowered further than the comparator according to the technology of the related art above, and as a result, the power consumption of the analog-to-digital conversion unit 14 can be lowered, lower power consumption of the CMOS image sensor 1 can be attained.

(Problems with Comparator According to Reference Example)

In the comparator 50 according to the reference example, the predetermined voltage REF is input into the gate electrode of the second differential transistor $NT_{12}$ through the input terminal $T_{14}$, but the connection destination of the input terminal $T_{14}$ (for example GND or the power supply voltage $V_{DD}$) is a common trunk line between pixel columns. For this reason, kickback during the inversion of the output signal OUT of the comparator 50 becomes fluctuation in the predetermined voltage REF through the parasitic capacitance of the second differential transistor $NT_{12}$ or the second switch transistor $NT_{14}$, and this fluctuation is propagated to the comparator 50 of the other pixel columns. Additionally, a type of noise in the image waveform known as streaking occurs due to differences in the amount of kickback in dark and light portions of the captured image. Herein, kickback refers to the phenomenon of the potential varying (fluctuating) in association with charge being injected or charge being drawn out. Also, streaking refers to a phenomenon of white or black tails sweeping in the left and right direction in an image in which a white region exists in a portion of an image with a field of black.

Figure 9A:
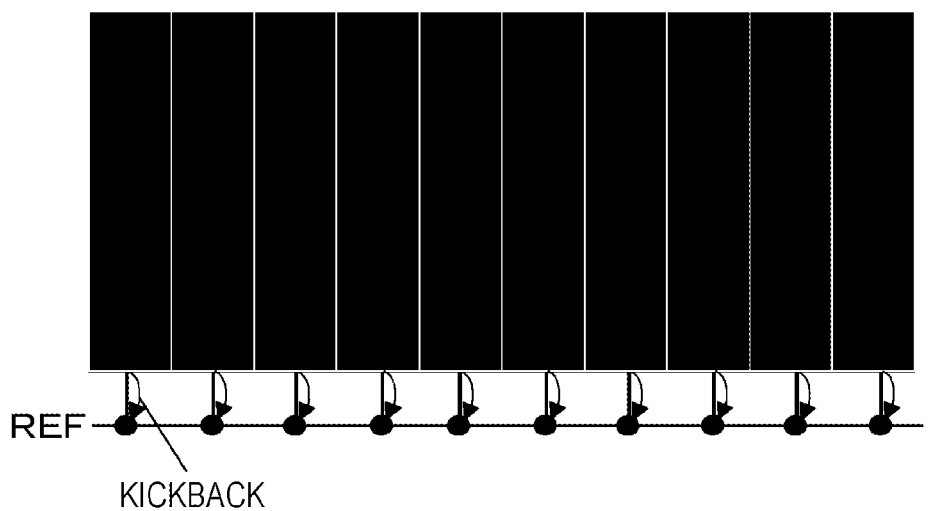
FIG. 9A is a diagram illustrating an imaging screen in a case where the entire screen is a black image in the case of the reference example.
Figure 9B:
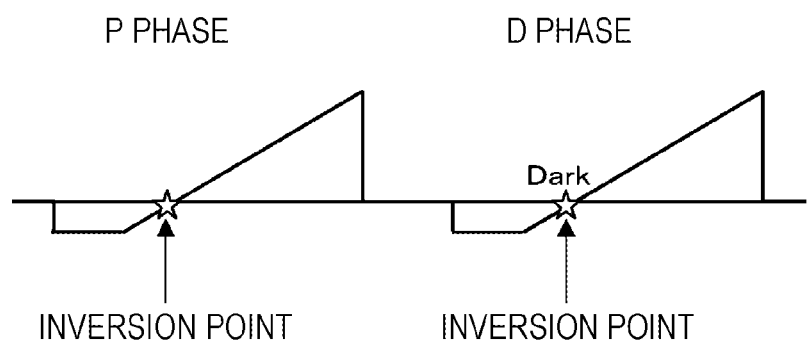
FIG. 9B is a waveform diagram illustrating output waveforms of the comparator in a P phase and a D phase in the case of FIG. 9A.

Hereinafter, streaking caused by kickback will be described by citing specific examples. FIG. 9A illustrates an imaging screen in the case where the entire screen of the image is a field of black, and FIG. 9B illustrates the output waveforms of the comparator in the P phase and the D phase in the case of FIG. 9A. In the case where the entire screen of the image is a field of black, because the comparator 50 inverts at the same time for all pixel columns in both the P phase and the D phase, and the amount of kickback in the P phase and the D phase is the same, the occurrence of streaking is suppressed. As an example of the kickback path, in FIG. 9A, arrows are used to illustrate the way in which the kickback is propagated to the comparator 50 of other pixel columns through the parasitic capacitance of the second switch transistor $NT_{14}$.

Figure 10A:
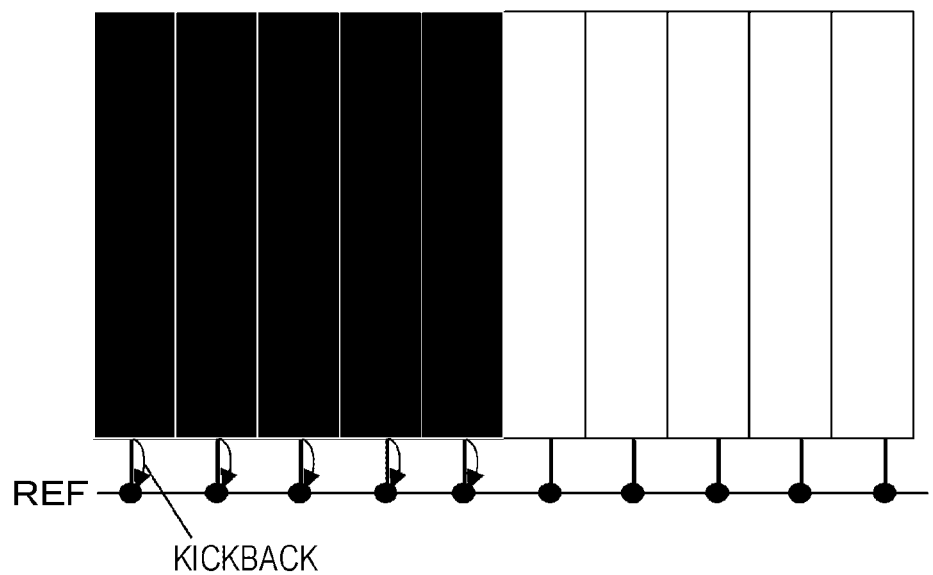
FIG. 10A is a diagram illustrating an imaging screen in a case where half of the screen is a black image and half of the screen is a white image from left to right in the case of the reference example.
Figure 10B:
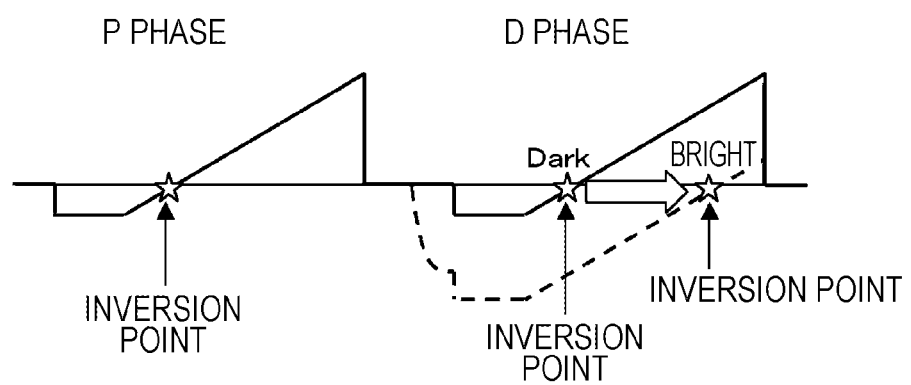
FIG. 10B is a waveform diagram illustrating output waveforms of the comparator in a P phase and a D phase in the case of FIG. 10A.

FIG. 10A illustrates an imaging screen in the case where half of the screen is a black image and half of the screen is a white image from left to right, and FIG. 10B illustrates the output waveforms of the comparator in the P phase and the D phase in the case of FIG. 10A. In the case where half of the screen is a black image and half of the screen is a white image from left to right, in the P phase, the comparator 50 inverts at the same time for all pixel columns, but in the D phase, because the inversion of the comparator 50 in the half corresponding to the white image is delayed, the amount of kickback changes between the D phase and P phase, and streaking occurs. As an example of the kickback path, in FIG. 10A, arrows are used to illustrate the way in which the kickback is propagated to the comparator 50 of other pixel columns through the parasitic capacitance of the second switch transistor $NT_{14}$.

First Embodiment

In the first embodiment of the present disclosure, the amount of kickback itself is reduced to suppress the occurrence of streaking. Specifically, in the first embodiment of the present disclosure, by inserting a signal of inverse phase to the kickback into the predetermined voltage REF, fluctuation in the predetermined voltage REF due to the kickback is suppressed, and the occurrence of streaking caused by the kickback is suppressed. According to the first embodiment of the present disclosure, the power consumption of the analog-to-digital conversion unit 14 can be reduced, and lower power consumption of the CMOS image sensor 1 can be attained. In addition, according to the first embodiment, because the occurrence of streaking caused by kickback can be suppressed, high-quality captured images can be obtained.

In the following, specific examples of the first embodiment for reducing the amount of kickback itself and suppressing the occurrence of streaking will be described.

Example 1

Figure 11:
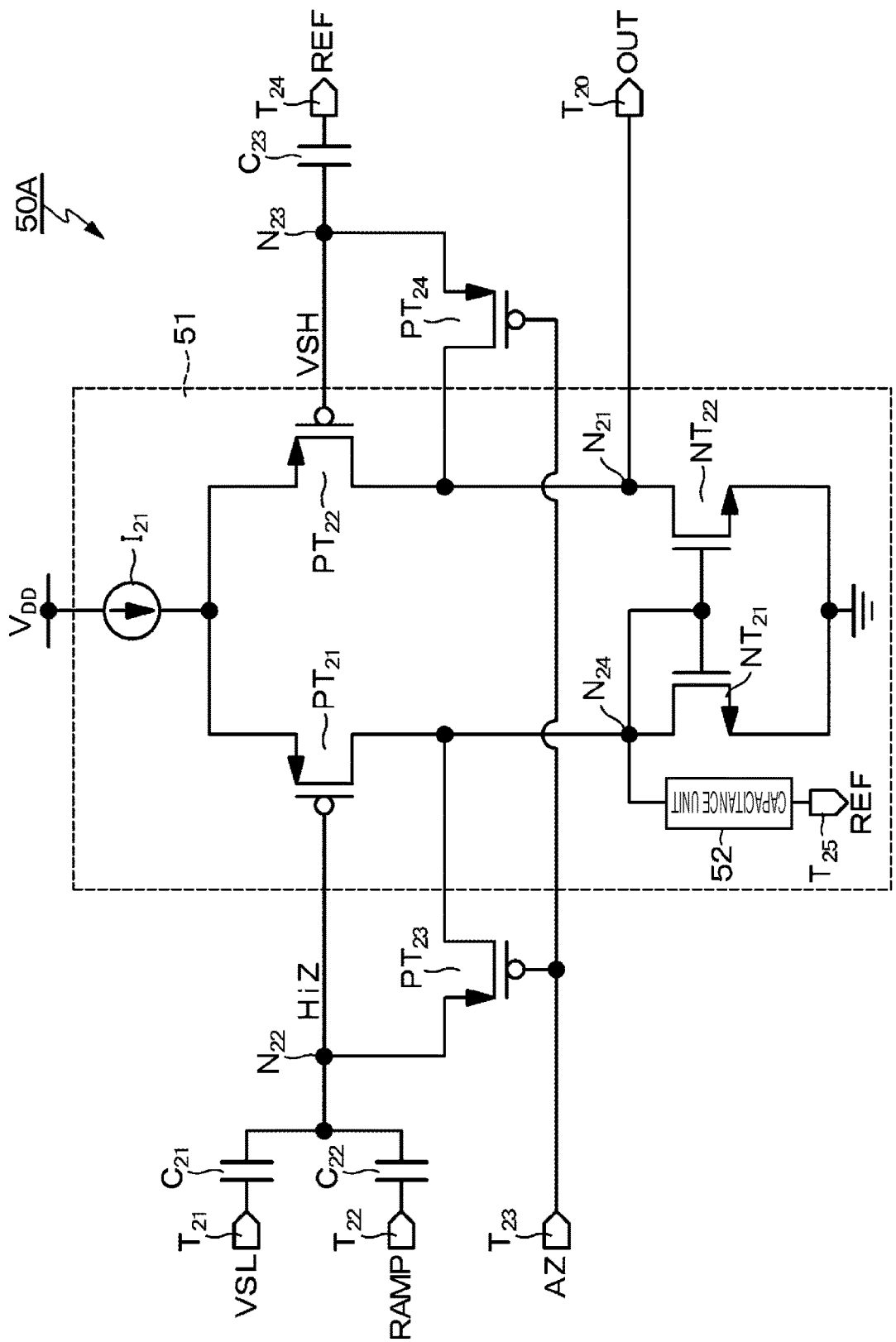
FIG. 11 is a circuit diagram illustrating a circuit configuration of a comparator according to Example 1.

Example 1 is a basic exemplary configuration of the comparator according to the first embodiment of the present disclosure. A circuit configuration of the comparator according to Example 1 is illustrated in FIG. 11.

A comparator 50A according to Example 1 is provided with a differential amplifier 51, a first capacitance element $C_{21}$, a second capacitance element $C_{22}$, a third capacitance element $C_{23}$, a first switch transistor $PT_{23}$, and a second switch transistor $PT_{24}$, and a capacitance unit 52. The first switch transistor $PT_{23}$ and the second switch transistor $PT_{24}$ are an example of switch elements. Herein, for example, a P-channel MOS transistor is used as each of the first switch transistor $PT_{23}$ and the second switch transistor $PT_{24}$, but an N-channel MOS transistor may also be used.

The differential amplifier 51 includes a first differential transistor $PT_{21}$, a second differential transistor $PT_{22}$, a current source $I_{21}$, a first load transistor $NT_{21}$, and a second load transistor $NT_{22}$. Here, a P-channel MOS transistor is used as each of the first differential transistor $PT_{21}$ and the second differential transistor $PT_{22}$, while an N-channel MOS transistor is used as each of the first load transistor $NT_{21}$ and the second load transistor $NT_{22}$, however, there differential transistor and load transistor can also be configured in the opposite channel (opposite-conductivity-type).

In the differential amplifier 51, the source electrodes of the first differential transistor $PT_{21}$ and the second differential transistor $PT_{22}$ are connected in common to form a differential pair that achieves differential operation. The current source $I_{21}$ is connected between the source common connection node of the first differential transistor $PT_{21}$ and the second differential transistor $PT_{22}$, and the node of the power supply voltage $V_{DD}$. The first load transistor $NT_{21}$ is configured as a diode connection in which the gate electrode and the drain electrode are connected in common, and is connected in series with the first differential transistor $PT_{21}$. In other words, the drain electrodes of the first load transistor $NT_{21}$ and the first differential transistor $PT_{21}$ are connected in common.

The second load transistor $NT_{22}$ is connected in series with the second differential transistor $PT_{22}$. In other words, the drain electrodes of the second load transistor $NT_{22}$ and the second differential transistor $PT_{22}$ are connected in common. Additionally, the gate electrodes of the first load transistor $NT_{21}$ and the second load transistor $NT_{22}$ are connected in common to form a current mirror circuit.

Also, a common connection node $N_{21}$ between the second differential transistor $PT_{22}$ and the second load transistor $NT_{22}$ acts as the output node of the differential amplifier 51, and an output signal OUT is led out from the output node $N_{21}$ through an output terminal $T_{20}$. The source electrodes of the first load transistor $NT_{21}$ and the second load transistor $NT_{22}$ are connected to the ground GND that acts as a low-potential-side power supply.

The first capacitance element $C_{21}$ is connected between an input terminal $T_{21}$ of a pixel signal VSL and the gate electrode of the first differential transistor $PT_{21}$, and takes an input capacitance with respect to the pixel signal VSL. The second capacitance element $C_{22}$ is connected between an input terminal $T_{22}$ of a reference signal RAMP and the gate electrode of the first differential transistor $PT_{21}$, and takes an input capacitance with respect to the reference signal RAMP. With this arrangement, the combined (added) signal of the pixel signal VSL and the reference signal RAMP passing through the first capacitance element $C_{21}$ and the second capacitance element $C_{22}$ is treated as the gate input of the first differential transistor $PT_{21}$.

The first switch transistor $PT_{23}$ is connected between the gate electrode and the drain electrode of the first differential transistor $PT_{21}$, and is controlled on and off by a driving signal AZ input through an input terminal $T_{23}$ from the timing control unit 17 illustrated in FIG. 1. The driving signal AZ is a signal to initialize the differential amplifier 51. The second switch transistor $PT_{24}$ is connected between the gate electrode and the drain electrode of the second differential transistor $PT_{22}$, and is controlled on/off by the driving signal AZ input through an input terminal $T_{23}$ from the timing control unit 17.

The third capacitance element $C_{23}$ is connected between the gate electrode of the second differential transistor $PT_{22}$ and an input terminal $T_{24}$ with a predetermined voltage REF. With this arrangement, the second differential transistor $PT_{22}$ treats the predetermined voltage REF supplied through the terminal $T_{24}$ as the gate input via the third capacitance element $C_{23}$. The predetermined voltage REF is a fixed voltage of any level, such as the power supply voltage $V_{DD}$ or GND (ground) level. Here, the predetermined voltage REF is set to the GND level.

The capacitance unit 52 is connected between a common connection node $N_{24}$ of the first differential transistor $PT_{21}$ acting as one transistor of the differential pair and the first load transistor $NT_{21}$, and a terminal $T_{25}$ supplied with the predetermined voltage REF. The capacitance unit 52 can have a variable capacitance value. The capacitance unit 52 works to insert a signal of inverse phase to the kickback when the output signal OUT of the comparator 50A inverts into the node of the predetermined voltage REF through the terminal $T_{25}$. Through the action of the capacitance unit 52, fluctuation in the predetermined voltage REF due to kickback can be suppressed, and therefore the occurrence of streaking caused by the kickback can be suppressed.

In the comparator 50A according to Example 1 with the above configuration, the first differential transistor $PT_{21}$, the second differential transistor $PT_{22}$, the first load transistor $NT_{21}$, and the second load transistor $NT_{22}$ are of the opposite conductivity type compared to the case of the reference example, but the basic circuit operation is basically the same as the case of the reference example. Correspondingly, action and effects similar to the case of the reference example furthermore can be obtained. That is, the input voltage of the differential amplifier 51 when the output signal OUT inverts is constant and is also no longer dependent on the amplitude of the pixel signal VSL during inversion, and therefore the input dynamic range of the differential amplifier 51 can be narrowed. Consequently, because the power supply voltage $V_{DD}$ can be lowered, and as a result, the power consumption of the analog-to-digital conversion unit 14 can be lowered, lower power consumption of the CMOS image sensor 1 can be attained.

Figure 12:
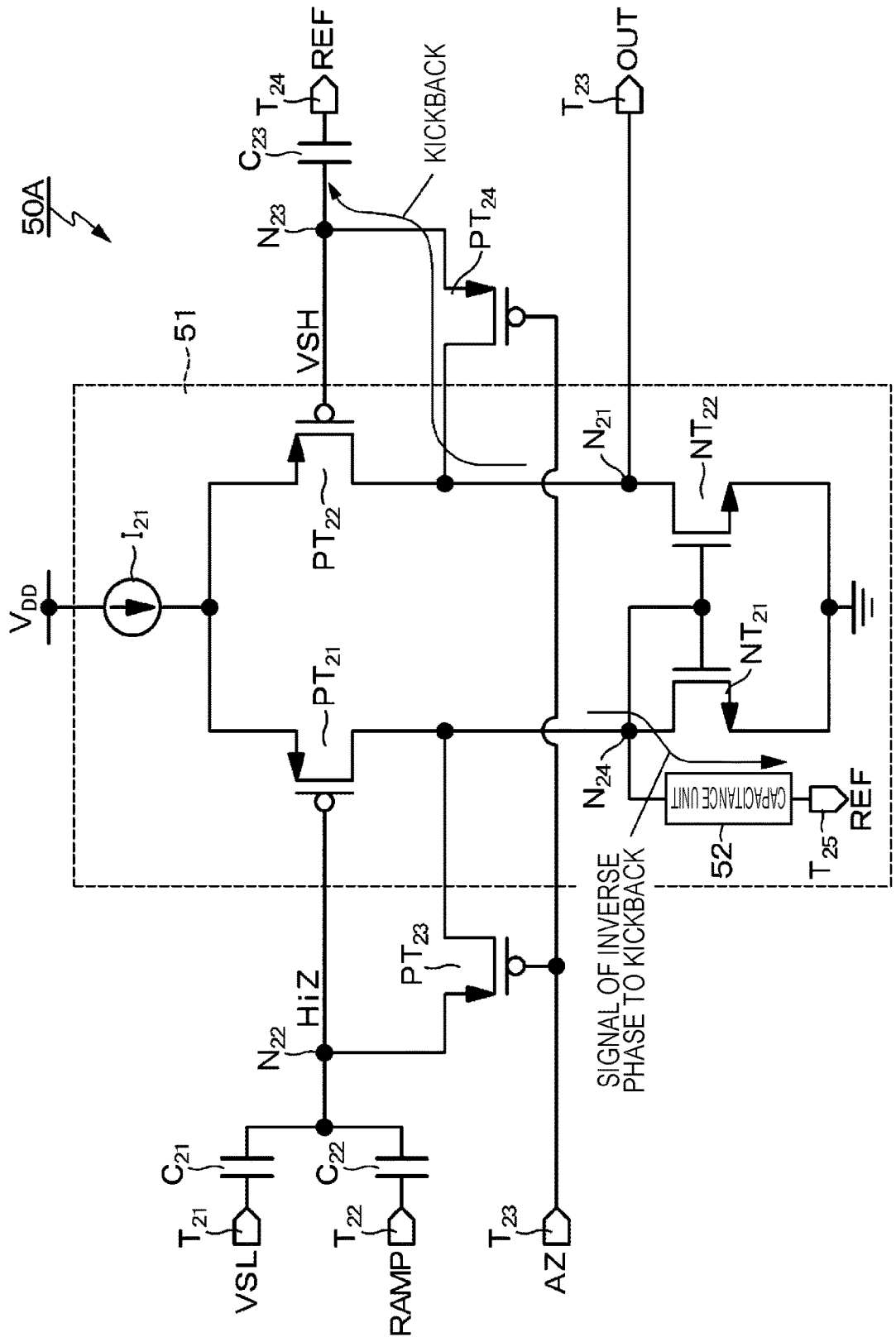
FIG. 12 is an explanatory diagram regarding kickback due to the action of a capacitance unit and a path of a signal of inverse phase.

In addition to the above action and effects, according to the comparator 50A according to Example 1, as illustrated by the arrow in FIG. 12, the action of the capacitance unit 52 causes a signal of inverse phase to the kickback when the output signal OUT of the comparator 50A inverts to be inserted into the predetermined voltage REF, and therefore the fluctuation in the predetermined voltage REF due to the kickback can be suppressed. Consequently, the occurrence of streaking caused by kickback when the output signal OUT of the comparator 50A inverts can be suppressed. Additionally, because the capacitance value of the capacitance unit 52 is variable, it is possible to set an optimal capacitance value for suppressing the occurrence of streaking.

Streaking caused by kickback when the output signal OUT of the comparator 50A inverts will be described specifically by citing the case where the entire screen of the image is a field of black and the case where half of the screen is a black image and half of the screen is a white image from left to right as examples.

Figure 13A:
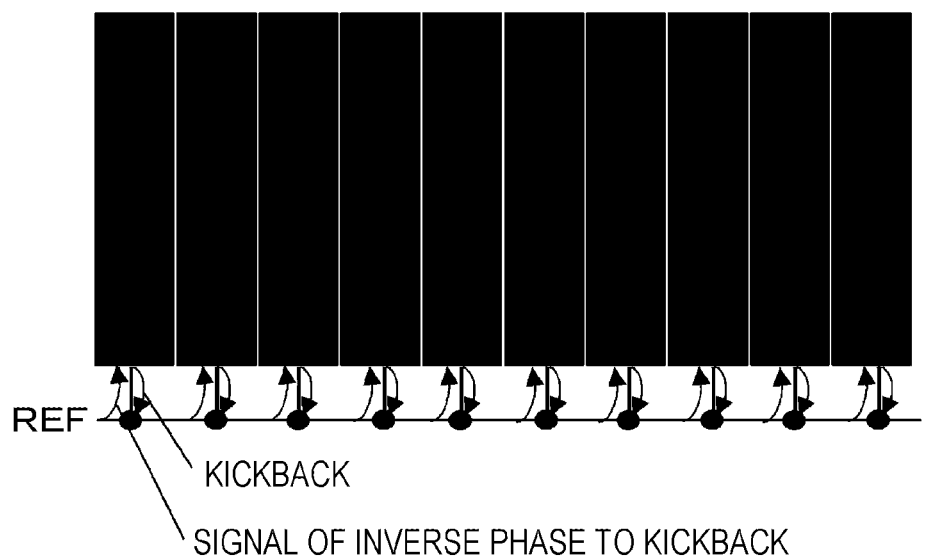
FIG. 13A is a diagram illustrating an imaging screen in a case where the entire screen is a black image in the case of Example 1.
Figure 13B:
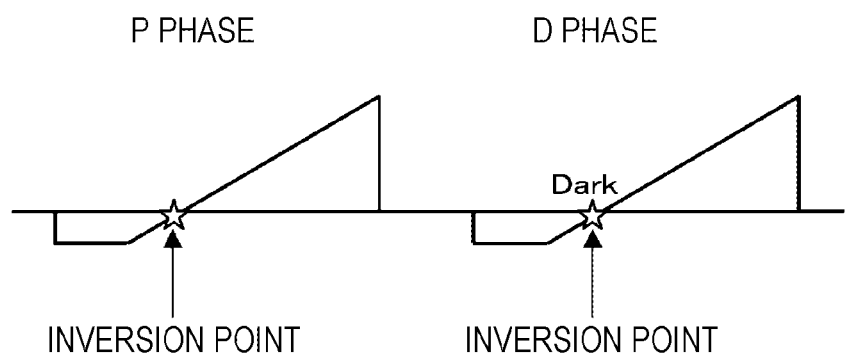
FIG. 13B is a waveform diagram illustrating output waveforms of the comparator in a P phase and a D phase in the case of FIG. 13A.

FIG. 13A illustrates an imaging screen in the case where the entire screen of the image is a field of black, and FIG. 13B illustrates the output waveforms of the comparator in the P phase and the D phase in the case of FIG. 13A. In the case where the entire screen of the image is a field of black, because the comparator 50 inverts at the same time for all pixel columns in both the P phase and the D phase, and the amount of kickback in the P phase and the D phase is the same, the occurrence of streaking is suppressed. In FIG. 13A, arrows are used to illustrate the way in which the kickback and the signal of inverse phase to the kickback are propagated to the comparator 50 of other pixel columns through the parasitic capacitance of the second differential transistor $PT_{22}$ or the second switch transistor $PT_{24}$.

Figure 14A:
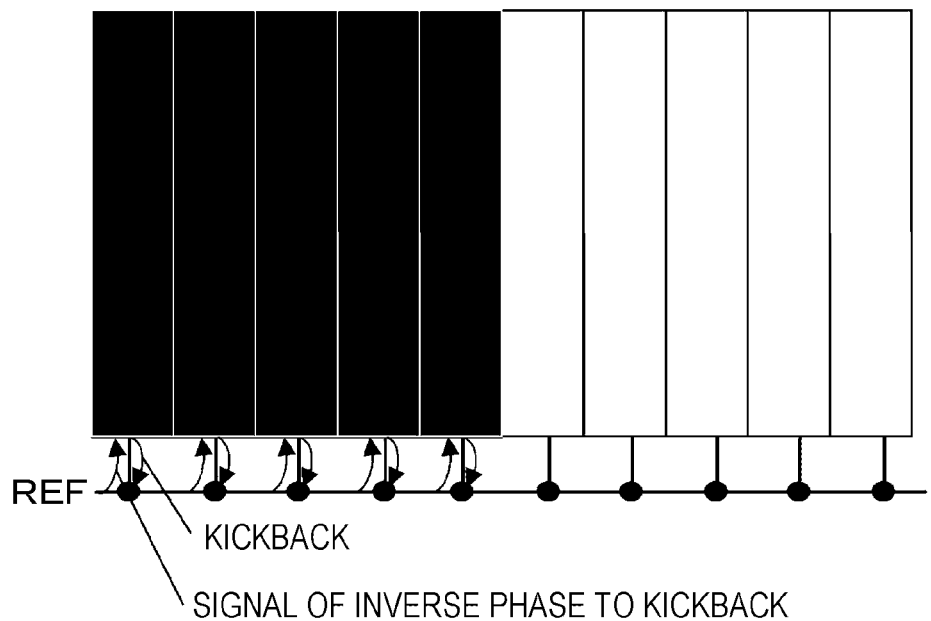
FIG. 14A is a diagram illustrating an imaging screen in a case where half of the screen is a black image and half of the screen is a white image from left to right in the case of Example 1.
Figure 14B:
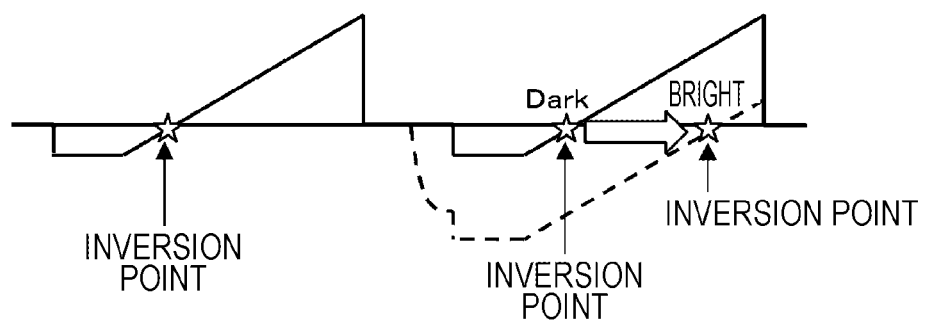
FIG. 14B is a waveform diagram illustrating output waveforms of the comparator in a P phase and a D phase in the case of FIG. 14A.

FIG. 14A illustrates an imaging screen in the case where half of the screen is a black image and half of the screen is a white image from left to right, and FIG. 14B illustrates the output waveforms of the comparator in the P phase and the D phase in the case of FIG. 14A. In the case where half of the screen is a black image and half of the screen is a white image from left to right, in the P phase, the comparator 50 inverts at the same time for all pixel columns, but in the D phase, the inversion of the comparator 50A in the half corresponding to the white image is delayed. However, by inserting a signal of inverse phase to the kickback into the predetermined voltage REF through the action of the capacitance unit 52, the amount of kickback itself is reduced, and therefore the occurrence of streaking between the D phase and P phase is suppressed. In FIG. 14A, arrows are used to illustrate the way in which the kickback and the signal of inverse phase to the kickback are propagated to the comparator 50 of other pixel columns through the parasitic capacitance of the second differential transistor $PT_{22}$ or the second switch transistor $PT_{24}$.

Example 2

Example 2 is a specific example 1 of the capacitance unit 52, and is an example of using a variable-capacitance element as the capacitance unit 52. A circuit configuration of the comparator according to Example 2 is illustrated in FIG. 15.

Figure 15:
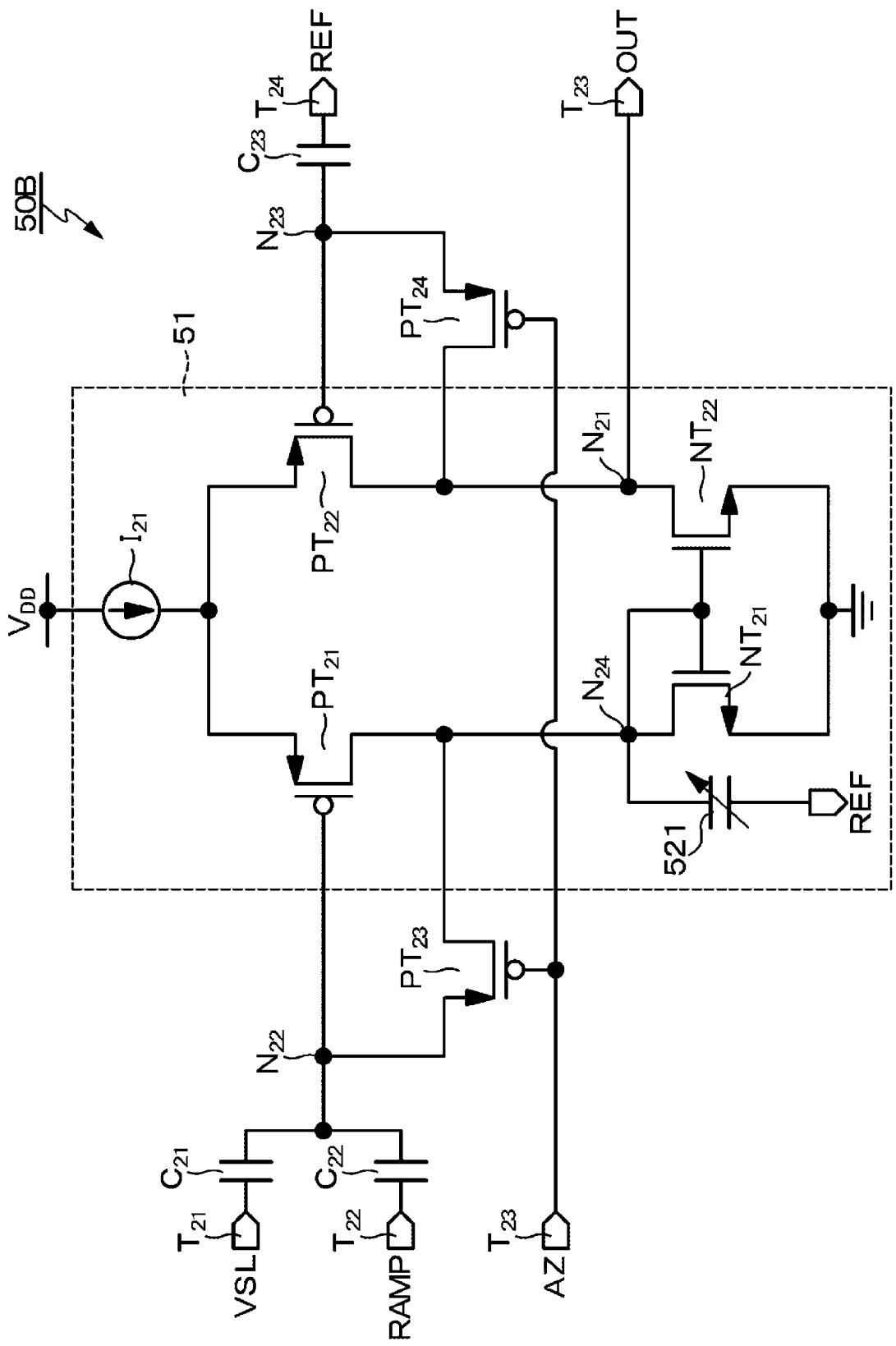
FIG. 15 is a circuit diagram illustrating a circuit configuration of a comparator according to Example 2.

As illustrated in FIG. 15, in the comparator 50B according to Example 2, a variable-capacitance element 521 is used as the capacitance unit 52. Examples of the variable-capacitance element 521 include a variable-capacitance diode whose capacitance value changes depending on the voltage, also referred to as a varicap, varactor, or the like, and a radio frequency (RF) microelectromechanical system (MEMS) variable-capacitance element that operates using a piezoelectric material. However, the variable-capacitance element 521 is not limited to the examples given above, and is sufficiently any configuration for which the capacitance value is variable.

In the case of the comparator 50B according to Example 2 that uses a variable-capacitance element as the capacitance unit 52, actions and effects similar to the comparator 50A according to Example 1 can also be obtained. Additionally, by having the capacitance unit 52 contain the variable-capacitance element 521, an optimal capacitance value for suppressing the occurrence of streaking can be set by the variable-capacitance element 521.

Example 3

Example 3 is a specific example 2 of the capacitance unit 52, and is an example in which the capacitance unit 52 contains a combination of a plurality of capacitance elements and toggle switches. In the case of the comparator 50C according to Example 3, actions and effects similar to the comparator 50A according to Example 1 can also be obtained.

The plurality of capacitance elements can take a configuration containing capacitance elements having the same capacitance values, and can also take a configuration containing capacitance elements having different capacitance values from each other. In the following, the case where the plurality of capacitance elements includes capacitance elements having the same capacitance values as each other will be described as a first example, and the case where the plurality of capacitance elements includes capacitance elements having different capacitance values from each other will be described as a second example.

First Example

Figure 16:
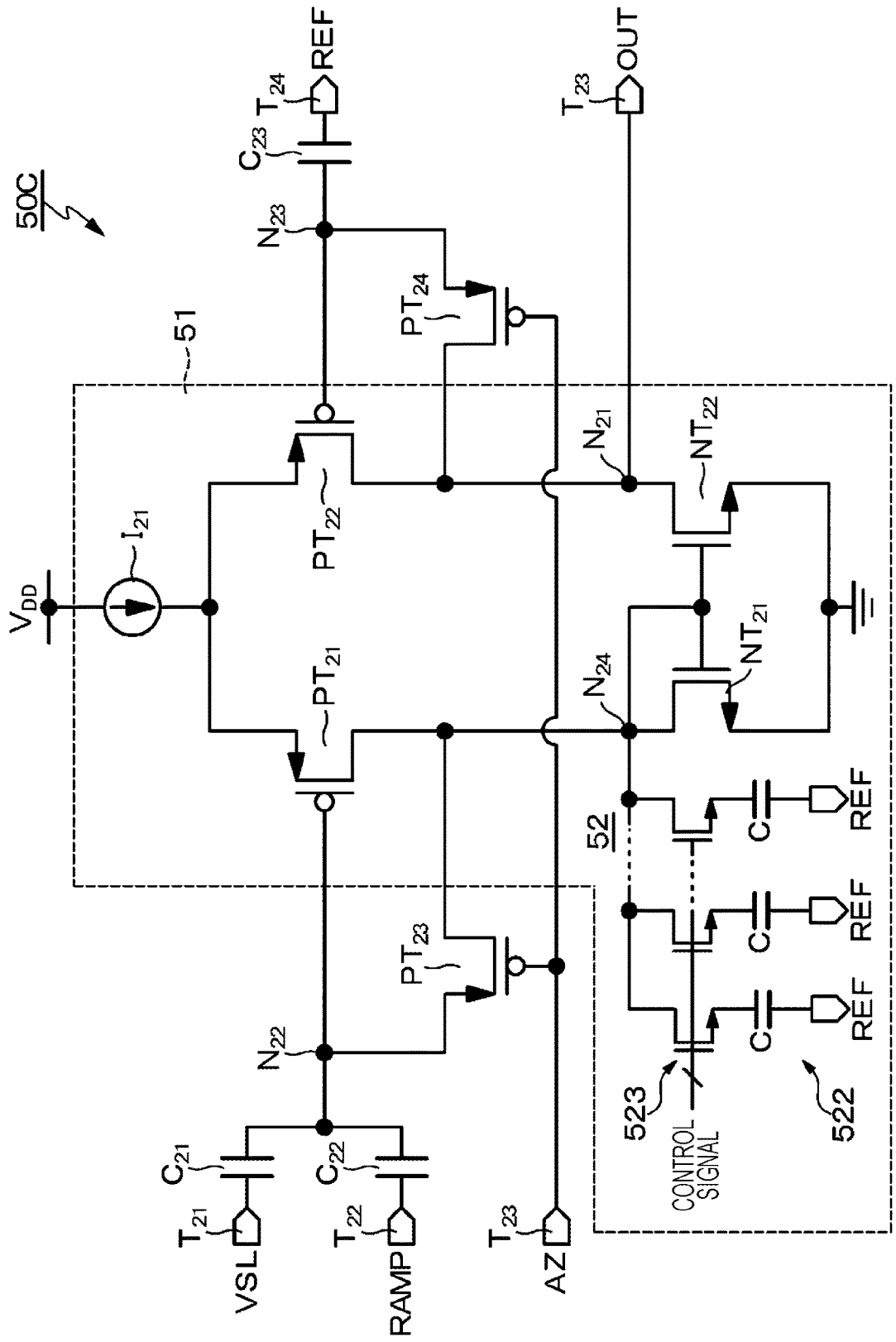
FIG. 16 is a circuit diagram illustrating a circuit configuration of a comparator according to a first example of Example 3.

FIG. 16 is a circuit diagram illustrating a circuit configuration of a comparator according to the first example of Example 3. As illustrated in FIG. 16, the capacitance unit 52 includes a capacitance element group 522 containing a plurality of capacitance elements, and a toggle switch group 523 that selects at least one of the plurality of capacitance elements. The capacitance element group 522 contains a plurality of capacitance elements having the same capacitance value C as each other. The toggle switches (switch elements) of the toggle switch group 523 are N-channel MOS transistors, for example. However, the toggle switches are not limited to N-channel MOS transistors, and it is also possible to use P-channel MOS transistors or CMOS transistors obtained by connecting N-channel MOS transistors and P-channel MOS transistors in parallel.

In the capacitance unit 52 with the above configuration, each toggle switch of the toggle switch group 523 selects at least one of the plurality of capacitance elements, or in other words, one or more of the plurality of capacitance elements with the same capacitance value C on the basis of a multi-bit control signal, thereby making it possible to set the capacitance value of the capacitance unit 52 to any value. Furthermore, an optimal capacitance value for suppressing the occurrence of streaking can be set under control by the multi-bit control signal.

Second Example

Figure 17:
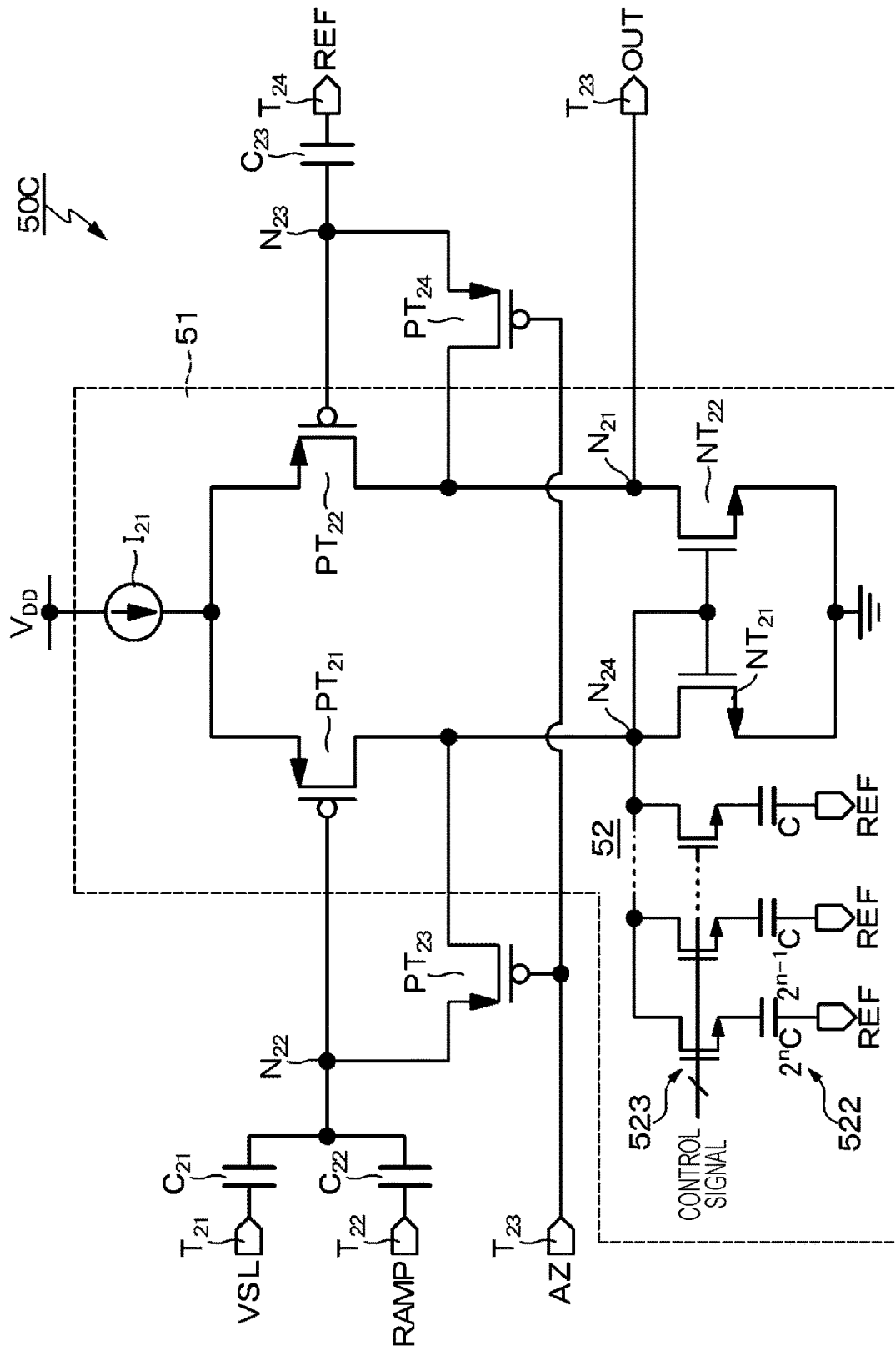
FIG. 17 is a circuit diagram illustrating a circuit configuration of a comparator according to a second example of Example 3.

FIG. 17 is a circuit diagram illustrating a circuit configuration of a comparator according to the second example of Example 3. In the capacitance unit 52 that includes the capacitance element group 522 and the toggle switch group 523 like the case of the first example, the capacitance element group 522 contains a plurality of capacitance elements having different capacitance values from each other. Here, a case in which the capacitance values of the plurality of capacitance elements are set to binary values in base 2 ($C, \ldots, C^{2-1}, C^{n-1}, C^n$) is illustrated as an example, but the capacitance values can be set to any values.

The toggle switch of the toggle switch group 523 is similar to the case of the first example. That is, the toggle switches of the toggle switch group 523 are N-channel MOS transistors, for example. However, the toggle switches are not limited to N-channel MOS transistors, and it is also possible to use P-channel MOS transistors or CMOS transistors obtained by connecting N-channel MOS transistors and P-channel MOS transistors in parallel.

Like the case of the capacitance unit 52 according to the first example, in the capacitance unit 52 according to the second example with the above configuration, the capacitance value of the capacitance unit 52 can be set to any value by selecting at least one of the plurality of capacitance elements having different capacitance values on the basis of a multi-bit control signal. Furthermore, an optimal capacitance value for suppressing the occurrence of streaking can be set under control by the multi-bit control signal.

Example 4

Example 4 is a specific example 3 of the capacitance unit 52, and is an example of providing an electrical isolation circuit in a control terminal of each toggle switch. Example 4 can be applied to the capacitance unit 52 according to the first example and also to the capacitance unit 52 according to the second example of Example 3.

In the capacitance unit 52 according to the first example and the capacitance unit 52 according to the second example of Example 3, a control line (not illustrated) that transmits a control signal controlling each toggle switch of the toggle switch group 523 is a control line shared in common by all pixel columns. For this reason, there are concerns that streaking may occur due to kickback when the potential of the node $N_{24}$ on the side of the first load transistor $N_{21}$ of the diode connection configuration inverts.

Figure 18:
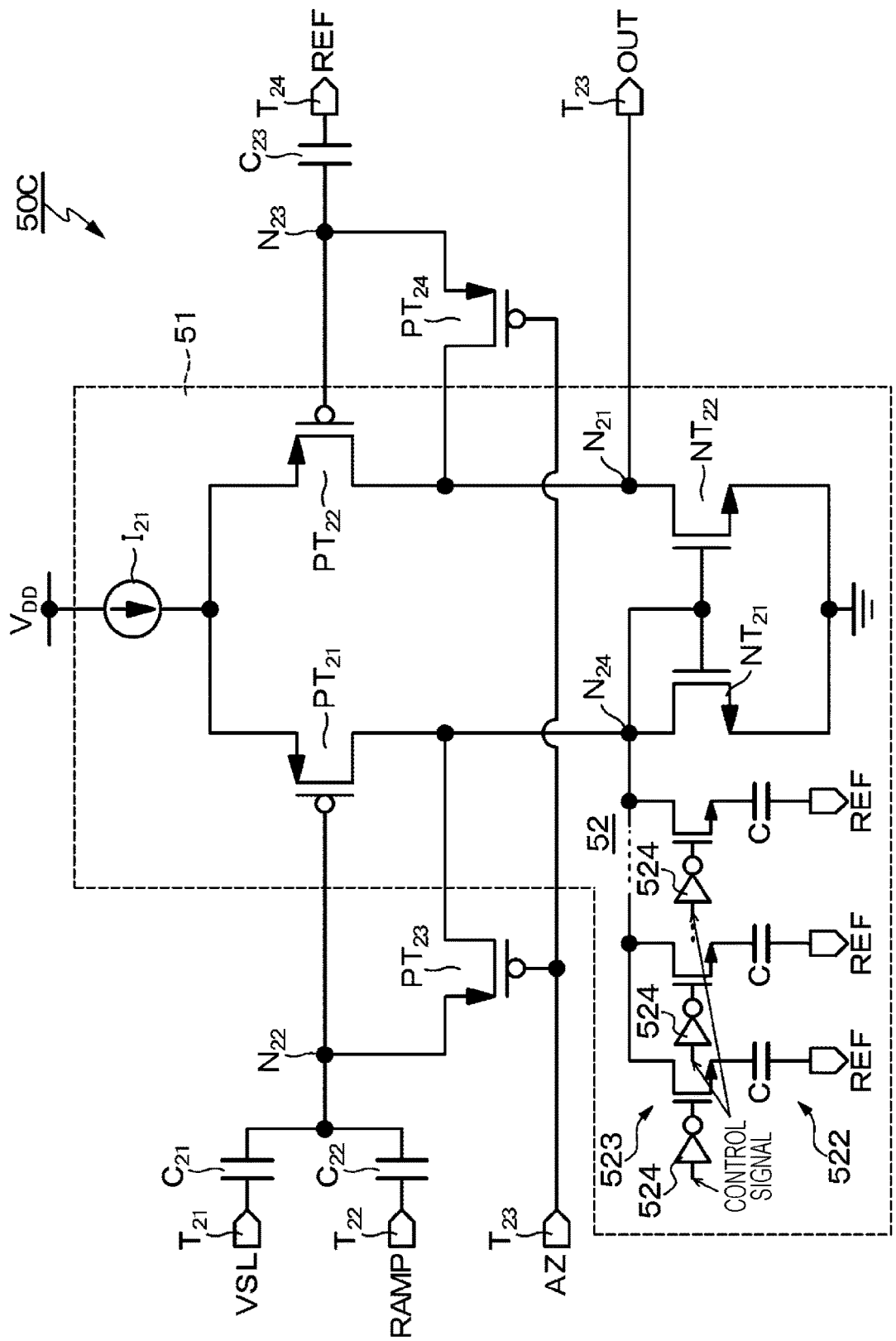
FIG. 18 is a circuit diagram illustrating a circuit configuration of a comparator according to Example 4.

Accordingly, Example 4 adopts a configuration in which an isolation circuit that electrically isolates the control line that supplies the control signal from each toggle switch of the toggle switch group 523 is provided in a control terminal of each toggle switch. A circuit configuration of the comparator according to Example 4 is illustrated in FIG. 18. Here, the case of applying Example 4 to the capacitance unit 52 according to the first example of Example 3 is illustrated, but the similar applies to the case of the capacitance unit 52 according to the second example of Example 3.

As illustrated in FIG. 18, the capacitance unit 52 according to Example 4 adopts a configuration in which an inverter circuit 524 for example is provided as an electrical isolation circuit in a control terminal (gate electrode) of each toggle switch in the toggle switch group 523. With this arrangement, the control line that supplies the control signal and each toggle switch in the toggle switch group 523 can be electrically isolated. As a result, the propagation of kickback to the comparator 50 of the other pixel columns when the potential of the node $N_{24}$ on the side of the first load transistor $N_{21}$ inverts can be blocked, and therefore the occurrence of streaking caused by the kickback can be suppressed.

Note that although this example illustrates the case of providing the inverter circuit 524 as the electrical isolation circuit, the electrical isolation circuit is not limited to the inverter circuit 524, and similar actions and effects can be obtained even if for example a buffer circuit is used instead of the inverter circuit 524.

Example 5

Figure 19:
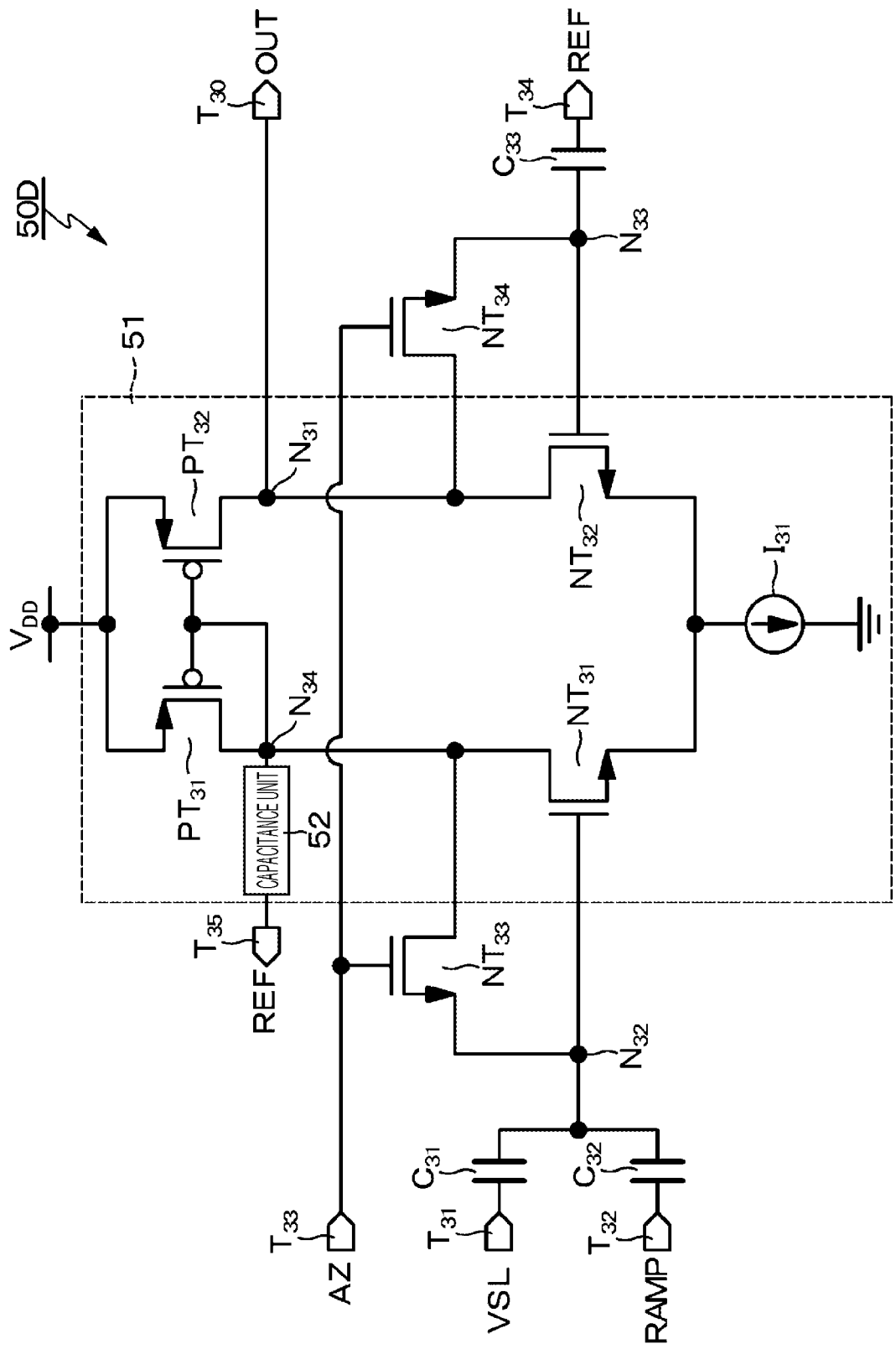
FIG. 19 is a circuit diagram illustrating a circuit configuration of a comparator according to Example 5.

Example 5 is a modification of Example 1, and is an example of using transistors of the opposite conductivity type from Example 1. In other words, whereas the differential amplifier 51 takes P-channel input in Example 1, the differential amplifier 51 takes N-channel input in Example 5. A circuit configuration of the comparator according to Example 5 is illustrated in FIG. 19.

A comparator 50D according to Example 5 is provided with a differential amplifier 51, a first capacitance element $C_{31}$, a second capacitance element $C_{32}$, a third capacitance element $C_{33}$, a first switch transistor $NT_{33}$, a second switch transistor $NT_{34}$, and the capacitance unit 52. The first switch transistor $NT_{33}$ and the second switch transistor $NT_{34}$ are N-channel MOS transistors, but may also be configured as P-channel MOS transistors.

The differential amplifier 51 includes a first differential transistor $NT_{31}$, a second differential transistor $NT_{32}$, a current source $I_{31}$, a first load transistor $PT_{31}$, and a second load transistor $PT_{32}$. The first differential transistor $NT_{31}$ and the second differential transistor $NT_{32}$ include an N-channel MOS transistor, and the first load transistor $PT_{31}$ and the second load transistor $PT_{32}$ include a P-channel MOS transistor.

In the differential amplifier 51, the first differential transistor $NT_{31}$ and the second differential transistor $NT_{32}$ form a differential pair. The current source $I_{31}$ is connected between the source common connection node of the first differential transistor $NT_{31}$ and the second differential transistor $NT_{32}$, and ground GND. The first load transistor $PT_{31}$ is configured as a diode connection, and is connected in series with the first differential transistor $NT_{31}$.

The second load transistor $PT_{32}$ is connected in series with the second differential transistor $NT_{32}$. Additionally, the gate electrodes of the first load transistor $PT_{31}$ and the second load transistor $PT_{32}$ are connected in common to form a current mirror circuit.

Also, a common connection node $N_{31}$ between the second differential transistor $NT_{32}$ and the second load transistor $PT_{32}$ acts as the output node of the differential amplifier 51, and an output signal OUT is led out from the output node $N_{31}$ through an output terminal $T_{30}$. The source electrodes of the first load transistor $PT_{31}$ and the second load transistor $PT_{32}$ are connected to the node of the power supply voltage $V_{DD}$.

The first capacitance element $C_{31}$ is connected between an input terminal $T_{31}$ of a pixel signal VSL and the gate electrode of the first differential transistor $NT_{31}$, and takes an input capacitance with respect to the pixel signal VSL. The second capacitance element $C_{32}$ is connected between an input terminal $T_{32}$ of a reference signal RAMP and the gate electrode of the first differential transistor $NT_{31}$, and takes an input capacitance with respect to the reference signal RAMP. With this arrangement, the combined signal of the pixel signal VSL and the reference signal RAMP passing through the first capacitance element $C_{31}$ and the second capacitance element $C_{32}$ is treated as the gate input of the first differential transistor $NT_{31}$.

The first switch transistor $NT_{33}$ is connected between the gate electrode and the drain electrode of the first differential transistor $NT_{31}$, and is controlled on and off by a driving signal AZ input through an input terminal $T_{33}$ from the timing control unit 17 illustrated in FIG. 1. The second switch transistor $NT_{34}$ is connected between the gate electrode and the drain electrode of the second differential transistor $NT_{32}$, and is controlled on/off by the driving signal AZ input through an input terminal $T_{33}$ from the timing control unit 17.

The third capacitance element $C_{33}$ is connected between the gate electrode of the second differential transistor $NT_{32}$ and an input terminal $T_{34}$ with a predetermined voltage REF. With this arrangement, the second differential transistor $NT_{32}$ treats the predetermined voltage REF, supplied through the terminal $T_{34}$, such as GND level for example, as the gate input through the third capacitance element $C_{33}$.

The capacitance unit 52 is connected between a common connection node $N_{34}$ of the first differential transistor $PT_{31}$ and the first load transistor $NT_{31}$, and a terminal $T_{35}$ supplied with the predetermined voltage REF. The capacitance unit 52 works to insert a signal of inverse phase to the kickback when the output signal OUT of the comparator 50D inverts into the node of the predetermined voltage REF through the terminal $T_{35}$. Through the action of the capacitance unit 52, fluctuation in the predetermined voltage REF due to kickback can be suppressed, and therefore the occurrence of streaking caused by the kickback can be suppressed.

In the comparator 50D according to Example 5 with the above configuration, the first differential transistor $NT_{31}$, the second differential transistor $NT_{32}$, the first load transistor $PT_{31}$, the second load transistor $PT_{32}$, the first switch transistor $NT_{33}$, and the second switch transistor $NT_{34}$ are of the opposite conductivity type from the case of Example 1.

Additionally, in the case of the comparator 50D according to Example 5, actions and effects similar to the case of the comparator 50A according to Example 1 can also be obtained. That is, the action of the capacitance unit 52 causes a signal of inverse phase to the kickback when the output signal OUT of the comparator 50D inverts to be inserted into the predetermined voltage REF, and therefore the fluctuation in the predetermined voltage REF due to the kickback can be suppressed. Consequently, the occurrence of streaking caused by kickback when the output signal OUT of the comparator 50D inverts can be suppressed.

Second Embodiment

The second embodiment of the present disclosure presupposes a comparator containing a first amplification unit and a second amplification unit connected in cascade, and is configured to reduce the amount of kickback itself and suppress the occurrence of streaking in the comparator. An upstream first amplification unit contains a differential amplifier, while a downstream second amplification unit contains an output amplifier connected in cascade to the differential amplifier. In other words, the comparator according to the second embodiment contains a differential amplifier and an output amplifier connected in cascade. The differential amplifier corresponds to the differential amplifier 51 in the comparator according to the first embodiment.

In the first embodiment, by inserting a signal of inverse phase to the kickback into the predetermined voltage REF in the upstream differential amplifier 51, fluctuation in the predetermined voltage REF due to the kickback is suppressed, and the occurrence of streaking caused by the kickback is suppressed. In contrast, in the second embodiment, by inserting a signal of inverse phase to the kickback into the predetermined voltage REF in the downstream output amplifier, fluctuation in the predetermined voltage REF due to the kickback is suppressed, and the occurrence of streaking caused by the kickback is suppressed.

According to the second embodiment of the present disclosure, like the case of the first embodiment, the power consumption of the analog-to-digital conversion unit 14 can be reduced and lower power consumption of the CMOS image sensor 1 can be attained, while in addition, because the occurrence of streaking caused by kickback can be suppressed, high-quality captured images can be obtained.

In the following, specific examples of the second embodiment for reducing the amount of kickback itself and suppressing the occurrence of streaking will be described.

Example 6

Figure 20:
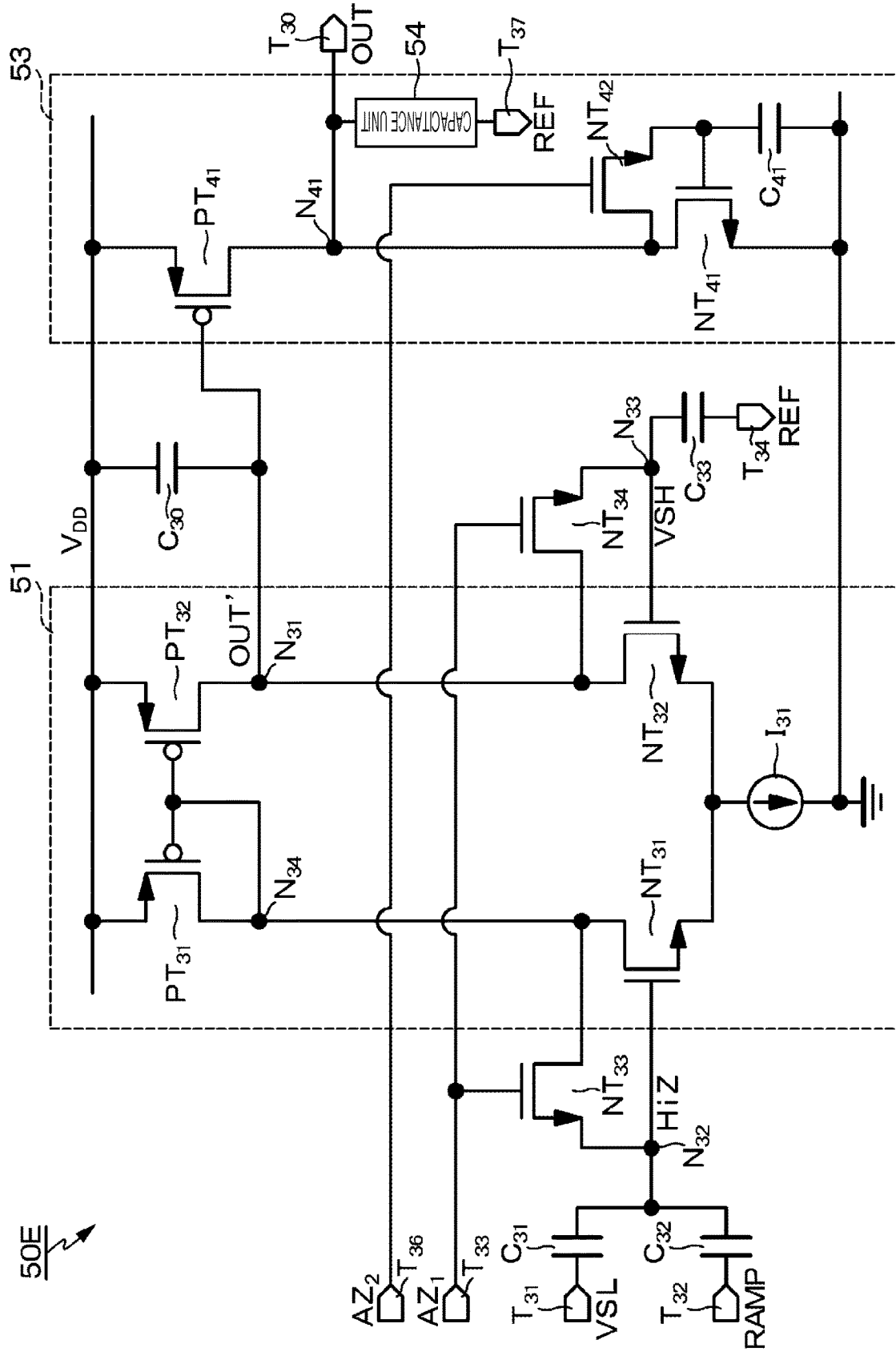
FIG. 20 is a circuit diagram illustrating a circuit configuration of a comparator according to Example 6.

Example 6 is a basic exemplary configuration of the comparator according to the second embodiment of the present disclosure. A circuit configuration of the comparator according to Example 6 is illustrated in FIG. 20.

A comparator 50E according to Example 6 contains an upstream circuit portion that includes the differential amplifier 51 as a first amplification unit, and a downstream circuit portion that includes an output amplifier 53 as a second amplification unit.

The upstream circuit portion includes the differential amplifier 51 containing the first differential transistor $NT_{31}$, the second differential transistor $NT_{32}$, the current source 131, the first load transistor $PT_{31}$, and the second load transistor $PT_{32}$. Besides the differential amplifier 51, the upstream circuit portion also includes the first capacitance element $C_{31}$, the second capacitance element $C_{32}$, the first switch transistor $NT_{33}$, and the second switch transistor $NT_{34}$.

The upstream circuit portion has the same circuit configuration as the circuit portion of the comparator 50D according to Example 5. In other words, the differential amplifier 51 has a circuit configuration with N-channel input, in which the first differential transistor $NT_{31}$ and the second differential transistor $NT_{32}$ are N-channel MOS transistors. However, the upstream circuit portion is different from the circuit configuration of the comparator 50D according to Example 5 in that the capacitance unit 52 is not provided in the differential amplifier 51.

In the upstream circuit portion with the above configuration, the pixel signal VSL input through the input terminal 131 and the reference signal RAMP input through the input terminal 132 pass through the first capacitance element $C_{31}$ and the second capacitance element $C_{32}$ and are combined to become the gate input of the first differential transistor $NT_{31}$. The first switch transistor $NT_{33}$ and the second switch transistor $NT_{34}$ are controlled on/off by a driving signal $AZ_1$ input through the input terminal $T_{33}$.

The downstream circuit portion contains a capacitance element $C_{30}$ and the output amplifier 53 that acts as the second amplification unit. The capacitance element $C_{30}$ is connected between the node of the high-potential-side power supply voltage $V_{DD}$ and the output node (the common connection node between the second differential transistor $NT_{32}$ and the second load transistor $PT_{32}$) $N_{31}$ of the differential amplifier 51. By band-limiting an output signal OUT' of the differential amplifier 51, the capacitance element $C_{30}$ removes noise included in the output signal OUT' (that is, removes a high-frequency component).

The output amplifier 53 has a sample and hold circuit configuration containing a P-channel MOS transistor $PT_{41}$, an N-channel MOS transistor $NT_{41}$, a capacitance element $C_{41}$, and an N-channel switch transistor $NT_{42}$.

In the output amplifier 53, the gate electrode of the P-channel MOS transistor $PT_{41}$ is connected to the output node $N_{31}$ of the differential amplifier 51, while the source electrode is connected to the node of the high-potential-side power supply voltage $V_{DD}$. The drain electrode of the N-channel MOS transistor $NT_{41}$ is connected to the drain electrode of the P-channel MOS transistor $PT_{41}$, while the source electrode is connected to the ground GND that acts as a low-potential-side power supply.

The capacitance element $C_{41}$ is connected between the gate electrode of the N-channel MOS transistor $NT_{41}$ and the ground GND. The switch transistor $NT_{42}$ is connected between the gate electrode and the drain electrode of the N-channel MOS transistor $NT_{41}$, and is controlled on/off by a driving signal $AZ_2$ input through an input terminal $T_{36}$.

In the output amplifier 53 with the above configuration, a common connection node $N_{41}$ of the drain electrode of the P-channel MOS transistor $PT_{41}$ and the drain electrode of the N-channel MOS transistor $NT_{41}$ acts as the output node of the output amplifier 53, and the output signal of the output amplifier 53, or in other words the output signal OUT of the comparator 50E, is led out from the output node $N_{41}$ through an output terminal $T_{30}$.

The output amplifier 53 is provided with a capacitance unit 54 in addition to the above configuration. The capacitance unit 54 is connected between the output node $N_{41}$ of the output amplifier 53 and a terminal $T_{37}$ supplied with the predetermined voltage REF. The capacitance unit 54 works to insert a signal of inverse phase to the kickback when the output signal OUT of the comparator 50E inverts into the node of the predetermined voltage REF through the terminal $T_{37}$. Details about the actions and effects of the capacitance unit 54 connected to the output node $N_{41}$ of the output amplifier 53 will be described later.

(Operation of Comparator According to Example 6)

Figure 21:
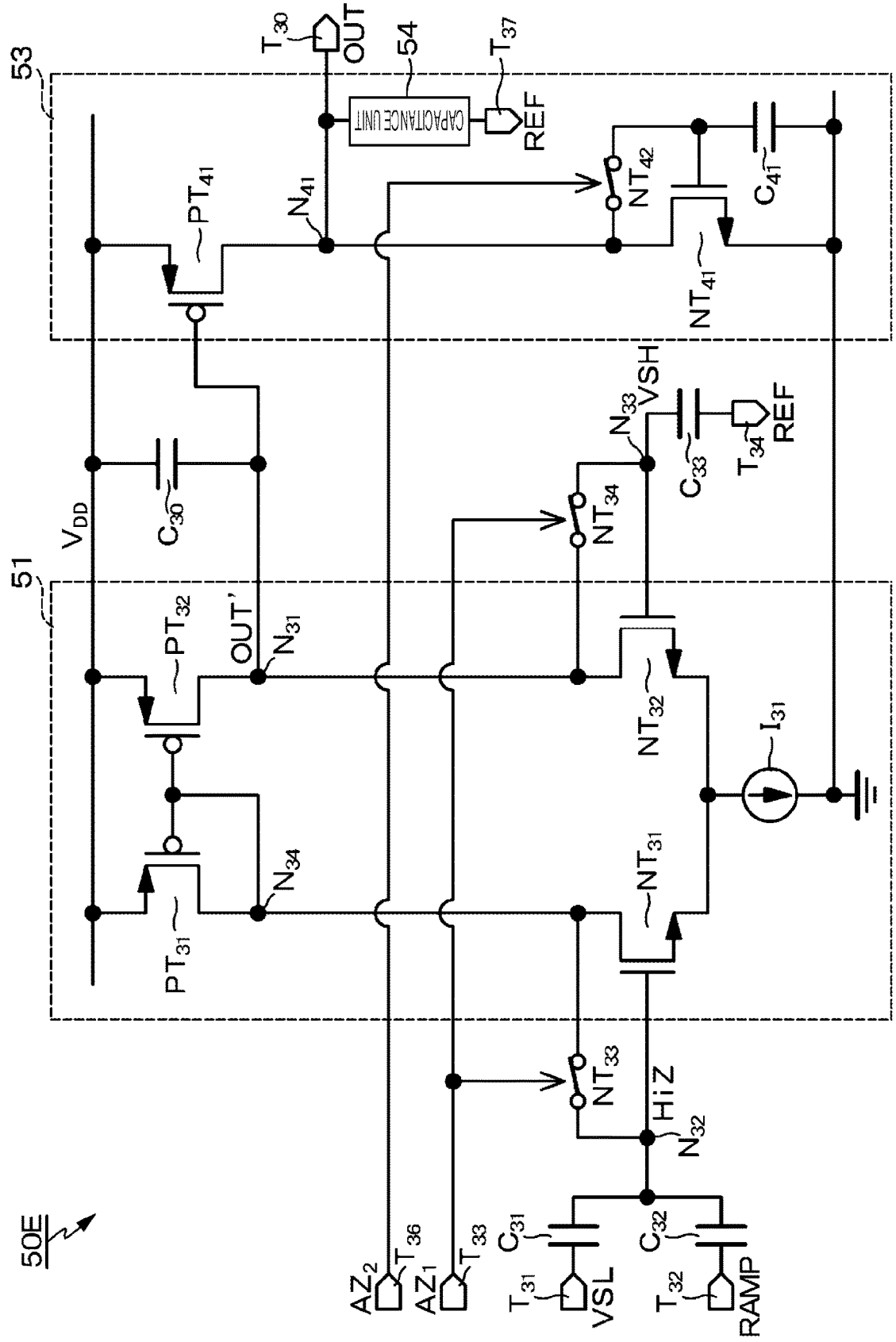
FIG. 21 is a (first) explanatory diagram regarding the operation of a comparator according to Example 6.
Figure 22:
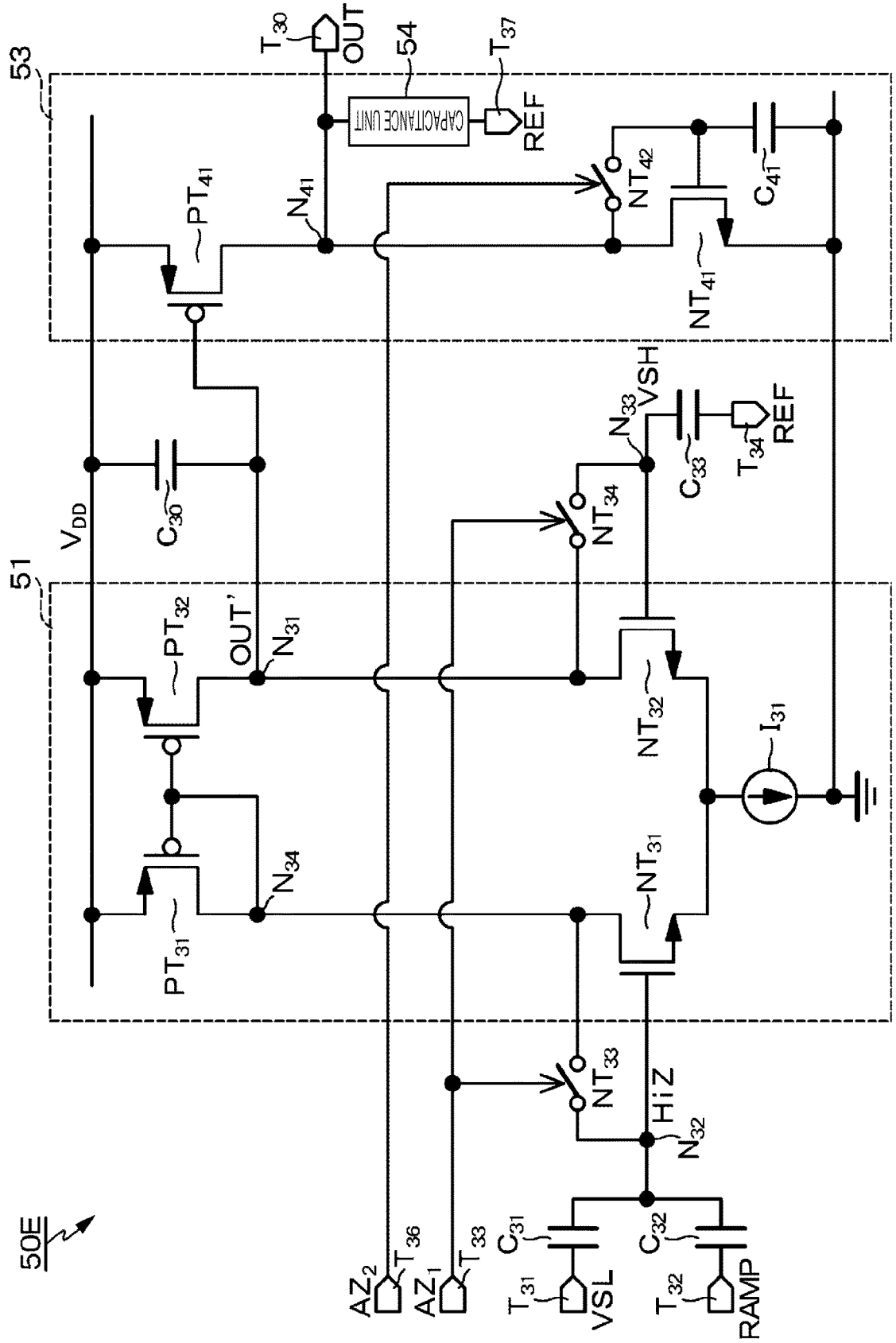
FIG. 22 is a (second) explanatory diagram regarding the operation of a comparator according to Example 6.
Figure 23:
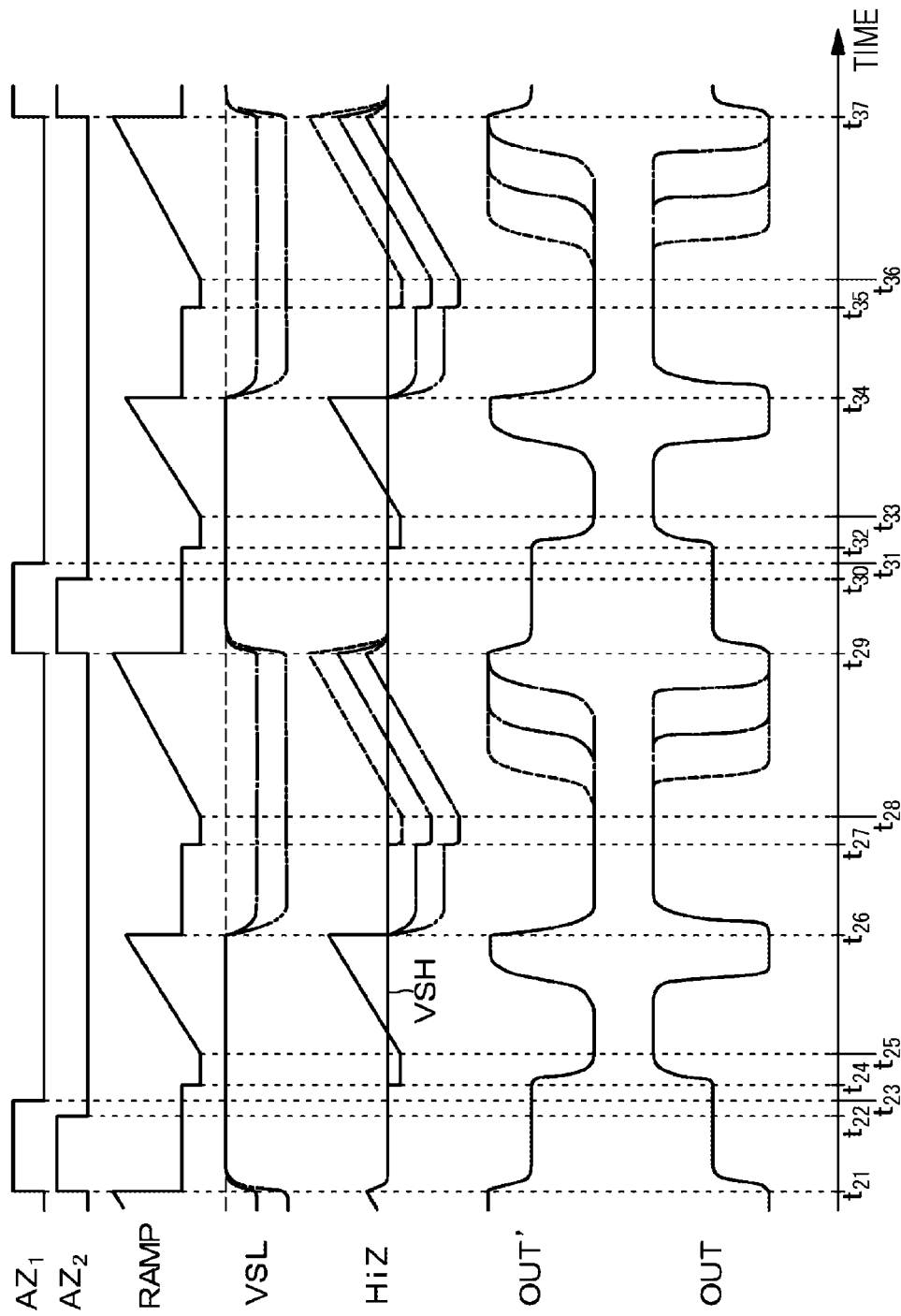
FIG. 23 is a timing chart accompanying an explanation of the operation of the comparator according to Example 6.

Next, the diagrams explaining operation in FIGS. 21 and 22 as well as the timing chart in FIG. 23 will be referenced to describe the operation of the comparator 50E according to Example 6.

In the diagrams explaining operation in FIGS. 21 and 22, switch symbols are used to clearly illustrate the operational state of the first switch transistor $NT_{33}$ and the second switch transistor $NT_{34}$ of the differential amplifier 51 as well as the switch transistor $NT_{42}$ of the output amplifier 53. The timing chart in FIG. 23 illustrates the timing relationships between the driving signal $AZ_1$, the driving signal $AZ_2$, the reference signal RAMP, the pixel signal VSL, the voltage HiZ of the node $N_{32}$, the voltage VSH of the node $N_{33}$, the output signal OUT' of the output amplifier 53, and the output signal OUT of the comparator 50E.

At a time $t_{21}$, the driving signal $AZ_1$ goes from a low level to a high level. Thereafter, because the first switch transistor $NT_{33}$ and the second switch transistor $NT_{34}$ turn on (closed), the drain electrode and the gate electrode of the first differential transistor $NT_{31}$ are connected, and the drain electrode and the gate electrode of the second differential transistor $NT_{32}$ are connected (see FIG. 21). Also, the reference signal RAMP is set to a predetermined reset level. Furthermore, the floating diffusion FD (see FIG. 2) of the pixel 2 to be read out is reset, and the pixel signal VSL is set to the reset level.

According to the above, an auto-zero operation of the differential amplifier 51 is started. That is, the drain electrode and the gate electrode of the first differential transistor $NT_{31}$ as well as the drain electrode and the gate electrode of the second differential transistor $NT_{32}$ converge on the same predetermined voltage (reference voltage). With this auto-zero operation, the voltage HiZ of the node $N_{32}$ and the voltage VSH of the node $N_{33}$ are set to the reference voltage.

Also, at a time $t_{21}$, the driving signal $AZ_2$ goes from a low level to a high level. In response, in the output amplifier 53, the switch transistor $NT_{42}$ goes to the on (closed) state, shorting the connection between the drain electrode and the gate electrode of the N-channel MOS transistor $NT_{41}$ (see FIG. 21). With this arrangement, the auto-zero operation of the output amplifier 53 is started. Additionally, through the auto-zero operation, the voltage of the capacitance element $C_{41}$ becomes equal to the drain voltage of the N-channel MOS transistor $NT_{41}$, and charge is stored in the capacitance element $C_{41}$.

Next, at a time $t_{22}$, the driving signal $AZ_2$ goes from the high level to the low level. In response, in the output amplifier 53, the switch transistor $NT_{42}$ goes to the off (open) state, and the auto-zero operation of the output amplifier 53 ends (see FIG. 22). Note that even after the switch transistor $NT_{42}$ goes to the off state, the voltage of the capacitance element $C_{41}$ is maintained and applied to the gate voltage of the N-channel MOS transistor $NT_{41}$. With this arrangement, the N-channel MOS transistor $NT_{41}$ functions as a current source that provides substantially the same current flow as when the switch transistor $NT_{42}$ is in the on state.

Next, at a time $t_{23}$, the driving signal AZ' goes from the high level to the low level. Consequently, the first switch transistor $NT_{33}$ and the second switch transistor $NT_{34}$ turn off (open), and the auto-zero operation of the differential amplifier 51 ends (see FIG. 22). The pixel signal VSL and the reference signal RAMP do not change, and therefore the voltage HiZ of the node $N_{32}$ is kept at the reference voltage. Also, the voltage VSH of the node $N_{33}$ is kept at the reference voltage by the charge stored in the third capacitance element $C_{33}$.

After that, at a time $t_{24}$, the voltage of the reference signal RAMP is lowered from the reset level by a predetermined value. With this arrangement, the voltage HiZ of the node $N_{32}$ falls and goes below the voltage (reference voltage) VSH of the node $N_{33}$, causing the output signal OUT' of the differential amplifier 51 to go to a low level.

Additionally, when the output signal OUT' of the differential amplifier 51 goes to the low level, the P-channel MOS transistor $PT_{41}$ of the output amplifier 53 does to the on state, and the output signal of the output amplifier 53, that is, the output signal OUT of the comparator 50E, goes to the high level. In other words, the output amplifier 53 inverts, amplifies, and outputs the level of the output signal OUT' of the differential amplifier 51.

Next, at a time $t_{25}$, the reference signal RAMP starts increasing linearly, and correspondingly, the voltage HiZ of the node $N_{32}$ also increases linearly. Also, the counter circuit 142 (see FIG. 3) starts a count operation. After that, when the voltage HiZ of the node $N_{32}$ goes above the voltage (reference voltage) VSH of the node $N_{33}$, the output signal OUT' of the differential amplifier 51 inverts and goes to a high level. Additionally, the count value of the counter circuit 142 when the output signal OUT' inverts to the high level is held in the latch circuit 143 (see FIG. 3) as the value of the pixel signal VSL in the P phase (reset level).

Next, at a time $t_{26}$, the voltage of the reference signal RAMP is set to a reset voltage. Also, by turning on the transfer transistor 22 of the pixel 2, the charge stored in the photodiode 21 during the exposure period is transferred to the floating diffusion FD, and the pixel signal VSL is set to the signal level. With this arrangement, the voltage HiZ of the node $N_{32}$ falls by a value corresponding to the signal level, goes below the voltage (reference voltage) VSH of the node $N_{33}$, and the output signal OUT' of the differential amplifier 51 inverts to the low level.

Next, at a time $t_{27}$, the voltage of the reference signal RAMP is lowered from the reset level by a predetermined value, similarly to the time $t_{24}$. Consequently, the voltage HiZ of the node $N_{32}$ falls further.

Next, at a time $t_{28}$, the reference signal RAMP starts increasing linearly, similarly to the time $t_{25}$. Correspondingly, the voltage HiZ of the node $N_{32}$ also increases linearly. Also, the counter circuit 142 starts the count operation.

After that, when the voltage HiZ of the node $N_{32}$ goes above the voltage (reference voltage) VSH of the node $N_{33}$, the output signal OUT' of the differential amplifier 51 inverts to go to a high level. Additionally, when the output signal OUT' of the differential amplifier 51 goes to the high level, the P-channel MOS transistor $PT_{41}$ of the output amplifier 53 goes to the off state, and the output signal OUT of the comparator 50E goes to the low level.

Additionally, the count value of the counter circuit 142 when the output signal OUT' inverts to the high level is held in the latch circuit 143 as the value of the pixel signal VSL in the D phase (signal level). Also, the latch circuit 143 performs CDS as a noise removal process by taking the difference between the pixel signal VSL in the D phase and the pixel signal VSL in the P phase read out between the time $t_{25}$ and the time $t_{26}$. With this arrangement, analog-to-digital conversion of the analog pixel signal VSL is performed.

After that, at a time $t_{29}$ to a time $t_{37}$, operations similar to those from the time $t_{21}$ to the time $t_{29}$ are repeated.

In the comparator 50E according to Example 6 in which the differential amplifier 51 and the output amplifier 53 are connected in cascade, as the above description of operation demonstrates, the output amplifier 53 inverts, amplifies, and outputs the level of the output signal OUT' of the differential amplifier 51. Consequently, the potential of the node $N_{34}$ and the potential of the node $N_{41}$ have the same polarity. Also, provided that A is the potential of the node $N_{34}$, B is the potential of the node $N_{31}$, and C is the potential of the node $N_{41}$, the relative magnitudes of the amplitude of these potentials A, B, and C exist in the relationship A<B<C.

In this way, the potential A of the node $N_{34}$ has a smaller amplitude than the potential B of the node $N_{31}$. Consequently, in the case of adopting a configuration that connects the capacitance unit 52 to the node $N_{34}$ in the upstream differential amplifier 51 like the case of the comparator 50D according to Example 5 for example (see FIG. 19), canceling the kickback to the predetermined voltage REF when the potential B of the node $N_{31}$ inverts requires a large capacitance value as the capacitance unit 52.

In contrast, in the comparator 50E according to Example 6 adopts a configuration of connecting the capacitance unit 54 in the downstream output amplifier 53 between the node $N_{41}$ of larger amplitude and the same polarity as the potential A of the node $N_{34}$, and the terminal $T_{37}$ supplied with the predetermined voltage REF. With this arrangement, in the upstream differential amplifier 51, fluctuation in the predetermined voltage REF due to kickback can be reduced more reliably compared to the case of adopting the configuration of connecting to the node $N_{34}$, and the occurrence of streaking caused by the kickback can be suppressed. Also, because a small capacitance value is sufficient for the capacitance unit 54, the area needed to form the capacitance unit 54 can be kept small compared to the case of adopting the configuration of connecting to the node $N_{34}$ of the upstream differential amplifier 51.

The capacitance unit 54 can have a variable capacitance value like the capacitance unit 52 according to the first embodiment. Also, the configuration according to specific example 1 to specific example 3 of Examples 2 to 4 can be used as the capacitance unit 54.

Figure 24:
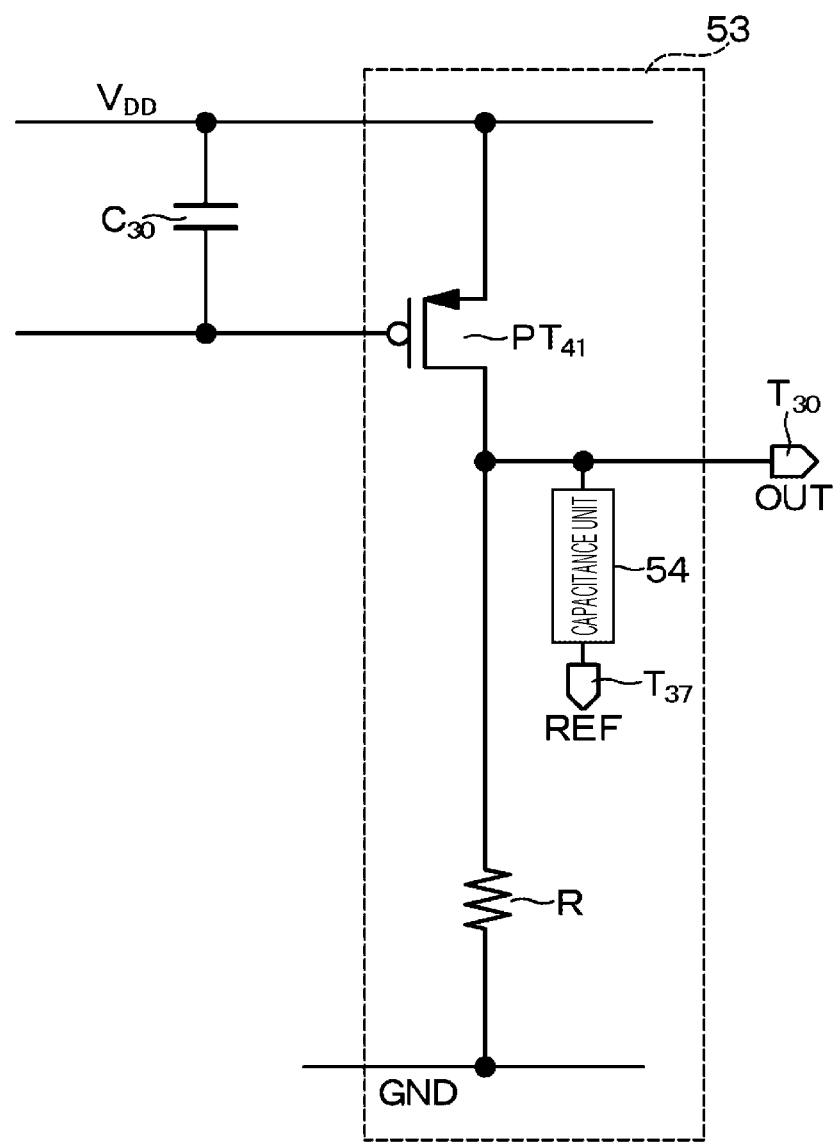
FIG. 24 is a circuit diagram illustrating a (first) other circuit configuration of an output amplifier in the comparator according to Example 6.
Figure 25:
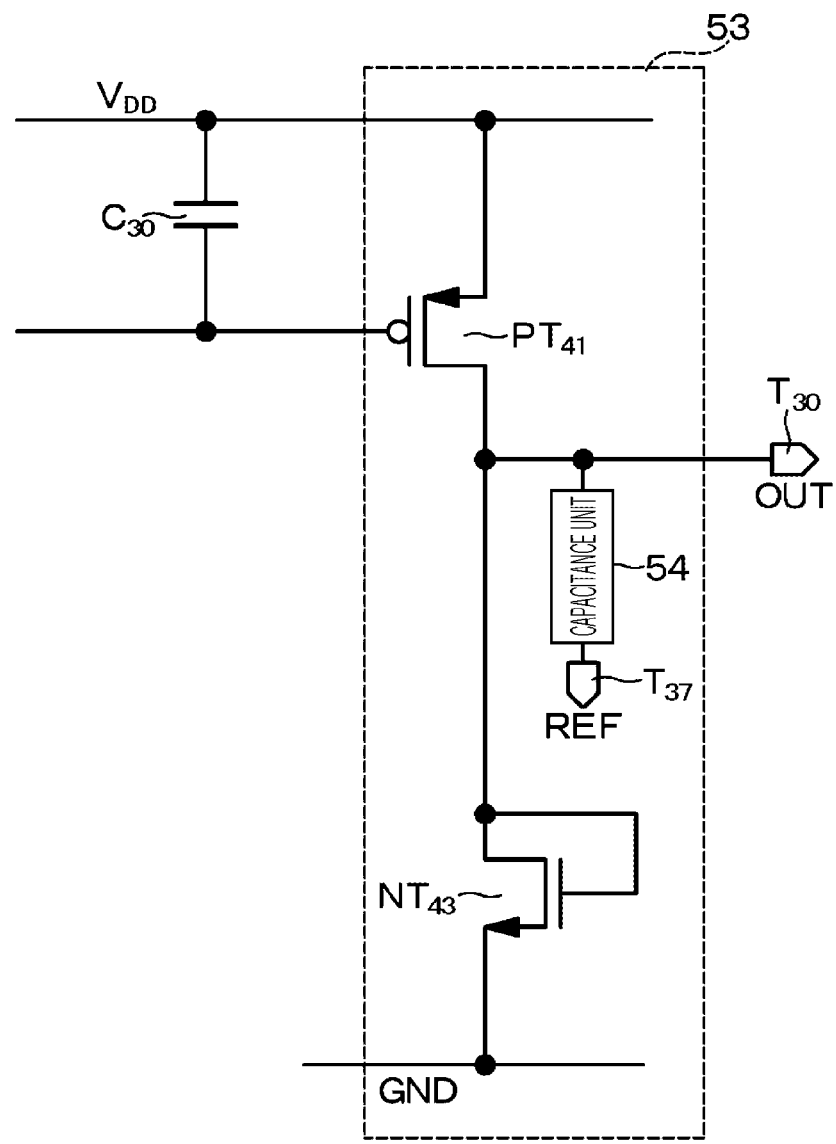
FIG. 25 is a circuit diagram illustrating a (second) other circuit configuration of an output amplifier in the comparator according to Example 6.
Figure 26:
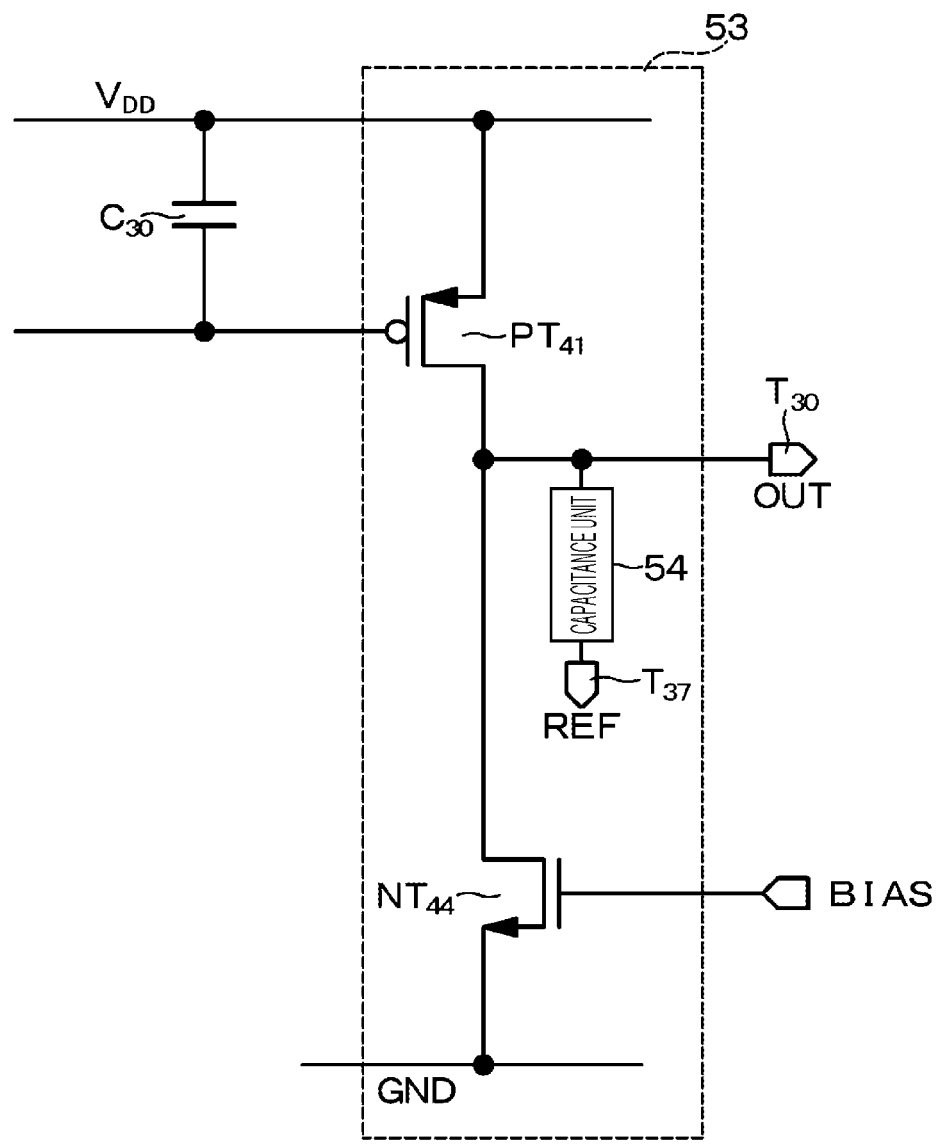
FIG. 26 is a circuit diagram illustrating a (third) other circuit configuration of an output amplifier in the comparator according to Example 6.

In the comparator 50E according to Example 6, the output amplifier 53 is not limited to the circuit configuration illustrated in FIG. 20. For example, as illustrated in FIG. 24, a circuit configuration in which a resistance element R is connected in series with the P-channel MOS transistor $PT_{41}$ is possible. Also, as illustrated in FIG. 25, a circuit configuration in which an N-channel MOS transistor $NT_{43}$ connected in series with the P-channel MOS transistor $PT_{41}$ has a diode connection with the gate electrode connected to the drain electrode is possible. Also, as illustrated in FIG. 26, a circuit configuration that supplies a bias voltage BIAS to an N-channel MOS transistor $NT_{44}$ connected in series with the P-channel MOS transistor $PT_{41}$ is possible.

Example 7

Figure 27:
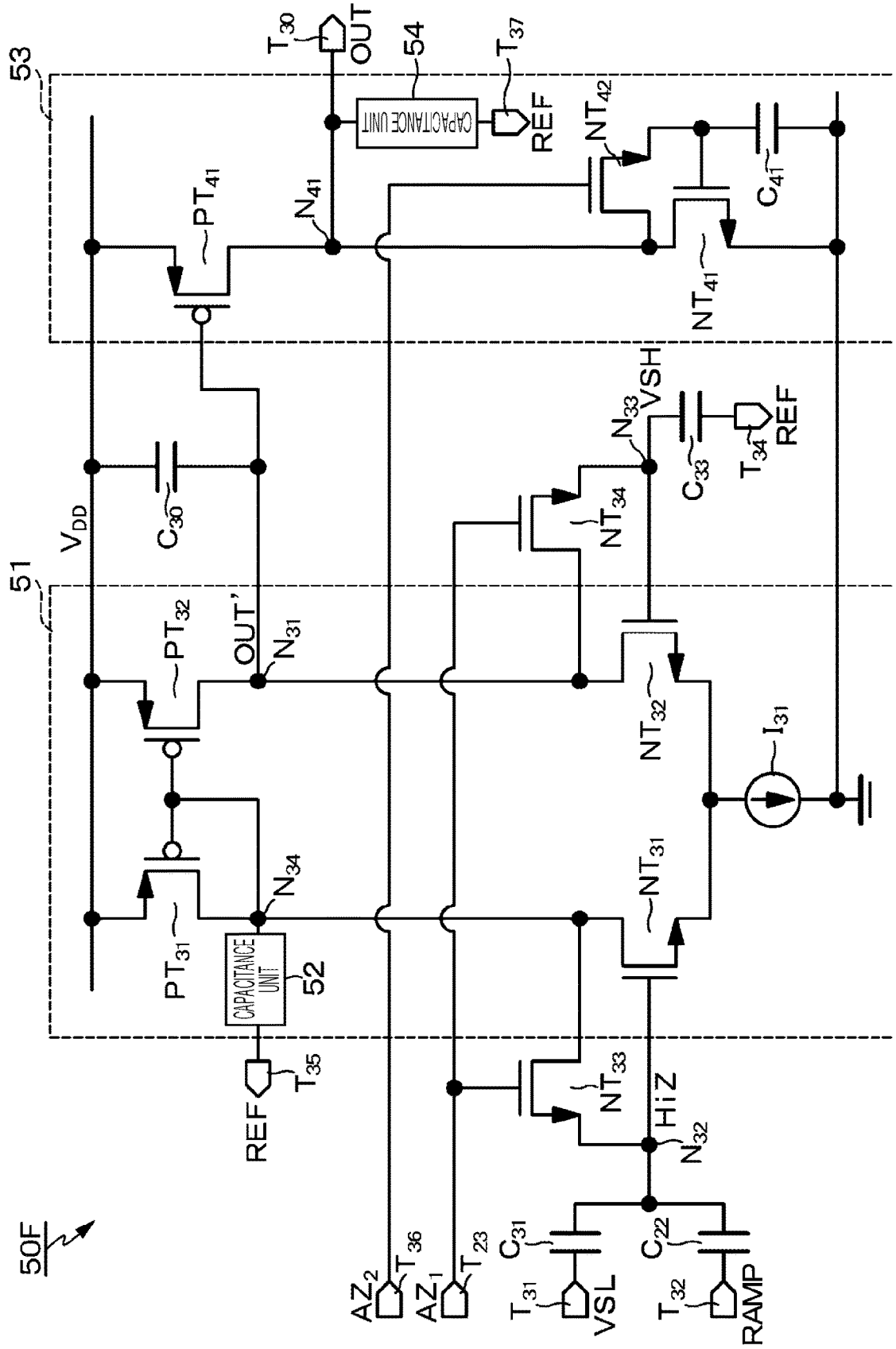
FIG. 27 is a circuit diagram illustrating a circuit configuration of a comparator according to Example 7.

Example 7 is an example of providing a capacitance unit in both a first amplification unit and a second amplification unit in a comparator containing the first amplification unit and the second amplification unit connected in cascade. A circuit configuration of the comparator according to Example 7 is illustrated in FIG. 27.

A comparator 50F according to Example 7 contains, like the comparator 50E according to Example 6, an upstream circuit portion that includes the differential amplifier 51 as a first amplification unit, and a downstream circuit portion that includes an output amplifier 53 as a second amplification unit.

In the differential amplifier 51, the capacitance unit 52 is connected between the common connection node $N_{34}$ of the first differential transistor $PT_{31}$ and the first load transistor $NT_{31}$, and a terminal $T_{35}$ supplied with the predetermined voltage REF. The capacitance unit 52 works to insert a signal of inverse phase to the kickback when the output signal OUT' of the differential amplifier 51 inverts into the node of the predetermined voltage REF through the terminal $T_{35}$.

In the output amplifier 53, the capacitance unit 54 is connected between the output node $N_{41}$ of the output amplifier 53 and the terminal $T_{37}$ supplied with the predetermined voltage REF. The capacitance unit 54 works to insert a signal of inverse phase to the kickback when the output signal OUT of the comparator 50F inverts into the node of the predetermined voltage REF through the terminal $T_{37}$.

As described above, the comparator 50F according to Example 7 is provided with capacitance units (52, 54) in both the differential amplifier 51 and the output amplifier 53, and is configured to insert a signal of inverse phase to the kickback into the predetermined voltage REF in the two stages of the differential amplifier 51 and the output amplifier 53. According to this configuration, through the action of the capacitance unit 52 and the capacitance unit 54, fluctuation in the predetermined voltage REF due to kickback can be suppressed, and therefore the occurrence of streaking caused by the kickback can be suppressed more reliably.

The capacitance unit 54 can have a variable capacitance value like the capacitance unit 52 according to the first embodiment. Also, the configuration according to specific example 1 to specific example 3 of Examples 2 to 4 can be used as the capacitance unit 54. Also, the output amplifier 53 can take the circuit configurations illustrated in FIGS. 24 to 26.

Example 8

Figure 28:
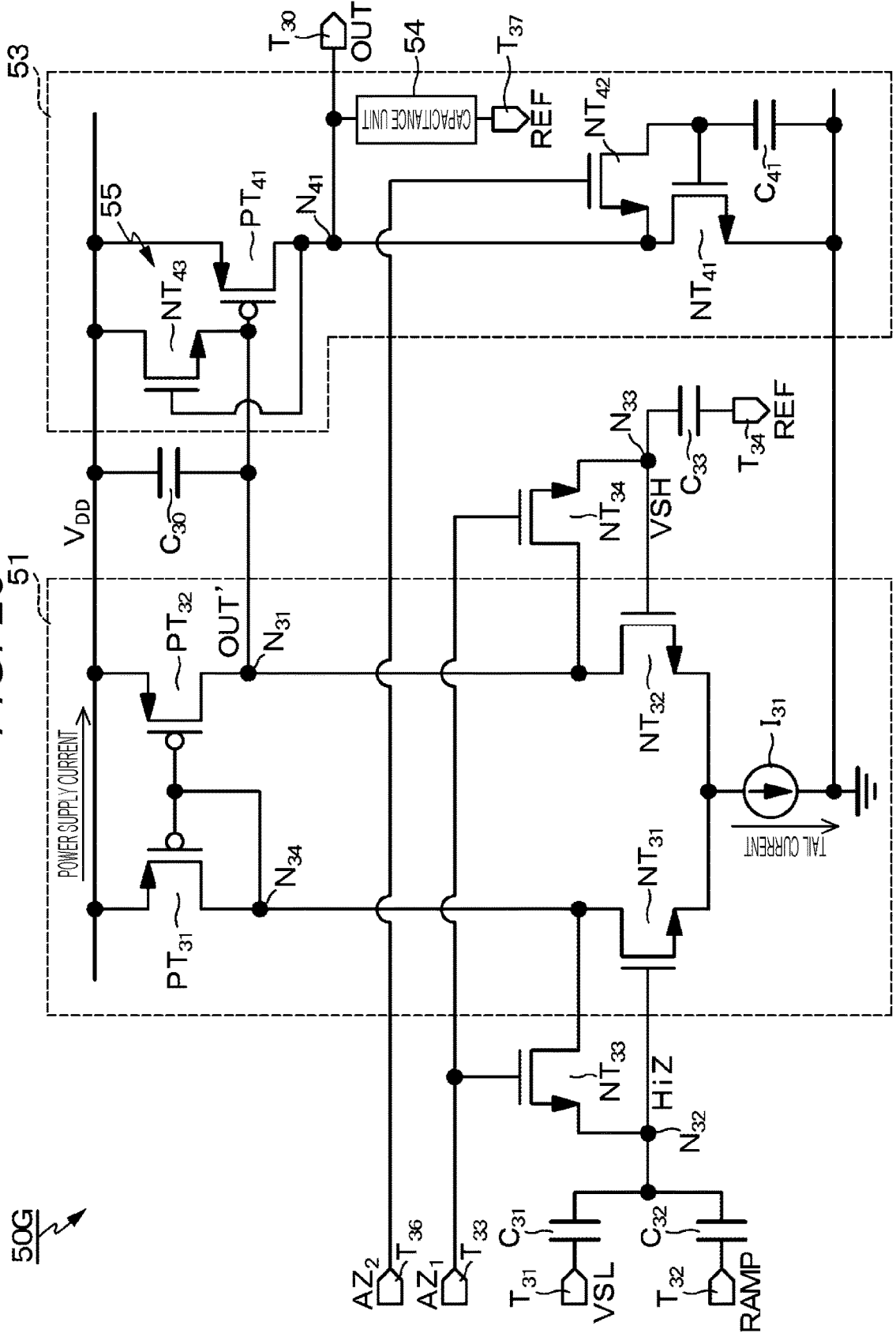
FIG. 28 is a circuit diagram illustrating a circuit configuration of a comparator according to Example 8.

Example 8 is a modification of Example 6, and is an example of providing a clamp circuit. A circuit configuration of the comparator according to Example 8 is illustrated in FIG. 28.

A comparator 50G according to Example 8 is a configuration obtained by providing the output amplifier 53 with a clamp circuit 55 in the comparator 50E according to Example 6. The clamp circuit 55 does not necessarily need to be one component of the output amplifier 53. For example, the clamp circuit 55 contains the N-channel MOS transistor $NT_{43}$ connected between the node of the high-potential-side power supply voltage $V_{DD}$ and the input node of the output amplifier 53, that is, the gate electrode of the P-channel MOS transistor $PT_{41}$.

The gate electrode of the N-channel MOS transistor $NT_{43}$ is connected to the output node $N_{41}$ of the output amplifier 53. Additionally, the N-channel MOS transistor $NT_{43}$ goes to the on state (conducting state) when the output level of the output amplifier 53 is higher than the input level of the output amplifier 53, and clamps the potential of the output node $N_{31}$ of the differential amplifier 51 (that is, the input node of the output amplifier 53) to a predetermined potential, specifically the power supply voltage $V_{DD}$.

Here, the case of the comparator 50G according to Example 8 without the clamp circuit 55 will be described. If the clamp circuit 55 does not exist, if the potential of the output node $N_{31}$ of the differential amplifier 51 is too low after the output of the differential amplifier 51 inverts, current no longer flows to the second differential transistor $NT_{32}$, and therefore the tail current flowing to the current source $I_{31}$ changes. If the tail current changes, the power supply current flowing to the power supply line connected to the comparator 50G changes, and the IR drop changes. Additionally, if the IR drop changes, the operating points of the other comparators connected to the power supply line change, which causes streaking.

As a countermeasure against streaking caused by an IR drop on the power supply line, the comparator 50G according to Example 8 adopts a configuration provided with the clamp circuit 55. In the comparator 50G according to Example 8, the inversion of the output of the comparator 50G occurs when the output signal OUT of the output amplifier 53 is lower than the output signal OUT' of the differential amplifier 51, that is, the input signal of the output amplifier 53. On the other hand, the N-channel MOS transistor $NT_{43}$ of the clamp circuit 55 goes to the on state when the output level of the output amplifier 53 is higher than the input level of the output amplifier 53, and clamps the potential of the output node $N_{31}$ of the differential amplifier 51 to the power supply voltage $V_{DD}$.

Through the action of the clamp circuit 55, after the inversion of the output of the comparator 50G, that is, after the inversion of the output of the differential amplifier 51, the potential of the output node $N_{31}$ of the differential amplifier 51 is clamped to the power supply voltage $V_{DD}$, and therefore the tail current flowing to the current source $I_{31}$ does not change. As a result, the occurrence of streaking caused by an IR drop on the power supply line can be suppressed.

Incidentally, the clamp circuit 55 begins operating when the output level of the output amplifier 53 is sufficiently higher than the input level of the output amplifier 53. Consequently, providing the clamp circuit 55 does not adversely affect the properties related to the inversion of the comparator 50G. Also, the current needed for the clamp circuit 55 to operate is supplied by the current source $I_{31}$. Consequently, the current that the differential amplifier 51 draws from the power supply is a substantially fixed current value as before, and fluctuations in the power supply current are not induced.

Figure 29A:
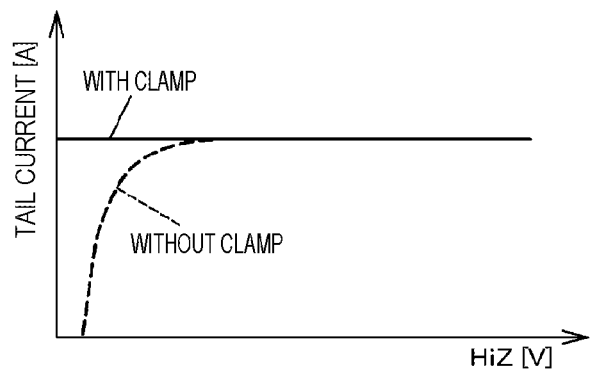
FIG. 29A is a waveform diagram illustrating change in a tail current with respect to a voltage HiZ of a node $N_{32}$ in the comparator according to Example 8.
Figure 29B:
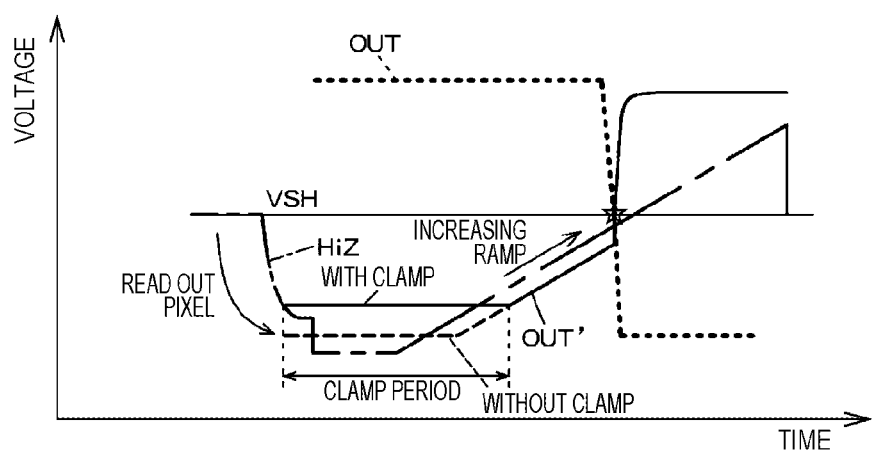
FIG. 29B is a waveform diagram illustrating an operation waveform during inversion of the output of the comparator.
Figure 29C:
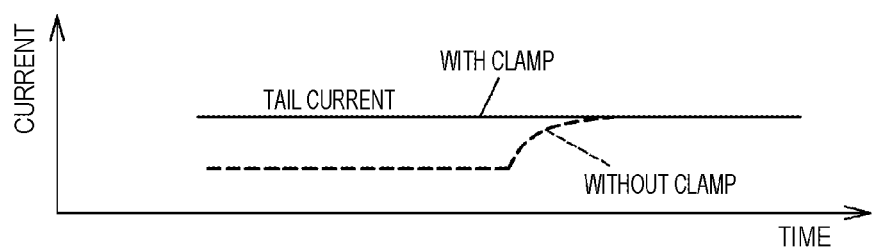
FIG. 29C is a waveform diagram illustrating change in the tail current with respect to time.

The change in the tail current with respect to the voltage HiZ of the node $N_{32}$ is illustrated in FIG. 29A. Also, an operation waveform when the output of the comparator 50G inverts is illustrated in FIG. 29B, and the change in the tail current with respect to time is illustrated in FIG. 29C. In FIGS. 29A, 29B, and 29C, the case with the clamp circuit 55 is illustrated by solid lines, while the case without the clamp circuit 55 is illustrated by dashed lines. Also, in FIG. 29B, the voltage HiZ of the node $N_{32}$ is illustrated by a chain line, the output signal OUT' of the differential amplifier 51 is illustrated by a solid/dashed line, and the output signal OUT of the comparator 50G is illustrated by a dashed line.

The comparator 50G according to Example 8 provided with the clamp circuit 55 described above may also adopt a configuration provided with capacitance units (52, 54) in both the differential amplifier 51 and the output amplifier 53, like the comparator 50 according to Example 7.

Example 9

Figure 30:
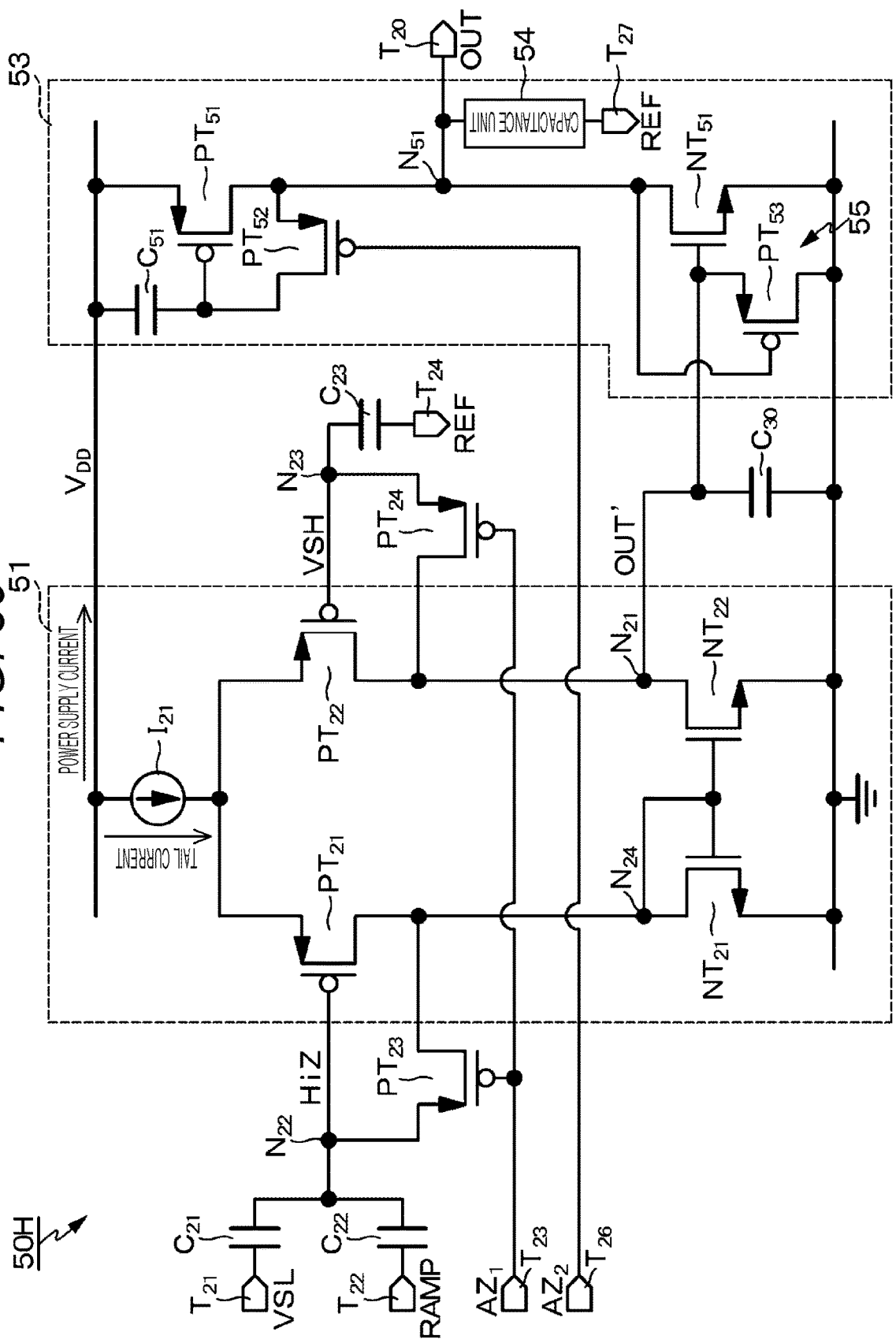
FIG. 30 is a circuit diagram illustrating a circuit configuration of a comparator according to Example 9.

Example 9 is a modification of Example 8, and is an example of using transistors of the opposite conductivity type from Example 9. In other words, whereas the differential amplifier 51 takes N-channel input in Example 8, the differential amplifier 51 takes P-channel input in Example 9. A circuit configuration of the comparator according to Example 9 is illustrated in FIG. 30.

In a comparator 50H according to Example 9, the upstream circuit portion includes the differential amplifier 51 containing the first differential transistor $PT_{21}$, the second differential transistor $PT_{22}$, the current source $I_{21}$, the first load transistor $NT_{21}$, and the second load transistor $NT_{22}$. Besides the differential amplifier 51, the upstream circuit portion also includes the first capacitance element $C_{21}$, the second capacitance element $C_{22}$, the third capacitance element $C_{23}$, the first switch transistor $PT_{23}$, and the second switch transistor $PT_{24}$.

The upstream circuit portion has the same circuit configuration as the circuit portion of the comparator 50A according to Example 1. In other words, the differential amplifier 51 has a circuit configuration with P-channel input, in which the first differential transistor $PT_{21}$ and the second differential transistor $PT_{22}$ are P-channel MOS transistors. However, the upstream circuit portion is different from the circuit configuration of the comparator 50A according to Example 1 in that the capacitance unit 52 is not provided in the differential amplifier 51.

In the upstream circuit portion with the above configuration, the pixel signal VSL input through the input terminal $T_{21}$ and the reference signal RAMP input through the input terminal $T_{22}$ pass through the first capacitance element $C_{21}$ and the second capacitance element $C_{22}$ and are combined to become the gate input of the first differential transistor $PT_{21}$. The first switch transistor $PT_{23}$ and the second switch transistor $PT_{24}$ are controlled on/off by a driving signal AZ' input through the input terminal $T_{23}$.

The downstream circuit portion contains a capacitance element $C_{30}$ and the output amplifier 53. The capacitance element $C_{30}$ is connected between the output node (the common connection node between the second differential transistor $NT_{22}$ and the second load transistor $NT_{22}$) $N_{21}$ of the differential amplifier 51 and the ground. By band-limiting an output signal OUT' of the differential amplifier 51, the capacitance element $C_{30}$ removes noise included in the output signal OUT'.

The output amplifier 53 has a sample and hold circuit configuration containing an N-channel MOS transistor $NT_{51}$, a P-channel MOS transistor $PT_{51}$, a capacitance element $C_{51}$, and a P-channel switch transistor $PT_{52}$.

In the output amplifier 53, the gate electrode of the N-channel MOS transistor $NT_{51}$ is connected to the output node $N_{21}$ of the differential amplifier 51, while the source electrode is connected to the low-potential-side power supply, namely ground. The drain electrode of the P-channel MOS transistor $PT_{51}$ is connected to the N-channel MOS transistor $NT_{51}$, while the source electrode is connected to the node of the high-potential-side power supply voltage $V_{DD}$.

The capacitance element $C_{41}$ is connected between the node of the high-potential-side power supply voltage $V_{DD}$ and the gate electrode of the P-channel MOS transistor $PT_{51}$.

The switch transistor $PT_{52}$ is connected between the gate electrode and the drain electrode of the P-channel MOS transistor PT's', and is controlled on/off by a driving signal $AZ_2$ input through an input terminal $T_{26}$.

In the output amplifier 53 with the above configuration, a common connection node $N_{51}$ of the N-channel MOS transistor $NT_{51}$ and the P-channel MOS transistor $PT_{51}$ acts as the output node of the output amplifier 53, and the output signal of the output amplifier 53, or in other words the output signal OUT of the comparator 50H, is led out from the output node $N_{51}$ through an output terminal $T_{20}$.

The output amplifier 53 is provided with a capacitance unit 54 in addition to the above configuration. The capacitance unit 54 is connected between the output node $N_{51}$ of the output amplifier 53 and a terminal $T_{27}$ supplied with the predetermined voltage REF. The capacitance unit 54 works to insert a signal of inverse phase to the kickback when the output signal OUT of the comparator 50H inverts into the node of the predetermined voltage REF through the terminal $T_{27}$.

The comparator 50H according to Example 9 with the above configuration has a configuration obtained by providing the output amplifier 53 with a clamp circuit 55. The clamp circuit 55 does not necessarily need to be one component of the output amplifier 53. For example, the clamp circuit 55 contains the P-channel MOS transistor $PT_{53}$ connected between the input node of the output amplifier 53, that is, the gate electrode of the N-channel MOS transistor $NT_{51}$ and the ground.

The gate electrode of the P-channel MOS transistor $PT_{53}$ is connected to the output node $N_{51}$ of the output amplifier 53. Additionally, the P-channel MOS transistor $PT_{53}$ goes to the on state when the output level of the output amplifier 53 is lower than the input level of the output amplifier 53, and clamps the potential of the output node $N_{21}$ of the differential amplifier 51 (that is, the input node of the output amplifier 53) to a predetermined potential, specifically the ground potential.

Here, the case of the comparator 50H according to Example 9 without the clamp circuit 55 will be described. If the clamp circuit 55 does not exist, if the potential of the output node $N_{21}$ of the differential amplifier 51 is too high after the output of the differential amplifier 51 inverts, current no longer flows to the second differential transistor $PT_{22}$, and therefore the tail current flowing to the current source $I_{21}$ changes. If the tail current changes, the power supply current flowing to the power supply line connected to the comparator 50H changes, and the IR drop changes. Additionally, if the IR drop changes, the operating points of the other comparators connected to the power supply line change, which causes streaking.

As a countermeasure against streaking caused by an IR drop on the power supply line, the comparator 50H according to Example 9 adopts a configuration provided with the clamp circuit 55. In the comparator 50H according to Example 9, the inversion of the output of the comparator 50H occurs when the output signal OUT of the output amplifier 53 is higher than the output signal OUT' of the differential amplifier 51, that is, the input signal of the output amplifier 53. On the other hand, the P-channel MOS transistor $PT_{53}$ of the clamp circuit 55 goes to the on state when the output level of the output amplifier 53 is lower than the input level of the output amplifier 53, and clamps the potential of the output node $N_{21}$ of the differential amplifier 51 to the ground potential.

Through the action of the clamp circuit 55, after the inversion of the output of the comparator 50H, that is, after the inversion of the output of the differential amplifier 51, the potential of the output node $N_{21}$ of the differential amplifier 51 is clamped to the ground potential, and therefore the tail current flowing to the current source $I_{31}$ does not change. As a result, the occurrence of streaking caused by an IR drop on the power supply line can be suppressed.

Incidentally, the clamp circuit 55 begins operating when the output level of the output amplifier 53 is sufficiently lower than the input level of the output amplifier 53. Consequently, providing the clamp circuit 55 does not adversely affect the properties related to the inversion of the comparator 50H. Also, the current needed for the clamp circuit 55 to operate is supplied by the current source $I_{31}$. Consequently, the current that the differential amplifier 51 draws from the power supply is a substantially fixed current value as before, and fluctuations in the power supply current are not induced.

Figure 31A:
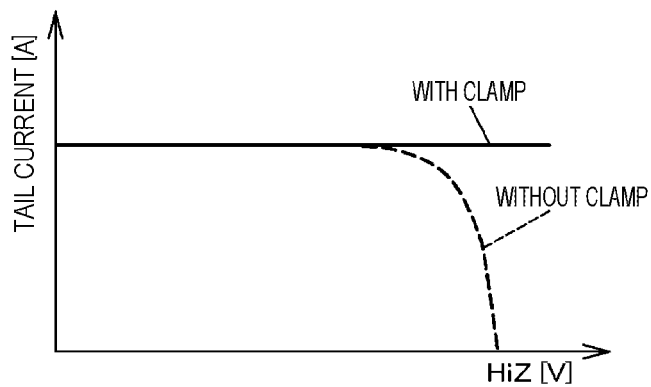
FIG. 31A is a waveform diagram illustrating change in a tail current with respect to a voltage HiZ of a node $N_{22}$ in the comparator according to Example 9.
Figure 31B:
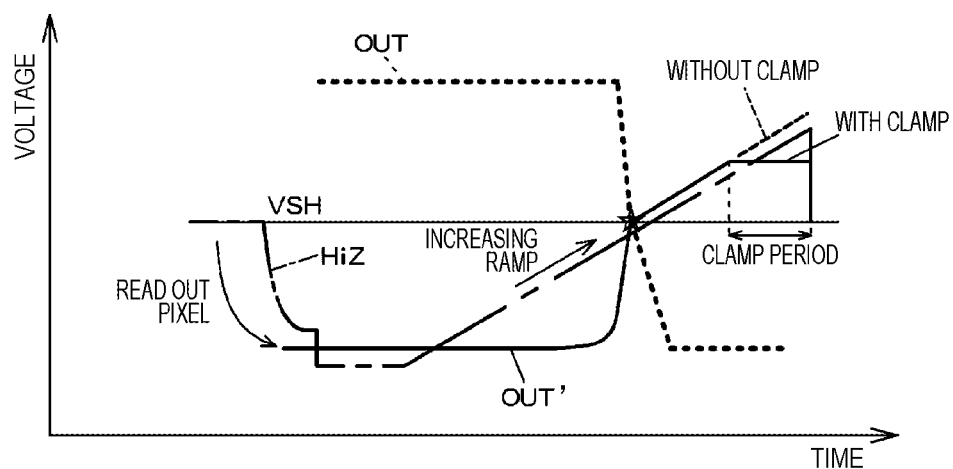
FIG. 31B is a waveform diagram illustrating an operation waveform during inversion of the output of the comparator.
Figure 31C:
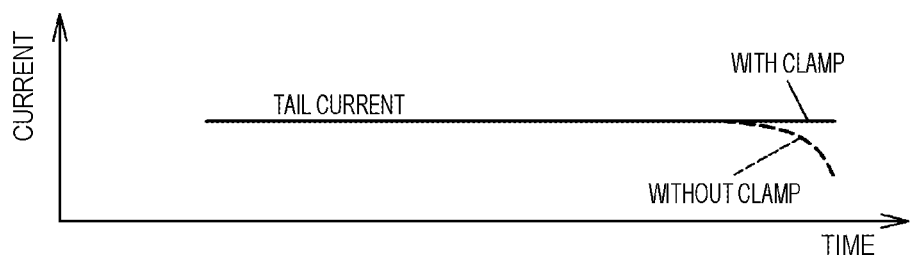
FIG. 31C is a waveform diagram illustrating change in the tail current with respect to time.

The change in the tail current with respect to the voltage HiZ of the node $N_{22}$ is illustrated in FIG. 31A. Also, an operation waveform when the output of the comparator 50H inverts is illustrated in FIG. 31B, and the change in the tail current with respect to time is illustrated in FIG. 31C. In FIGS. 31A, 31B, and 31C, the case with the clamp circuit 55 is illustrated by solid lines, while the case without the clamp circuit 55 is illustrated by dashed lines. Also, in FIG. 31B, the voltage HiZ of the node $N_{22}$ is illustrated by a chain line, the output signal OUT' of the differential amplifier 51 is illustrated by a solid/dashed line, and the output signal OUT of the comparator 50H is illustrated by a dashed line.

The comparator 50H according to Example 9 provided with the clamp circuit 55 described above may also adopt a configuration provided with capacitance units (52, 54) in both the differential amplifier 51 and the output amplifier 53, like the comparator 50 according to Example 7.

Modification Example

Although the above-described first and second embodiments describe the case where the technology of the present disclosure is applied to the CMOS image sensor in which pixels 2 are arranged in a matrix as an example, it is not limited to application to the CMOS image sensor. In other words, the technology of the present disclosure is applicable to all types of image sensors using the X-Y address method in which pixels 2 are two-dimensionally arranged in a matrix.

Further, the technology of the present disclosure is not limited to application to an image sensor that detects the distribution of the amount of incident light of visible light and captures it as an image. The technology according to the present disclosure is applicable to all types of image sensor that captures the distribution of incident amounts of infrared rays, X-rays, particles, or the like as an image.

Application Example

Figure 32:
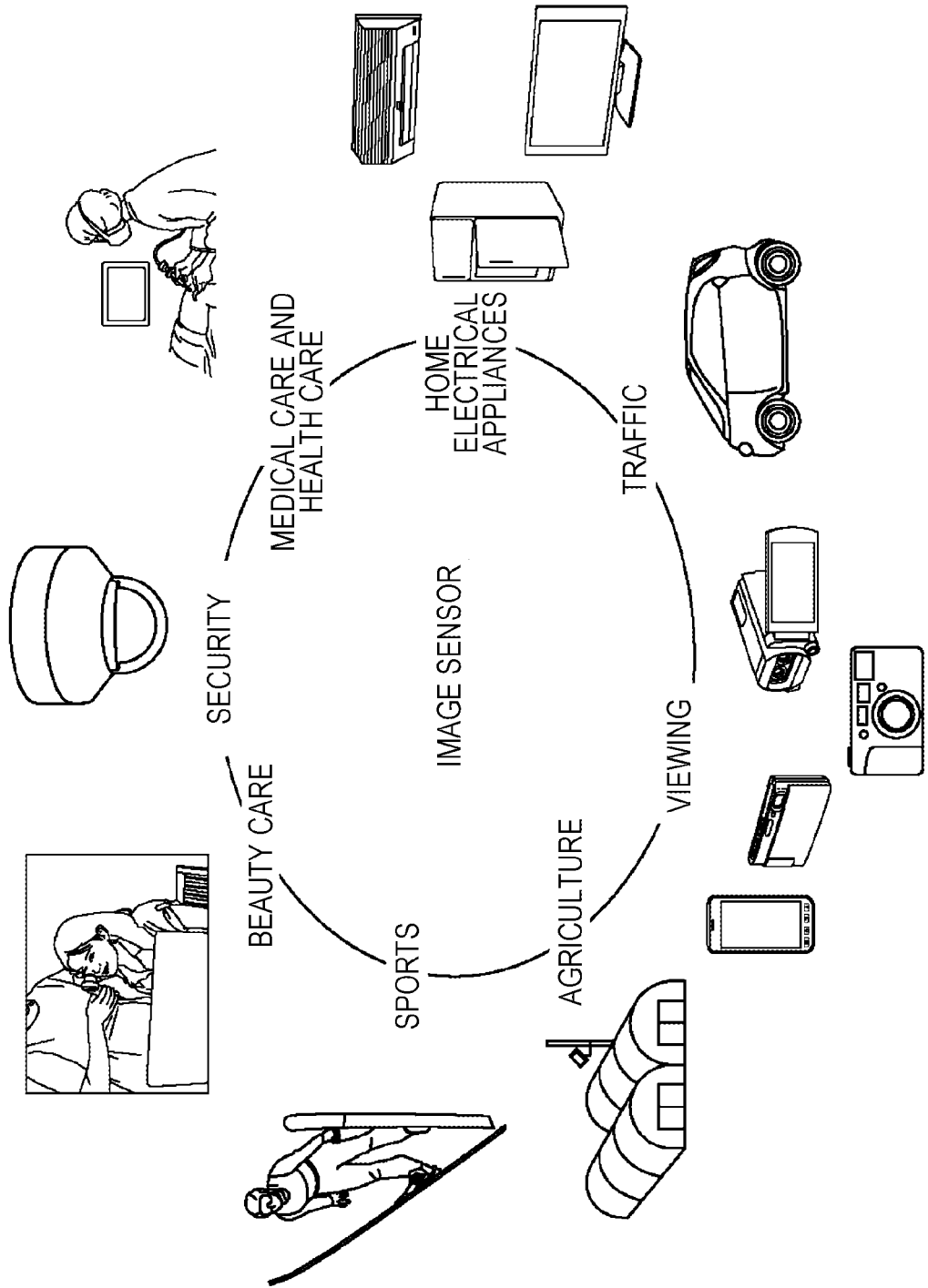
FIG. 32 is a diagram illustrating an applied example of technology according to the present disclosure.

The CMOS image sensor 1 according to the present embodiment described above is capable of being used for various devices for sensing light such as visible light, infrared light, ultraviolet light, and X-ray as illustrated, in one example, in FIG. 32. Specific examples of various devices are listed below.

Devices used to capture images for appreciation, such as digital cameras and portable equipment provided with camera function Devices used in traffic, such as in-vehicle sensors that captures images of the front, rear, surroundings, interior, or the like of vehicles for safe driving including automatic stop and the like, recognition of the driver's condition, and the like, monitoring cameras for monitoring traveling vehicles and roads, ranging sensors that measure distance between vehicles, and the like Devices used in home electrical appliances, such as television sets, refrigerators, and air conditioners, for capturing images of user's gestures and performing device operations in accordance with the gestures Devices used in medical and healthcare, such as endoscopes and instruments that perform angiography by receiving infrared light Devices used in security, such as security surveillance cameras and personal authentication cameras Devices used in beauty, such as skin measuring instruments for capturing images of skin and microscopes for capturing images of scalp Devices used in sports, such as action cameras and wearable cameras for sports application and the like Devices used in agriculture, such as cameras for monitoring condition of farms or crops <Applied Example of Technology According to Present Disclosure>

The technology according to the present disclosure is applicable to various products. The description of more specific applied examples is now given.

[Electronic Device of Present Disclosure]

The description is now given of a case where the present disclosure is applied to an electronic device including an imaging device such as digital still cameras or video cameras, a portable terminal device provided with an imaging function such as mobile phones, a copying machine using an image sensor for an image readout unit, or the like.

(Imaging Device)

Figure 33:
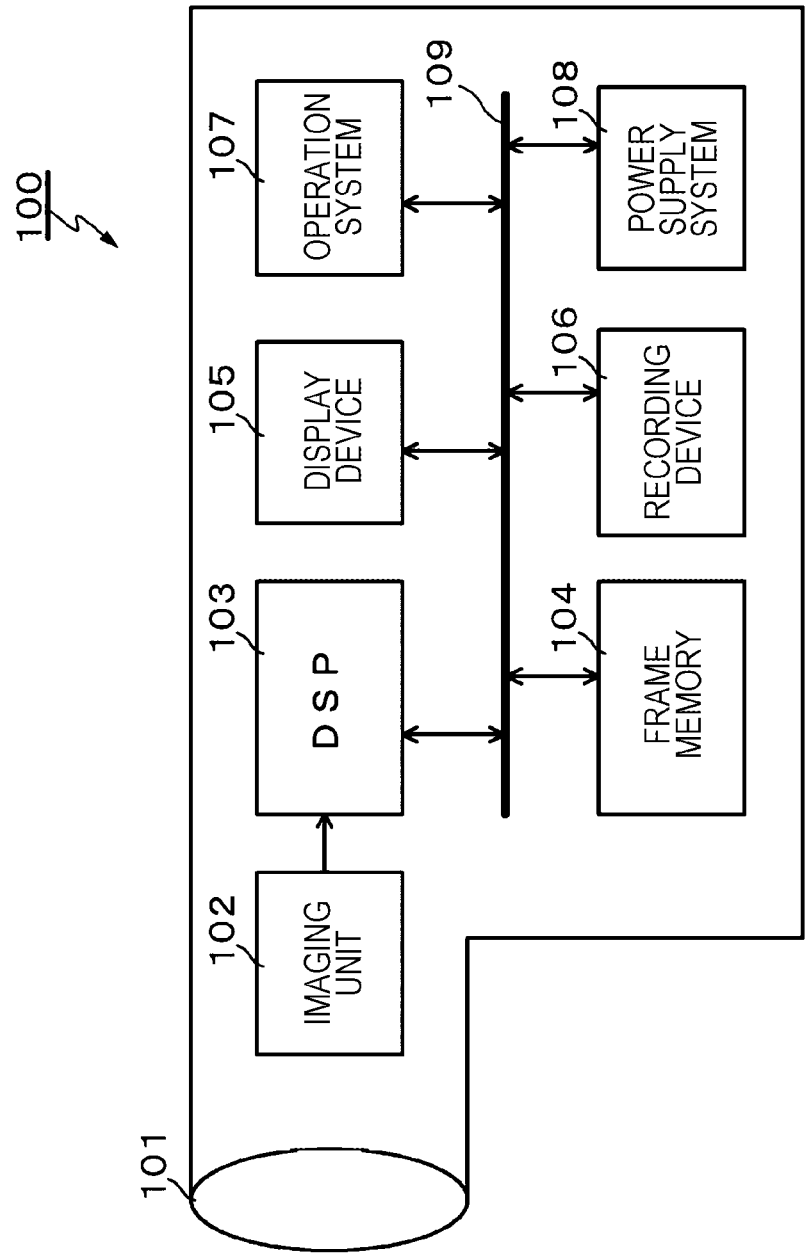
FIG. 33 is a block diagram illustrating configuration of an imaging device that is one example of the electronic device of the present disclosure.

FIG. 33 is a block diagram illustrating configuration of an imaging device that is an example of the electronic device of the present disclosure. As illustrated in FIG. 33, an imaging device 100 according to this example has an imaging optical system 101 including a lens group or the like, an imaging unit 102, a digital signal processor (DSP) circuit 103, a frame memory 104, a display device 105, a recording device 106, an operation system 107, a power supply system 108, or the like. In addition, the DSP circuit 103, the frame memory 104, the display device 105, the recording device 106, the operation system 107, and the power supply system 108 are connected to each other via a bus line 109.

The imaging optical system 101 captures incident light (image light) from a subject and forms an image on the imaging surface of the imaging unit 102. The imaging unit 102 converts the light amount of incident light formed on the imaging surface by the optical system 101 into an electrical signal for each pixel and outputs the electrical signal as a pixel signal. The DSP circuit 103 performs typical camera signal processing, such as white balance processing, demosaic processing, and gamma correction processing, for example.

The frame memory 104 is used for storing data as appropriate in the process of signal processing in the DSP circuit 103. The display device 105 includes a panel-equipped display device such as a liquid crystal display device or an organic electroluminescence (EL) display device, and displays a moving image or a still image captured by the imaging unit 102. The recording device 106 records the moving image or still image captured by the imaging unit 102 on a recording medium such as a portable semiconductor memory, an optical disk, or a hard disk drive (HDD).

The operation system 107 issues operation commands for various functions of the imaging device 100 according to this example in response to the operation of the user. The power supply system 108 appropriately supplies various power supplies acting as operation power supplies for the DSP circuit 103, the frame memory 104, the display device 105, the recording device 106, and the operation system 107 to these power supply targets.

In the imaging device 100 with the above configuration, the CMOS image sensor 1 to which the technology according to the present disclosure described above is applied can be used as the imaging unit 102. According to the CMOS image sensor 1, power consumption can be lowered by lowering the power supply voltage, while in addition, the occurrence of streaking caused by kickback when the comparator inverts can be suppressed. Consequently, it is possible to contribute to lower power consumption of the imaging device 100 and also obtain high-quality taken images with low noise.

[Application Example to Moving Object]

The technology according to the present disclosure can be applied to various products. For example, the technology according to the present disclosure is implemented as an image sensor mounted on any type of moving objects such as automobiles, electric vehicles, hybrid electric vehicles, motorcycles, bicycles, personal mobilities, airplanes, drones, ships, robots, construction machines, and agricultural machines (tractors).

Figure 34:
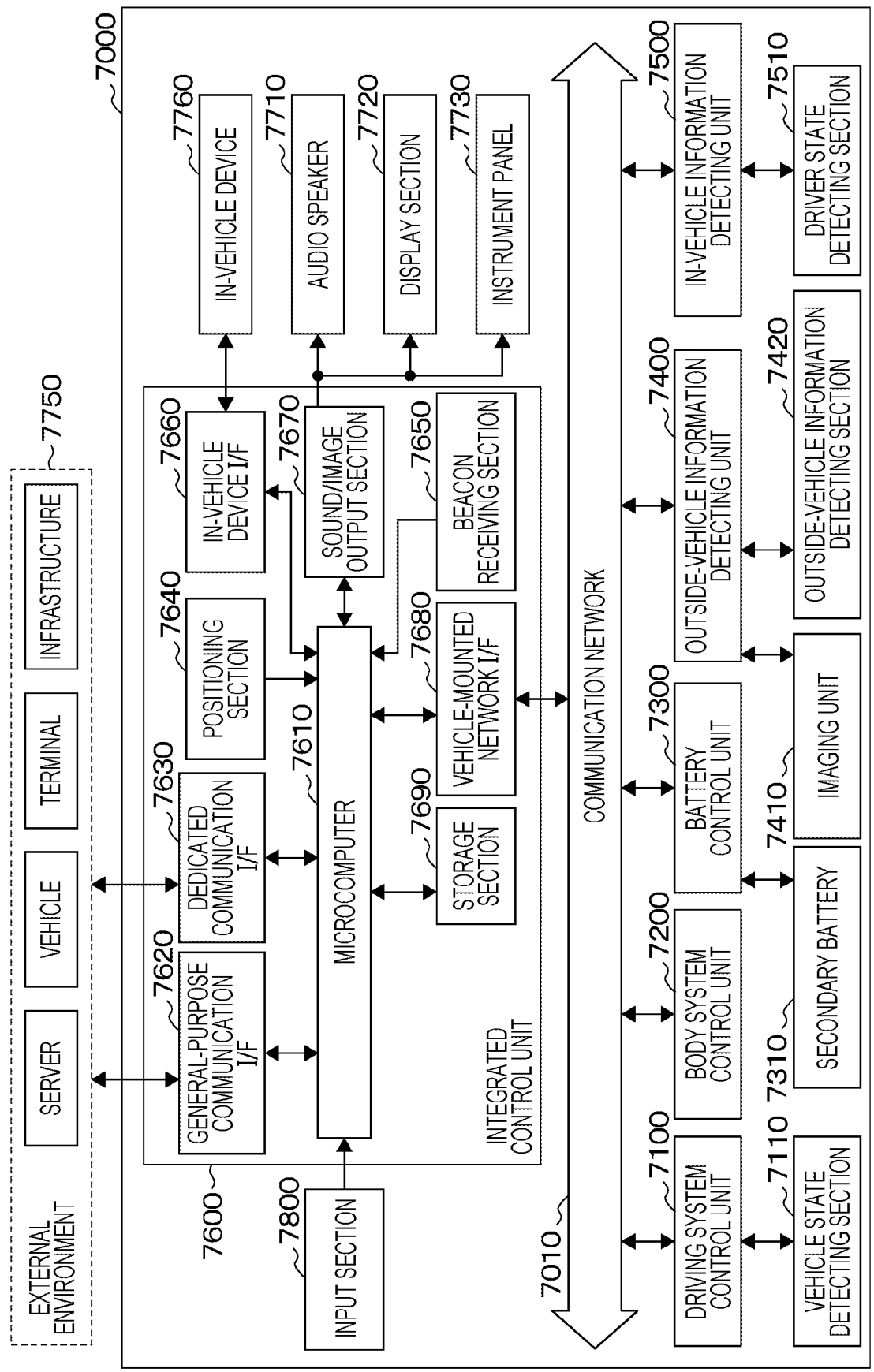
FIG. 34 is a block diagram illustrating schematic configuration example of a vehicle control system that is one example of a moving object control system to which the technology according to the present disclosure is applicable.

FIG. 34 is a block diagram depicting an example of schematic configuration of a vehicle control system 7000 as an example of a moving object control system to which the technology according to the present disclosure can be applied. The vehicle control system 7000 includes a plurality of electronic control units connected to each other via a communication network 7010. In the example depicted in FIG. 34, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or wireless communication. A functional configuration of the integrated control unit 7600 illustrated in FIG. 34 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, or sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a back lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging unit 7410 or an outside-vehicle information detecting section 7420. The imaging unit 7410 includes at least one of a time-of-flight (ToF) camera, a stereo camera, a monocular camera, an infrared camera, or other cameras. The outside-vehicle information detecting section 7420, for example, includes at least one of an environmental sensor for detecting current atmospheric conditions or weather conditions or a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, or a snow sensor detecting a snowfall. The peripheral information detecting sensor may be at least one of an ultrasonic sensor, a radar device, or a LIDAR device (light detection and ranging device, or Laser imaging detection and ranging device). Each of the imaging unit 7410 and the outside-vehicle information detecting section 7420 may be provided as an independent sensor or device, or may be provided as a device in which a plurality of sensors or devices is integrated.

Figure 35:
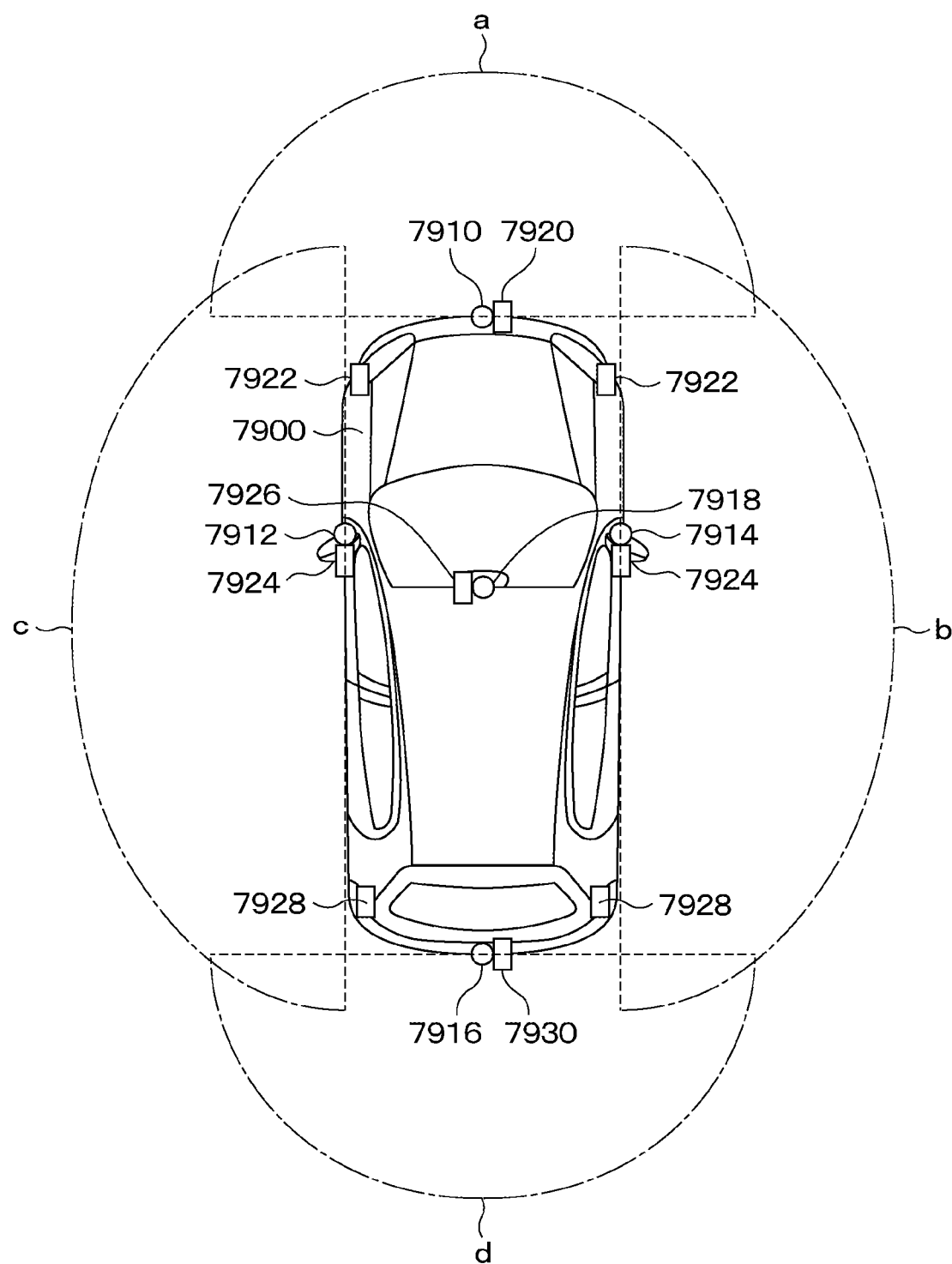
FIG. 35 is a diagram illustrating an example of an installation position of an imaging unit.

Here, FIG. 35 depicts an example of installation positions of the imaging unit 7410 and the outside-vehicle information detecting section 7420. Imaging units 7910, 7912, 7914, 7916, and 7918 are, for example, disposed at least one of positions on a front nose, sideview mirrors, a rear bumper, or a back door and an upper portion of a windshield within the interior of the vehicle of the vehicle 7900. The imaging unit 7910 provided to the front nose and the imaging unit 7918 provided to the upper portion of the windshield within the interior of the vehicle obtain mainly an image of the front of the vehicle 7900. The imaging units 7912 and 7914 provided to the sideview mirrors obtain mainly an image of the sides of the vehicle 7900. The imaging unit 7916 provided to the rear bumper or the back door obtains mainly an image of the rear of the vehicle 7900. The imaging unit 7918 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of image-capturing ranges of the respective imaging units 7910, 7912, 7914, and 7916. An image-capturing range a represents the image-capturing range of the imaging unit 7910 provided to the front nose. Image-capturing ranges b and c respectively represent the image-capturing ranges of the imaging units 7912 and 7914 provided to the sideview mirrors. An image-capturing range d represents the image-capturing range of the imaging unit 7916 provided to the rear bumper or the back door. A bird's-eye image of the vehicle 7900 as viewed from above can be obtained by superimposing image data imaged by the imaging units 7910, 7912, 7914, and 7916, for example.

Outside-vehicle information detecting sections 7920, 7922, 7924, 7926, 7928, and 7930 provided to the front, rear, sides, corners, and the upper portion of the windshield within the interior of the vehicle of the vehicle 7900 may be, for example, an ultrasonic sensor or a radar device. The outside-vehicle information detecting sections 7920, 7926, and 7930 provided to the front nose, the rear bumper, the back door, and the upper portion of the windshield within the interior of the vehicle of the vehicle 7900 may be a LIDAR device, for example. These outside-vehicle information detecting sections 7920 to 7930 are used mainly to detect a preceding vehicle, a pedestrian, an obstacle, or the like.

Returning to FIG. 34, the description will be continued. The outside-vehicle information detecting unit 7400 makes the imaging unit 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging units 7410 to generate a bird's-eye image or a panoramic image. The outside-vehicle information detecting unit 7400 may perform viewpoint conversion processing using the image data imaged by the different imaging units 7410.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which mediates communication with various apparatuses present in an external environment 7750. The general-purpose communication I/F 7620 may implement a cellular communication protocol such as global system of mobile communications (GSM (registered trademark)), worldwide interoperability for microwave access (WiMAX), long term evolution (LTE)), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handy phone system (PHS), or a smart phone that has a positioning function.

The beacon receiving section 7650, for example, receives a radio wave or an electromagnetic wave transmitted from a wireless station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (USB) (WUSB). In addition, the in-vehicle device I/F 7660 may establish wired connection by universal serial bus (USB), high-definition multimedia interface (HDMI (registered trademark), mobile high-definition link (MHL), or the like via a connection terminal (and a cable if necessary) not depicted in the figures. The in-vehicle devices 7760 may, for example, include at least one of a mobile device or a wearable device possessed by an occupant or an information device carried into or attached to the vehicle. Further, the in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, or the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, or the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound or an image to an output device capable of visually or auditorily notifying an occupant of the vehicle or the outside of the vehicle of information. In the example of FIG. 34, an audio speaker 7710, a display section 7720, and an instrument panel 7730 are illustrated as the output device. The display section 7720 may, for example, include at least one of an on-board display or a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 34 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

In the above, an example of the vehicle control system to which the technology related to the present technology can be applied is described. The technology according to the present disclosure is applicable to, in one example, the imaging units 7910, 7912, 7914, 7916, and 7918 and the outside-vehicle information detecting sections 7920, 7922, 7924, 7926, 7928, and 7930 among the components described above. Furthermore, by applying the technology according to the present disclosure, high-quality taken images with low noise can be obtained through the suppression of streaking caused by kickback when the comparator used in the image sensor inverts, thereby making it possible to construct a vehicle control system capable of detecting an imaging target with high accuracy, for example.

<Configuration Achievable by Employing Present Disclosure>

Note that the present disclosure may include the following configuration.

<<A. Image Sensor According to the First Aspect>>

[A-1] An image sensor including:

a pixel array section in which a plurality of pixels including photoelectric conversion units is disposed; and a comparator that compares an analog pixel signal output from the pixels to a predetermined reference signal, and outputs a comparison result according to a signal level of the pixel signal, in which the comparator includes differential pair transistors, a first load transistor connected in series with a first transistor of the differential pair, and a second load transistor connected in series with a second transistor of the differential pair, the first transistor of the differential pair accepts a signal obtained by combining the pixel signal and the predetermined reference signal as a gate input, the second transistor of the differential pair accepts a predetermined voltage as a gate input, and a capacitance unit is connected between a common connection node of the first transistor of the differential pair and the first load transistor, and a node of the predetermined voltage.

[A-2] The image sensor according to [A-1], in which the pixel signal and the predetermined reference signal are accepted as the gate input of the first transistor of the differential pair through respective capacitance elements.

[A-3] The image sensor according to [A-1] or [A-2], in which the predetermined voltage is a voltage of any value.

[A-4] The image sensor according to any one of [A-1] to [A-3], in which a capacitance value of the capacitance unit is variable.

[A-5] The image sensor according to [A-4], in which the capacitance unit contains a variable capacitance element having a variable capacitance value.

[A-6] The image sensor according to [A-4], in which the capacitance unit contains a plurality of capacitance elements and a toggle switch that selects at least one of the plurality of capacitance elements on the basis of a control signal.

[A-7] The image sensor according to [A-6], in which the plurality of capacitance elements are capacitance elements having the same capacitance values as each other.

[A-8] The image sensor according to [A-6], in which the plurality of capacitance elements are capacitance elements having different capacitance values from each other.

[A-9] The image sensor according to any one of [A-6] to [A-8], in which the capacitance unit includes an isolation circuit that electrically isolates a control line that supplies the control signal from the toggle switch.

[A-10] The image sensor according to [A-9], in which the isolation circuit is an inverter circuit or a buffer circuit.

[A-11] The image sensor according to any one of [A-1] to [A-10], in which the first load transistor is configured as a diode connection.

[A-12] The image sensor according to [A-11], in which the first load transistor and the second load transistor form a current mirror circuit.

[A-13] The image sensor according to [A-11] or [A-12], in which a common connection node of the second transistor of the differential pair and the second load transistor is an output node.

[A-14] The image sensor according to any one of [A-1] to [A-13], in which the comparator is provided in correspondence with a pixel column of the pixel array section, and is used in an analog-to-digital converter that converts the analog pixel signal output from the pixels into a digital signal.

[A-15] The image sensor according to [A-14], in which the analog-to-digital converter is provided with respect to each pixel column or with respect to a plurality of pixel columns of the pixel array section.

<<B. Electronic Device According to the First Aspect>>

[B-1] An electronic device including an image sensor, the image sensor including:

a pixel array section in which a plurality of pixels including photoelectric conversion units is disposed; and a comparator that compares an analog pixel signal output from the pixels to a predetermined reference signal, and outputs a comparison result according to a signal level of the pixel signal, in which the comparator includes differential pair transistors, a first load transistor connected in series with a first transistor of the differential pair, and a second load transistor connected in series with a second transistor of the differential pair, the first transistor of the differential pair accepts a signal obtained by combining the pixel signal and the predetermined reference signal as a gate input, the second transistor of the differential pair accepts a predetermined voltage as a gate input, and a capacitance unit is connected between a common connection node of the first transistor of the differential pair and the first load transistor, and a node of the predetermined voltage.

[B-2] The electronic device according to [B-1], in which the pixel signal and the predetermined reference signal are accepted as the gate input of the first transistor of the differential pair through respective capacitance elements.

[B-3] The electronic device according to [B-1] or [B-2], in which the predetermined voltage is a voltage of any value.

[B-4] The electronic device according to any one of [B-1] to [B-3], in which a capacitance value of the capacitance unit is variable.

[B-5] The electronic device according to [B-4], in which the capacitance unit contains a variable capacitance element having a variable capacitance value.

[B-6] The electronic device according to [B-4], in which the capacitance unit contains a plurality of capacitance elements and a toggle switch that selects at least one of the plurality of capacitance elements on the basis of a control signal.

[B-7] The electronic device according to [B-6], in which the plurality of capacitance elements are capacitance elements having the same capacitance values as each other.

[B-8] The electronic device according to [B-6], in which the plurality of capacitance elements are capacitance elements having different capacitance values from each other.

[B-9] The electronic device according to any one of [B-6] to [B-8], in which the capacitance unit includes an isolation circuit that electrically isolates a control line that supplies the control signal from the toggle switch.

[B-10] The electronic device according to [B-9], in which the isolation circuit is an inverter circuit or a buffer circuit.

[B-11] The electronic device according to any one of [B-1] to [B-10], in which the first load transistor is configured as a diode connection.

[B-12] The electronic device according to [B-11], in which
the first load transistor and the second load transistor form a current mirror circuit.

[B-13] The electronic device according to [B-11] or [B-12], in which
a common connection node of the second transistor of the differential pair and the second load transistor is an output node.

[B-14] The electronic device according to any one of [B-1] to [B-13], in which
the comparator is provided in correspondence with a pixel column of the pixel array section, and is used in an analog-to-digital converter that converts the analog pixel signal output from the pixels into a digital signal.

[B-15] The electronic device according to [B-14], in which
the analog-to-digital converter is provided with respect to each pixel column or with respect to a plurality of pixel columns of the pixel array section.

<<2. Image Sensor According to the Second Aspect>>

[C-1] An image sensor including:
a pixel array section in which a plurality of pixels including photoelectric conversion units is disposed; and
a comparator that compares an analog pixel signal output from the pixels to a predetermined reference signal, and outputs a comparison result according to a signal level of the pixel signal, in which
the comparator includes a first amplification unit and a second amplification unit connected in cascade,
the first amplification unit includes
differential pair transistors,
a first load transistor connected in series with a first transistor of the differential pair, and
a second load transistor connected in series with a second transistor of the differential pair,
the first transistor of the differential pair accepts a signal obtained by combining the pixel signal and the predetermined reference signal as a gate input,
the second transistor of the differential pair accepts a predetermined voltage as a gate input, and
the second amplification unit includes
a first capacitance unit connected between an output node and a node of the predetermined voltage.

[C-2] The image sensor according to [C-1], in which
the first amplification unit includes a second capacitance unit connected between a common connection node of the first transistor of the differential pair and the first load transistor, and the node of the predetermined voltage.

[C-3] The image sensor according to [C-1] or [C-2], further including:
a clamp circuit that clamps a potential of the output node of the first amplification unit to a predetermined potential when an output of the second amplification unit inverts.

[C-4] The image sensor according to any one of [C-1] to [C-3], in which
the pixel signal and the predetermined reference signal are accepted as the gate input of the first transistor of the differential pair through respective capacitance elements.

[C-5] The image sensor according to any one of [C-1] to [C-4], in which
the predetermined voltage is a voltage of any value.

[C-6] The image sensor according to any one of [C-2] to [C-5], in which
capacitance values of the first capacitance unit and the second capacitance unit are variable.

[C-7] The image sensor according to [C-6], in which
the first capacitance unit and the second capacitance unit contain a variable capacitance element having a variable capacitance value.

[C-8] The image sensor according to [C-6], in which
the first capacitance unit and the second capacitance unit contain a plurality of capacitance elements and a toggle switch that selects at least one of the plurality of capacitance elements on the basis of a control signal.

[C-9] The image sensor according to [C-8], in which
the plurality of capacitance elements are capacitance elements having the same capacitance values as each other.

[C-10] The image sensor according to [C-8], in which
the plurality of capacitance elements are capacitance elements having different capacitance values from each other.

[C-11] The image sensor according to any one of [C-8] to [C-10], in which
the first capacitance unit and the second capacitance unit include an isolation circuit that electrically isolates a control line that supplies the control signal from the toggle switch.

[C-12] The image sensor according to [C-11], in which
the isolation circuit is an inverter circuit or a buffer circuit.

[C-13] The image sensor according to any one of [C-1] to [C-12], in which
the first load transistor is configured as a diode connection.

[C-14] The image sensor according to [C-13], in which
the first load transistor and the second load transistor form a current mirror circuit.

[C-15] The image sensor according to [C-11] or [C-14], in which
a common connection node of the second transistor of the differential pair and the second load transistor is an output node.

[C-16] The image sensor according to any one of [C-1] to [C-15], in which
the comparator is provided in correspondence with a pixel column of the pixel array section, and is used in an analog-to-digital converter that converts the analog pixel signal output from the pixels into a digital signal.

[C-17] The image sensor according to [C-16], in which
the analog-to-digital converter is provided with respect to each pixel column or with respect to a plurality of pixel columns of the pixel array section.

<<D. Electronic Device According to the Second Aspect>>

[D-1] An electronic device including an image sensor, the image sensor including:
a pixel array section in which a plurality of pixels including photoelectric conversion units is disposed; and a comparator that compares an analog pixel signal output from the pixels to a predetermined reference signal, and outputs a comparison result according to a signal level of the pixel signal, in which
the comparator includes a first amplification unit and a second amplification unit connected in cascade,
the first amplification unit includes
differential pair transistors,
a first load transistor connected in series with a first transistor of the differential pair, and
a second load transistor connected in series with a second transistor of the differential pair,
the first transistor of the differential pair accepts a signal obtained by combining the pixel signal and the predetermined reference signal as a gate input,
the second transistor of the differential pair accepts a predetermined voltage as a gate input, and
the second amplification unit includes
a capacitance unit connected between an output node and a node of the predetermined voltage.

[D-2] The electronic device according to [D-1], in which the first amplification unit includes a second capacitance unit connected between a common connection node of the first transistor of the differential pair and the first load transistor, and the node of the predetermined voltage.

[D-3] The electronic device according to [D-1] or [D-2], further including:
a clamp circuit that clamps a potential of the output node of the first amplification unit to a predetermined potential when an output of the second amplification unit inverts.

[D-4] The electronic device according to any one of [D-1] to [D-3], in which
the pixel signal and the predetermined reference signal are accepted as the gate input of the first transistor of the differential pair through respective capacitance elements.

[D-5] The electronic device according to any one of [D-1] to [D-4], in which
the predetermined voltage is a voltage of any value.

[D-6] The electronic device according to any one of [D-2] to [D-5], in which
capacitance values of the first capacitance unit and the second capacitance unit are variable.

[D-7] The electronic device according to [D-6], in which
the first capacitance unit and the second capacitance unit contain a variable capacitance element having a variable capacitance value.

[D-8] The electronic device according to [D-6], in which
the first capacitance unit and the second capacitance unit contain a plurality of capacitance elements and a toggle switch that selects at least one of the plurality of capacitance elements on the basis of a control signal.

[D-9] The electronic device according to [D-8], in which
the plurality of capacitance elements are capacitance elements having the same capacitance values as each other.

[D-10] The electronic device according to [D-8], in which
the plurality of capacitance elements are capacitance elements having different capacitance values from each other.

[D-11] The electronic device according to any one of [D-8] to [D-10], in which
the first capacitance unit and the second capacitance unit include an isolation circuit that electrically isolates a control line that supplies the control signal from the toggle switch.

[D-12] The electronic device according to [D-11], in which
the isolation circuit is an inverter circuit or a buffer circuit.

[D-13] The electronic device according to any one of [D-1] to [D-12], in which
the first load transistor is configured as a diode connection.

[D-14] The electronic device according to [D-13], in which
the first load transistor and the second load transistor form a current mirror circuit.

[D-15] The electronic device according to [D-11] or [D-14], in which
a common connection node of the second transistor of the differential pair and the second load transistor is an output node.

[D-16] The electronic device according to any one of [D-1] to [D-15], in which
the comparator is provided in correspondence with a pixel column of the pixel array section, and is used in an analog-to-digital converter that converts the analog pixel signal output from the pixels into a digital signal.

[D-17] The electronic device according to [D-16], in which
the analog-to-digital converter is provided with respect to each pixel column or with respect to a plurality of pixel columns of the pixel array section.

REFERENCE SIGNS LIST

1 CMOS image sensor
2 Unit pixel
11 Pixel array section
12 Row selection unit
13 Constant current source unit
14 Analog-to-digital conversion unit
15 Horizontal transfer scan unit
16 Signal processing unit
17 Timing control unit
18 Horizontal transfer line
19 Reference signal generation unit
21 Photodiode (photoelectric conversion unit)
22 Transfer transistor
23 Reset transistor
24 Amplification transistor
25 Selection transistor
31 ($31_1$ to $31_m$) Pixel drive line
32 ($32_1$ to $32_n$) Vertical signal line
50, 50A to 50H, 141 Comparator
51 Differential amplifier (first amplification unit)
52, 54 Capacitance unit
53 Output amplifier (second amplification unit)
55 Clamp circuit
140 Analog-to-digital converter
521 Variable-capacitance element
522 Capacitance element group
523 Toggle switch group
524 Inverter circuit
$NT_{11}$, $NT_{31}$, $PT_{21}$ First differential transistor
$NT_{12}$, $NT_{32}$, $PT_{22}$ Second differential transistor
$NT_{21}$, $PT_{11}$, $PT_{31}$ First load transistor
$NT_{22}$, $PT_{12}$, $PT_{32}$ Second load transistor

The invention claimed is:

1. An image sensor comprising:
a pixel array section in which a plurality of pixels including photoelectric conversion units is disposed; and a comparator that compares an analog pixel signal output from the pixels to a predetermined reference signal, and outputs a comparison result according to a signal level of the pixel signal, wherein
the comparator includes
differential pair transistors,
a first load transistor connected in series with a first transistor of the differential pair, and
a second load transistor connected in series with a second transistor of the differential pair,
the first transistor of the differential pair accepts a signal obtained by combining the pixel signal and the predetermined reference signal as a gate input,
the second transistor of the differential pair accepts a predetermined voltage as a gate input, and
a capacitance unit is connected between a common connection node of the first transistor of the differential pair and the first load transistor, and a node of the predetermined voltage.

2. The image sensor according to claim 1, wherein
the pixel signal and the predetermined reference signal are accepted as the gate input of the first transistor of the differential pair through respective capacitance elements.

3. The image sensor according to claim 1, wherein
the predetermined voltage is a voltage of any value.

4. The image sensor according to claim 1, wherein
a capacitance value of the capacitance unit is variable.

5. The image sensor according to claim 4, wherein
the capacitance unit contains a variable capacitance element having a variable capacitance value.

6. The image sensor according to claim 4, wherein
the capacitance unit contains a plurality of capacitance elements and a toggle switch that selects at least one of the plurality of capacitance elements on a basis of a control signal.

7. The image sensor according to claim 6, wherein
the plurality of capacitance elements are capacitance elements having the same capacitance values as each other.

8. The image sensor according to claim 6, wherein
the plurality of capacitance elements are capacitance elements having different capacitance values from each other.

9. The image sensor according to claim 6, wherein
the capacitance unit includes an isolation circuit that electrically isolates a control line that supplies the control signal from the toggle switch.

10. The image sensor according to claim 9, wherein
the isolation circuit is an inverter circuit or a buffer circuit.

11. The image sensor according to claim 1, wherein
the first load transistor is configured as a diode connection.

12. The image sensor according to claim 11, wherein
the first load transistor and the second load transistor form a current mirror circuit.

13. The image sensor according to claim 11, wherein
a common connection node of the second transistor of the differential pair and the second load transistor is an output node.

14. The image sensor according to claim 1, wherein
the comparator is provided in correspondence with a pixel column of the pixel array section, and is used in an analog-to-digital converter that converts the analog pixel signal output from the pixels into a digital signal.

15. The image sensor according to claim 14, wherein
the analog-to-digital converter is provided with respect to each pixel column or with respect to a plurality of pixel columns of the pixel array section.

16. An electronic device comprising an image sensor, the image sensor including:
a pixel array section in which a plurality of pixels including photoelectric conversion units is disposed; and a comparator that compares an analog pixel signal output from the pixels to a predetermined reference signal, and outputs a comparison result according to a signal level of the pixel signal, wherein
the comparator includes
differential pair transistors,
a first load transistor connected in series with a first transistor of the differential pair, and
a second load transistor connected in series with a second transistor of the differential pair,
the first transistor of the differential pair accepts a signal obtained by combining the pixel signal and the predetermined reference signal as a gate input,
the second transistor of the differential pair accepts a predetermined voltage as a gate input, and
a capacitance unit is connected between a common connection node of the first transistor of the differential pair and the first load transistor, and a node of the predetermined voltage.

17. An image sensor comprising:
a pixel array section in which a plurality of pixels including photoelectric conversion units is disposed; and a comparator that compares an analog pixel signal output from the pixels to a predetermined reference signal, and outputs a comparison result according to a signal level of the pixel signal, wherein
the comparator includes a first amplification unit and a second amplification unit connected in cascade,
the first amplification unit includes
differential pair transistors,
a first load transistor connected in series with a first transistor of the differential pair, and
a second load transistor connected in series with a second transistor of the differential pair,
the first transistor of the differential pair accepts a signal obtained by combining the pixel signal and the predetermined reference signal as a gate input,
the second transistor of the differential pair accepts a predetermined voltage as a gate input, and
the second amplification unit includes
a first capacitance unit connected between an output node and a node of the predetermined voltage.

18. The image sensor according to claim 17, wherein
the first amplification unit includes a second capacitance unit connected between a common connection node of the first transistor of the differential pair and the first load transistor, and the node of the predetermined voltage.

19. The image sensor according to claim 17, further comprising:
a clamp circuit that clamps a potential of the output node of the first amplification unit to a predetermined potential when an output of the second amplification unit inverts.

20. An electronic device comprising an image sensor, the image sensor including:
a pixel array section in which a plurality of pixels including photoelectric conversion units is disposed; and a comparator that compares an analog pixel signal output from the pixels to a predetermined reference signal, and outputs a comparison result according to a signal level of the pixel signal, wherein
the comparator includes a first amplification unit and a second amplification unit connected in cascade,
the first amplification unit includes
differential pair transistors,
a first load transistor connected in series with a first transistor of the differential pair, and
a second load transistor connected in series with a second transistor of the differential pair,
the first transistor of the differential pair accepts a signal obtained by combining the pixel signal and the predetermined reference signal as a gate input,
the second transistor of the differential pair accepts a predetermined voltage as a gate input, and
the second amplification unit includes
a capacitance unit connected between an output node and a node of the predetermined voltage.

* * * * *